(12) United States Patent
Bowers et al.

(10) Patent No.: US 9,622,392 B1
(45) Date of Patent: Apr. 11, 2017

(54) TECHNIQUES AND APPARATUS FOR CONTROLLING THE TEMPERATURE OF A PERSONAL COMMUNICATION STRUCTURE (PCS)

(71) Applicant: Civiq Smartscapes, LLC, Milford, MA (US)

(72) Inventors: Kyle R. Bowers, Boxborough, MA (US); Benjamin P. Lee, Wayland, MA (US); Parag N. Shah, Carlisle, MA (US); Kenneth J. Gray, Woonsocket, RI (US); Benjamin M. Lawler, Beverly, MA (US)

(73) Assignee: Civiq Smartscapes, LLC, Milford, MA (US)

( * ) Notice: Subject to any disclaimer, the term of this patent is extended or adjusted under 35 U.S.C. 154(b) by 0 days.

(21) Appl. No.: 14/857,462

(22) Filed: Sep. 17, 2015

(51) Int. Cl.
H05K 7/20 (2006.01)
G06F 1/20 (2006.01)

(52) U.S. Cl.
CPC ......... *H05K 7/20972* (2013.01); *G06F 1/206* (2013.01)

(58) Field of Classification Search
CPC .. H05K 7/20972; H05K 7/20954; G06F 1/20; G06F 1/206; G06F 2200/201
USPC .......................... 349/161; 362/373, 218, 294
See application file for complete search history.

(56) References Cited

U.S. PATENT DOCUMENTS

| | | |
|---|---|---|
| 2,029,221 A | 1/1936 | Jackson et al. |
| 4,923,319 A | 5/1990 | Dent |
| 5,061,023 A | 10/1991 | Soubliere et al. |
| 5,415,949 A | 5/1995 | Stone et al. |
| 5,587,740 A | 12/1996 | Brennan |
| 5,860,253 A | 1/1999 | Lapointe |
| 5,991,153 A | 11/1999 | Heady et al. |
| 6,002,240 A | 12/1999 | McMahan et al. |
| 6,010,065 A | 1/2000 | Ramachandran et al. |
| 6,210,066 B1 | 4/2001 | Dent |

(Continued)

FOREIGN PATENT DOCUMENTS

| | | |
|---|---|---|
| CN | 104695733 A | 6/2015 |
| EP | 2328130 A1 | 6/2011 |

(Continued)

OTHER PUBLICATIONS

City Bridge, LLC, "Link NYC Technical Proposal," submitted Jul. 21, 2014 to the City of New York Department of Information, Technology and Telecommunications in response to Request for Proposals for a Franchise to Install, Operate and Maintain Public Communications Structures (248 pages).

(Continued)

*Primary Examiner* — Zachary M Pape
(74) *Attorney, Agent, or Firm* — Goodwin Procter LLP

(57) ABSTRACT

Techniques for operating a personal communication structure (PCS) are described. In particular, a temperature control system for controlling the temperature of a PCS is described. The temperature control system may include a ribbed heat sink and first and second air circulation controllers. The heat sink may be coupled to the PCS's frame, adjacent to the back surface of a housing for a display module. The first air circulation controller may be configured to recirculate air in a cavity within the display module's housing. The second air circulation controller may be configured to move ambient air across the heat sink.

30 Claims, 39 Drawing Sheets

(56) References Cited

U.S. PATENT DOCUMENTS

| | | | |
|---|---|---|---|
| 6,364,761 B1* | 4/2002 | Steinbrecher | H05K 7/2019 361/695 |
| 6,384,811 B1 | 5/2002 | Kung et al. | |
| 6,493,440 B2 | 12/2002 | Gromatzky et al. | |
| 6,512,670 B1 | 1/2003 | Boehme et al. | |
| 6,766,005 B1 | 7/2004 | Grunenwald | |
| 6,788,544 B1 | 9/2004 | Barsun et al. | |
| 7,108,445 B2 | 9/2006 | Henriques | |
| 7,157,838 B2 | 1/2007 | Thielemans et al. | |
| 7,195,222 B2 | 3/2007 | Dent | |
| 7,339,782 B1 | 3/2008 | Landes et al. | |
| 7,374,258 B2 | 5/2008 | Bowron | |
| 7,734,764 B2 | 6/2010 | Weiner et al. | |
| 7,748,681 B2 | 7/2010 | Dent | |
| 7,980,533 B1 | 7/2011 | Anderson et al. | |
| 7,985,139 B2 | 7/2011 | Lind et al. | |
| 8,006,435 B2 | 8/2011 | DeBlonk et al. | |
| 8,006,897 B1 | 8/2011 | Douglass et al. | |
| 8,037,651 B2 | 10/2011 | Dent | |
| 8,108,724 B2 | 1/2012 | Barlow et al. | |
| 8,125,163 B2 | 2/2012 | Dunn et al. | |
| 8,154,768 B2 | 4/2012 | Muraki | |
| 8,189,134 B2 | 5/2012 | LeCave | |
| 8,208,115 B2 | 6/2012 | Dunn | |
| 8,212,959 B2 | 7/2012 | Moscovitch et al. | |
| 8,274,622 B2 | 9/2012 | Dunn | |
| 8,281,531 B2 | 10/2012 | Dent | |
| 8,297,067 B2 | 10/2012 | Keisling et al. | |
| 8,310,824 B2 | 11/2012 | Dunn et al. | |
| 8,321,052 B2 | 11/2012 | Yepez et al. | |
| 8,323,089 B2 | 12/2012 | Nagano | |
| 8,345,845 B2 | 1/2013 | Boyce et al. | |
| 8,350,799 B2 | 1/2013 | Wasinger et al. | |
| 8,351,013 B2 | 1/2013 | Dunn et al. | |
| 8,351,014 B2* | 1/2013 | Dunn | G02F 1/133385 349/161 |
| 8,358,397 B2 | 1/2013 | Dunn | |
| 8,369,083 B2 | 2/2013 | Dunn et al. | |
| 8,373,841 B2 | 2/2013 | Dunn | |
| 8,379,182 B2 | 2/2013 | Dunn | |
| 8,427,007 B2 | 4/2013 | Jansma et al. | |
| 8,439,761 B2 | 5/2013 | O'Keene et al. | |
| 8,472,174 B2 | 6/2013 | Idems et al. | |
| 8,482,695 B2 | 7/2013 | Dunn | |
| 8,497,972 B2 | 7/2013 | Dunn et al. | |
| 8,508,155 B2 | 8/2013 | Schuch | |
| 8,548,422 B2 | 10/2013 | Jenkins | |
| 8,569,910 B2 | 10/2013 | Dunn et al. | |
| 8,606,428 B2* | 12/2013 | Chan | H05K 7/20518 361/679.48 |
| 8,649,170 B2 | 2/2014 | Dunn et al. | |
| 8,654,302 B2 | 2/2014 | Dunn et al. | |
| 8,700,226 B2 | 4/2014 | Schuch et al. | |
| 8,711,321 B2 | 4/2014 | Dunn et al. | |
| 8,713,377 B2 | 4/2014 | Nuthi | |
| 8,749,749 B2 | 6/2014 | Hubbard | |
| 8,755,021 B2 | 6/2014 | Hubbard | |
| 8,767,165 B2 | 7/2014 | Dunn | |
| 8,767,923 B1 | 7/2014 | Edwards | |
| 8,773,633 B2 | 7/2014 | Dunn et al. | |
| 8,804,091 B2 | 8/2014 | Dunn et al. | |
| 8,823,916 B2 | 9/2014 | Hubbard et al. | |
| 8,854,572 B2 | 10/2014 | Dunn | |
| 8,854,595 B2 | 10/2014 | Dunn | |
| 8,927,909 B2 | 1/2015 | Le Neel et al. | |
| 8,988,647 B2 | 3/2015 | Hubbard | |
| 8,994,559 B1 | 3/2015 | LaRocco | |
| 9,030,641 B2 | 5/2015 | Dunn | |
| 9,072,166 B2 | 6/2015 | Dunn et al. | |
| 9,116,263 B2 | 8/2015 | Hayden, Sr. | |
| 2001/0032918 A1 | 10/2001 | Barnes et al. | |
| 2003/0080949 A1 | 5/2003 | Ditzik | |
| 2004/0187505 A1 | 9/2004 | Hoff et al. | |
| 2004/0203570 A1 | 10/2004 | Berger | |
| 2005/0038749 A1* | 2/2005 | Fitch | H04H 60/45 705/51 |
| 2005/0166482 A1 | 8/2005 | Leahy et al. | |
| 2005/0210331 A1* | 9/2005 | Connelly | G06F 11/0709 714/26 |
| 2006/0059790 A1 | 3/2006 | Yeung | |
| 2006/0218828 A1 | 10/2006 | Schrimpf et al. | |
| 2006/0220895 A1 | 10/2006 | Arcaria et al. | |
| 2006/0228165 A1 | 10/2006 | Yonan | |
| 2007/0060097 A1 | 3/2007 | Edge et al. | |
| 2007/0082651 A1 | 4/2007 | Loizeaux | |
| 2007/0103866 A1* | 5/2007 | Park | H05K 7/20972 361/695 |
| 2007/0170237 A1 | 7/2007 | Neff | |
| 2007/0183849 A1 | 8/2007 | Rock | |
| 2007/0263610 A1 | 11/2007 | Mitchell | |
| 2008/0053129 A1* | 3/2008 | Follette | B60H 1/00371 62/244 |
| 2008/0113821 A1 | 5/2008 | Beadell et al. | |
| 2008/0181385 A1 | 7/2008 | Eveland | |
| 2008/0204556 A1 | 8/2008 | de Miranda et al. | |
| 2008/0255901 A1 | 10/2008 | Carroll et al. | |
| 2009/0003312 A1 | 1/2009 | Velazquez et al. | |
| 2009/0149153 A1 | 6/2009 | Lee | |
| 2009/0231807 A1 | 9/2009 | Bouissiere | |
| 2009/0241388 A1 | 10/2009 | Dunn | |
| 2009/0280770 A1 | 11/2009 | Mahendran | |
| 2010/0149736 A1 | 6/2010 | Dittmer et al. | |
| 2010/0222132 A1 | 9/2010 | Sanford et al. | |
| 2011/0226505 A1* | 9/2011 | Mackin | H05K 7/186 174/50.5 |
| 2011/0274093 A1 | 11/2011 | Sing et al. | |
| 2012/0032062 A1 | 2/2012 | Newville | |
| 2012/0262271 A1 | 10/2012 | Torgersrud et al. | |
| 2013/0147626 A1 | 6/2013 | Hammoud | |
| 2013/0237175 A1 | 9/2013 | Piett | |
| 2015/0244297 A1 | 8/2015 | Niemoeller et al. | |

FOREIGN PATENT DOCUMENTS

| | | | |
|---|---|---|---|
| WO | WO-2003/103451 A1 | 12/2003 | |
| WO | WO-2015/123142 A1 | 8/2015 | |

OTHER PUBLICATIONS

CityBridge & LinkNYC Media Data Sheet, available at <http://civiqsmartscapes.com/img/solutions/LinkNYC-Media-Kit.pdf>, published Mar. 2015 (13 pages).

Communication Relating to the Results of the Partial International Search (ISA/206) for International Application No. PCT/US2016/050968 mailed Dec. 12, 2016 (5 Pages).

International Search Report and the Written Opinion of the International Searching Authority for International Application No. PCT/US2016/050965 mailed Dec. 9, 2016 (13 pages).

International Search Report and the Written Opinion of the International Searching Authority for International Application No. PCT/US2016/050972 mailed Dec. 7, 2016 (14 pages).

* cited by examiner

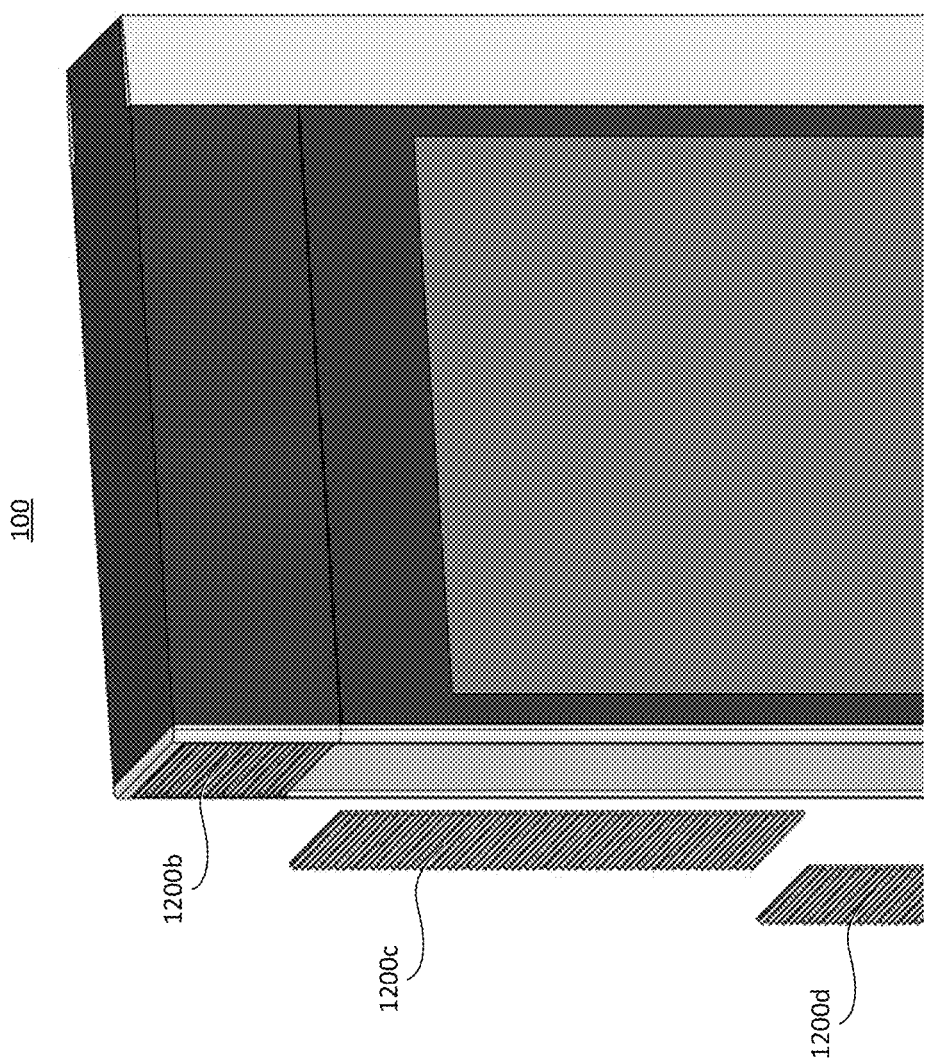

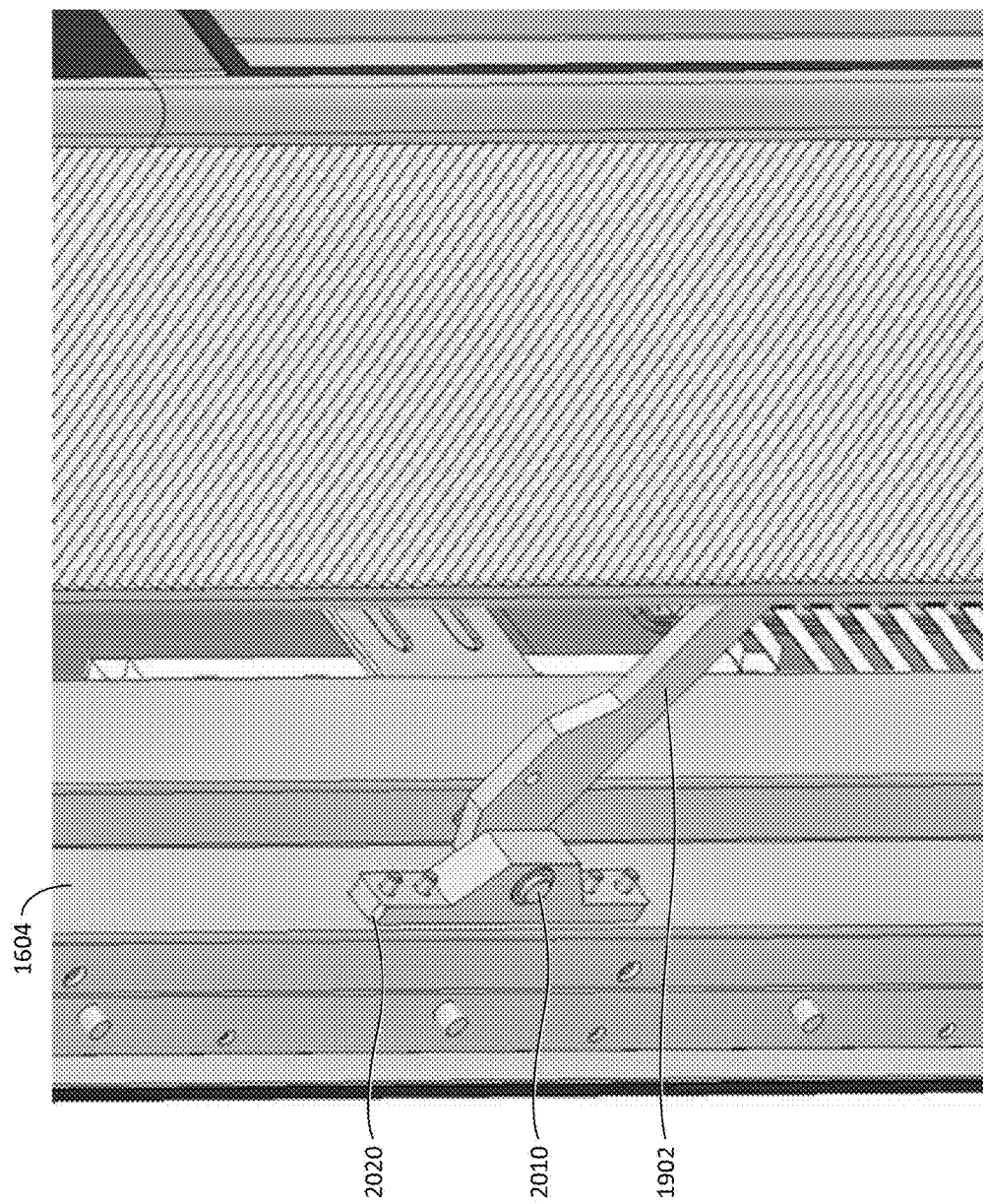

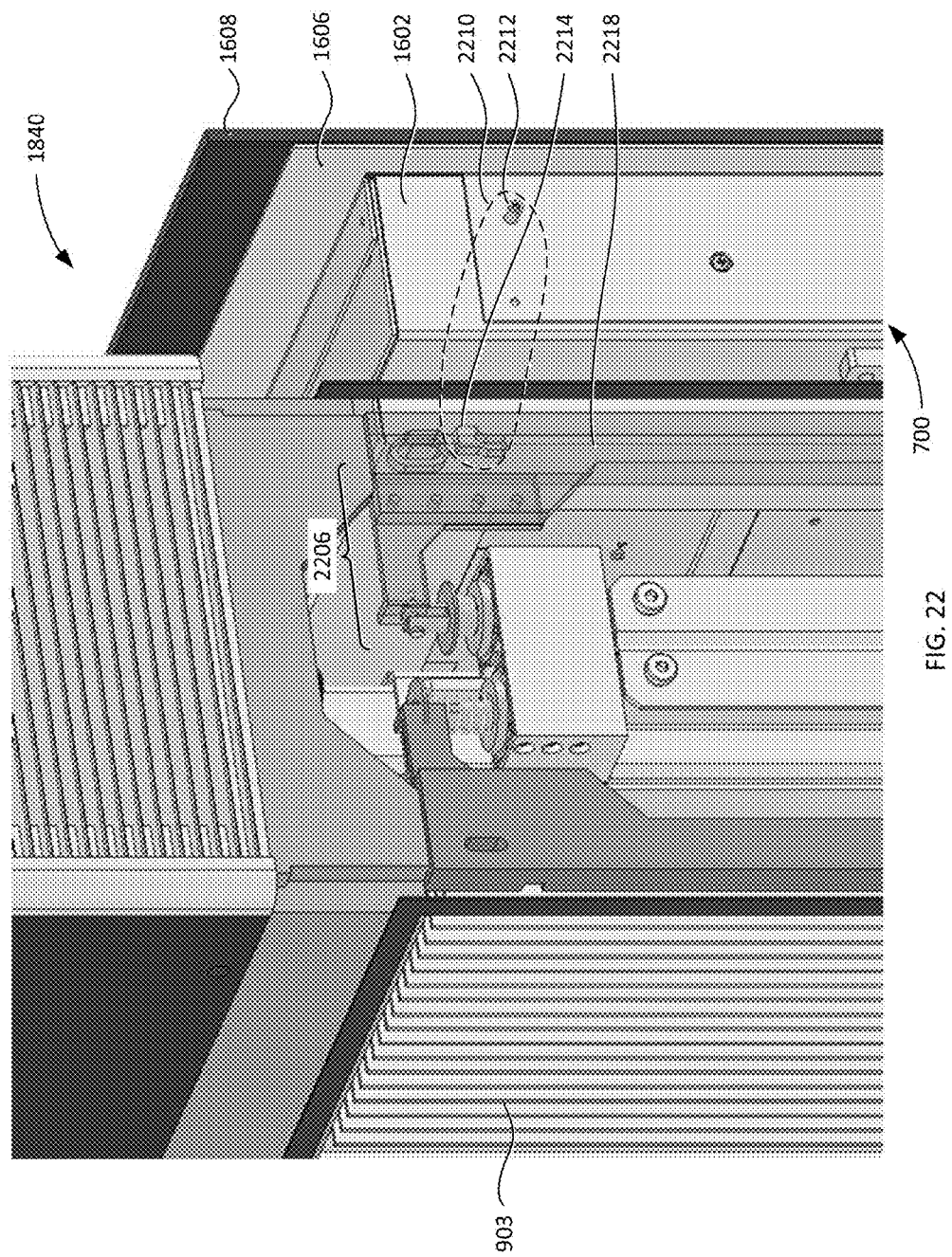

TECHNIQUES AND APPARATUS FOR CONTROLLING THE TEMPERATURE OF A PERSONAL COMMUNICATION STRUCTURE (PCS)

FIELD OF INVENTION

The present disclosure relates generally to techniques and apparatus for operating a personal communication structure (PCS). Some embodiments relate specifically to techniques and apparatus for controlling the temperature of a PCS. Some embodiments relate specifically to techniques and apparatus for removing and/or installing displays modules of a PCS.

BACKGROUND

In some public or semi-public areas, various structures can be used for communication or to obtain access to goods and services. For example, telephone booths can be used to place telephone calls. Interactive kiosks can be used to obtain access to information, products, and/or services. Some interactive kiosks are self-service kiosks, which allow patrons of a business to perform service tasks that were historically performed by business employees. For example, the automated teller machine (ATM) is a self-service kiosk that allows users to deposit funds into a financial account, withdraw funds from an account, check an account balance, etc. —tasks that were historically performed with the assistance of a human bank teller. As another example, some retail stores allow customers to scan and pay for their items at self-service checkout kiosks rather than checkout stations staffed by human cashiers.

An interactive kiosk generally includes a computer terminal, which executes software and/or controls hardware peripherals to perform the kiosk's tasks. Many interactive kiosks are deployed inside buildings that are accessible to the public (e.g., banks, stores), in areas where the building operators can monitor the kiosks and protect them from unauthorized access. In some cases, interactive kiosks are integrated into walls of buildings (e.g., some ATMs are integrated into walls of banks), fastened to walls, or placed against walls, which can protect the kiosks from unauthorized access and reduce the occurrence of potentially dangerous events such as the kiosks tipping or overturning.

SUMMARY OF THE INVENTION

In recent years, public telephone booths have dwindled in number and many of the remaining booths have fallen into relative disuse and disrepair. The demise of the public telephone booth can be traced, in part, to the increasing prevalence of mobile phones and to the widespread use of communication networks for non-telephonic purposes. Many people who wish to participate in telephone conversations in public places prefer the convenience of their own mobile phones to the inconvenience of a stationary phone booth. Furthermore, in contrast to many mobile phones, conventional public telephone booths do not allow users to access Internet-based data and services. Many people who wish to access Internet-based data and services in public places use mobile computing devices (e.g., smartphones or laptop computers) and wireless networks (e.g., mobile broadband networks or Wi-Fi networks) to do so. In short, for many people, the public telephone booth is less convenient and less functional than other readily-available options for connecting to a communication network.

Despite the seeming ubiquity of mobile computing devices, many people are often left with insufficient access to telephonic or Internet-based services. In some areas, wireless network coverage may be poor or nonexistent. In areas where wireless networks are available, the number of network users or the volume of network traffic may exceed the capacity of the network, leaving some users unable to connect to the network, and degrading quality of service for users who are able to connect (e.g., degrading audio quality of phone calls or reducing rates of data communication). Even when wireless networks are available and not congested, some people may not have access to telephonic or Internet-based services because they may not have suitable computing devices or network-access agreements (e.g., a person may not own a computing device, may own a computing device but not have a network-access agreement with an Internet-service provider, may not own a mobile computing device, may have a mobile computing device with an uncharged battery, etc.).

There is a need for personal communication structures (PCSs) that enhance public access to communication networks. Such PCSs may enhance access to communication networks by expanding network coverage (e.g., making communication networks available in areas where they would otherwise be unavailable), expanding network capacity (e.g., increasing the capacity of communication networks in areas where such networks are available), expanding access to end-user computing devices and telephones, and/or expanding access to charging outlets for mobile computing devices. By enhancing access to communication networks, the PCSs may improve the employment prospects, educational opportunities, and/or quality of life for individuals, families, and communities that would otherwise have limited access to communication networks.

Public access to communication networks can be enhanced by placing PCSs in public locations, including sidewalks, parking facilities, mass transit stations, etc. For aesthetic and practical reasons, it is desirable for such PCSs to be reasonably compact. However, operating PCSs in public locations can expose the PCS components to harsh conditions, including harsh environmental conditions (e.g., extreme heat, extreme cold, humidity, unconditioned air, etc.), vandalism (e.g., etching, painting, deliberate acts of destruction, etc.), and collisions with automobiles. Thus, there is a need for compact PCSs that can operate properly under harsh operating conditions, and can be repaired quickly and easily when components fail or suffer damage.

In particular, there is a need for a compact PCS that functions properly even when operated in a harsh environment. Some PCS components can be protected from harsh environmental conditions by sealing these components in substantially airtight compartments. The inventors have recognized and appreciated that the PCS's temperature can be controlled by recirculating air in the substantially airtight compartments, and by circulating ambient air through the PCS and over a heat sink inside the PCS. The PCS's temperature control system may be more compact, less expensive, and/or easier to maintain than temperature control systems that use refrigerants to control air temperature.

There is also a need for a PCS that can be serviced quickly and easily, to address damage to or failure of PCS components. Some PCSs include display systems with relatively large and heavy components (e.g., 55" display panels) mounted high above the base of the PCS. Safely servicing such a display system could involve two or more service workers ascending ladders to remove components of the display system from the PCS. However, such servicing would be time-consuming and expensive. The inventors have recognized and appreciated that the time and cost of servicing a PCS's display system can be greatly reduced by mounting display panels to the PCS in a manner that allows the display panels to be installed in the PCS, accessed, and removed from the PCS, one or two service workers without the aid of a ladder.

According to an aspect of the present disclosure, a personal communication structure (PCS) is provided. The PCS includes a PCS frame, a housing coupled to the PCS frame, and a temperature control system for controlling a temperature within the PCS. The housing encloses a display panel in a cavity. The temperature control system includes a ribbed heat sink coupled to the PCS frame, a first air circulation controller configured to recirculate air in the housing cavity, and a second air circulation controller configured to move ambient air across the heat sink. The heat sink is disposed adjacent to a back surface of the housing.

In some embodiments, the PCS frame includes aluminum. In some embodiments, an average thermal conductivity of the PCS frame is greater than approximately 90 Btu/(hr*° F.*ft). In some embodiments, the heat sink is coupled to opposing sides of the PCS frame to form an I-shaped structure. In some embodiments, the housing includes a housing frame and a transparent covering secured to the housing frame and adjacent to a viewing surface of the display panel. In some embodiments, the housing frame includes aluminum. In some embodiments, an average thermal conductivity of the housing frame is greater than approximately 90 Btu/(hr*° F.*ft). In some embodiments, the housing is substantially airtight.

In some embodiments, at least a portion of the back surface of the housing is in contact with the heat sink. In some embodiments, the ribbed heat sink includes a substantially planar member and a plurality of fins. In some embodiments, at least a subset of the fins extend from the planar member toward the back surface of the housing. In some embodiments, the planar member is disposed between at least a subset of the fins and the back surface of the housing. In some embodiments, the heat sink has a width of approximately 1.5 inches. In some embodiments, the heat sink includes aluminum. In some embodiments, an average thermal conductivity of the heat sink is greater than approximately 90 Btu/(hr*° F.*ft). In some embodiments, the heat sink and the frame include a same material.

In some embodiments, the first air circulation controller includes at least one fan operable to recirculate air in a portion of the housing cavity between the back surface of the housing and a back surface of the display panel. In some embodiments, the second air circulation controller includes at least one fan operable to draw the ambient air into the PCS via at least one intake and discharge the ambient air out of the PCS via at least one exhaust. In some embodiments, the at least one fan is further operable to draw air into a first PCS compartment from a second PCS compartment, wherein the first PCS compartment is defined at least in part by the housing, and wherein the second PCS compartment includes at least one electronic device. In some embodiments, the intake includes a filter and a grill. In some embodiments, the filter and the grill are disposed below the housing. In some embodiments, the exhaust includes a grill. In some embodiments, the grill is disposed above the housing.

In some embodiments, recirculated air transfers heat from the display panel to the housing and the housing transfers heat to the ambient air. In some embodiments, the housing transfers heat to the heat sink, and the heat sink transfers heat to the ambient air.

In some embodiments, the housing includes a first housing, the display panel includes a first display panel, and the PCS further includes a second housing enclosing a second display panel, the heat sink being disposed between the back surface of the first housing and a back surface of the second housing. In some embodiments, the heat sink includes a first heat sink, and the PCS further includes a second heat sink disposed between the back surface of the second housing and the first heat sink. In some embodiments, a minimum distance between the back surfaces of the first and second housings is at least approximately 1.875 inches. In some embodiments, the first and second display panels are arranged in a substantially parallel configuration, wherein viewing surfaces of the first and second display panels face in substantially opposite directions, and wherein a distance between the viewing surfaces of the first and second display panels is less than approximately 11 inches.

In some embodiments, the temperature control system further includes a temperature sensor and a display controller, wherein the display controller is operable to perform at least one operation selected from the group consisting of deactivating the display panel and dimming the display panel based on the temperature sensor sensing a temperature greater than a threshold temperature. In some embodiments, the display controller is operable to continue performing the at least one operation until the sensed temperature is less than another threshold temperature.

In some embodiments, the temperature control system further includes an exhaust vent, and the exhaust vent directs warm air remotely from a base of the structure. In some embodiments, the temperature control system implements a closed loop control system controlling at least one fan. In some embodiments, the temperature control system is operable to detect whether the fan has a fault. In some embodiments, the temperature control system further includes at least one vent, and the temperature control system is operable to detect whether the vent is blocked. In some embodiments, the temperature control system is operable to send a message to a remote service center, the message indicating a temperature of a PCS component or a fault condition of a PCS component. In some embodiments, the temperature control system further includes at least one vent flap and at least one fan operable to recirculate air within the PCS until a temperature of the PCS reaches a temperature threshold. In some embodiments, the temperature control system is operable to determine target operating temperatures for portions of the PCS. In some embodiments, the target temperature Tt determined by the temperature control system is equal to $P(e^{Ta})+10$, where Tt is the target temperature in degrees Celsius, Ta is an ambient temperature outside the PCS in degrees Celsius, and P is a power factor.

Other aspects and advantages of the invention will become apparent from the following drawings, detailed description, and claims, all of which illustrate the principles of the invention, by way of example only.

BRIEF DESCRIPTION OF THE DRAWINGS

Certain advantages of some embodiments may be understood by referring to the following description taken in conjunction with the accompanying drawings. In the drawings, like reference characters generally refer to the same parts throughout the different views. Also, the drawings are not necessarily to scale, emphasis instead generally being placed upon illustrating principles of some embodiments of the invention.

FIGS. 12A and 12B show front perspective views of a PCS with ribbed panels, in accordance with some embodiments;

FIGS. 20A and 20B show perspective views of a linkage of a display mounting system, in accordance with some embodiments;

FIG. 22 shows a perspective cut-away view of a locking mechanism of a display compartment, in accordance with some embodiments;

DETAILED DESCRIPTION

Overview of Personal Communication Structure (PCS)

Figure 1:
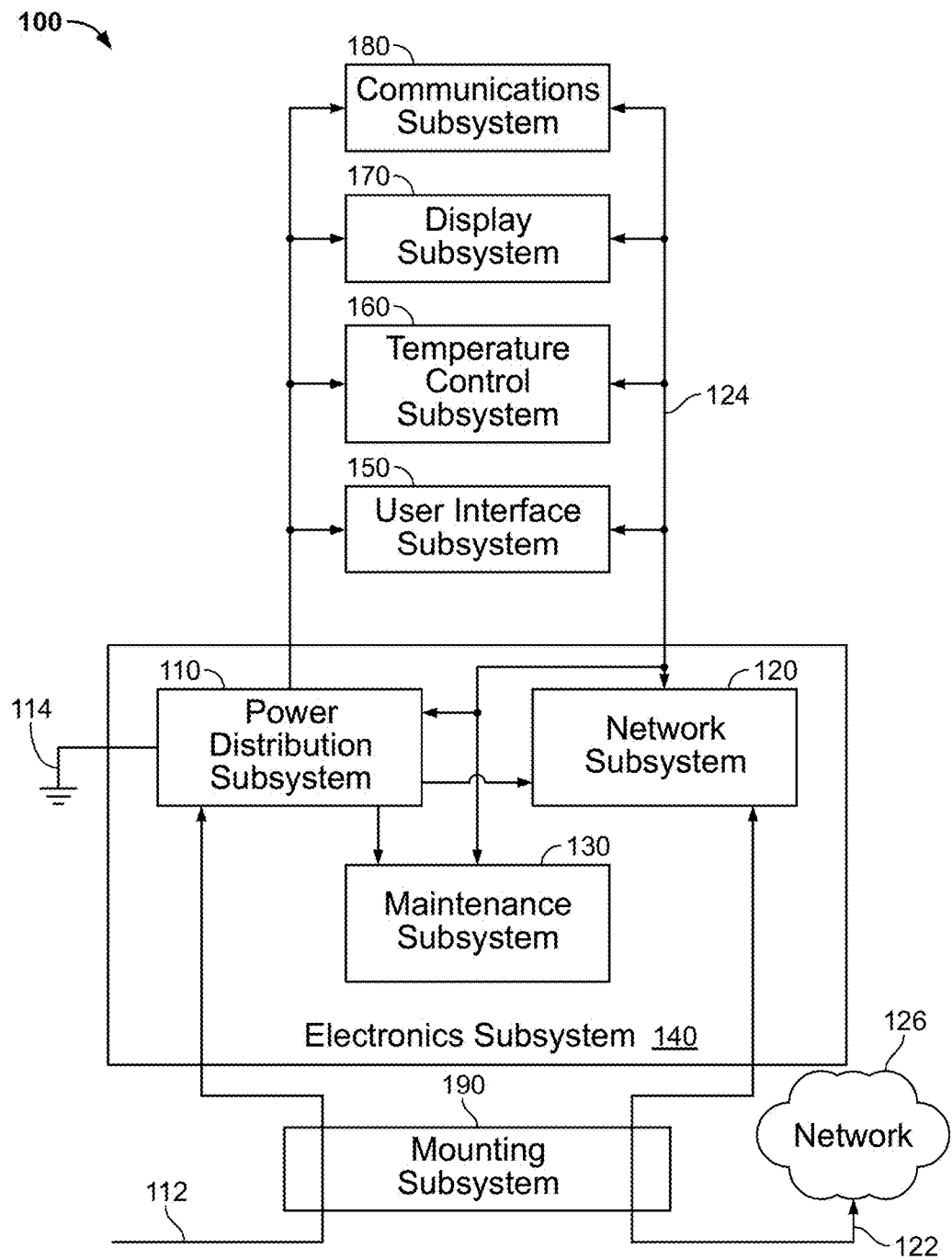
FIG. 1 is a block diagram of a personal communication structure (PCS), in accordance with some embodiments.

FIG. 1 illustrates a personal communication structure (PCS) 100, according to some embodiments. PCS 100 enhances access to communication networks in public or semi-public places. In some embodiments, PCS 100 includes an electronics subsystem 140, a user interface subsystem 150, a temperature control subsystem 160, a display subsystem 170, a communications subsystem 180, and/or a mounting subsystem 190. Electronics subsystem 140 may include a power distribution subsystem 110, a network subsystem 120, and/or a maintenance subsystem 130. These and other components of PCS 100 are described in further detail below.

Power distribution subsystem 110 distributes electrical power to components of PCS 100. Power distribution subsystem 100 may provide power to network subsystem 120, maintenance subsystem 130, other components of electronics subsystem 140, user interface subsystem 150, temperature control subsystem 160, display subsystem 170, and/or communications subsystem 180. Power distribution subsystem 110 may distribute power provided by any suitable power source(s) including, without limitation, batteries, solar panels, a power line 112 coupled to a power grid, etc. In some embodiments, power distribution subsystem 110 includes one or more power converters operable to convert power from one form (e.g., AC power) into another form (e.g., DC power) suitable for the PCS's components. In some embodiments, power distribution subsystem 110 includes one or more voltage level converters operable to change the voltage level of a signal to a level compatible with a component of the PCS. The ground terminal of the power distribution subsystem 110 may be coupled to a reference potential 114 via the chassis of the PCS or via any other suitable path.

Figure 2:
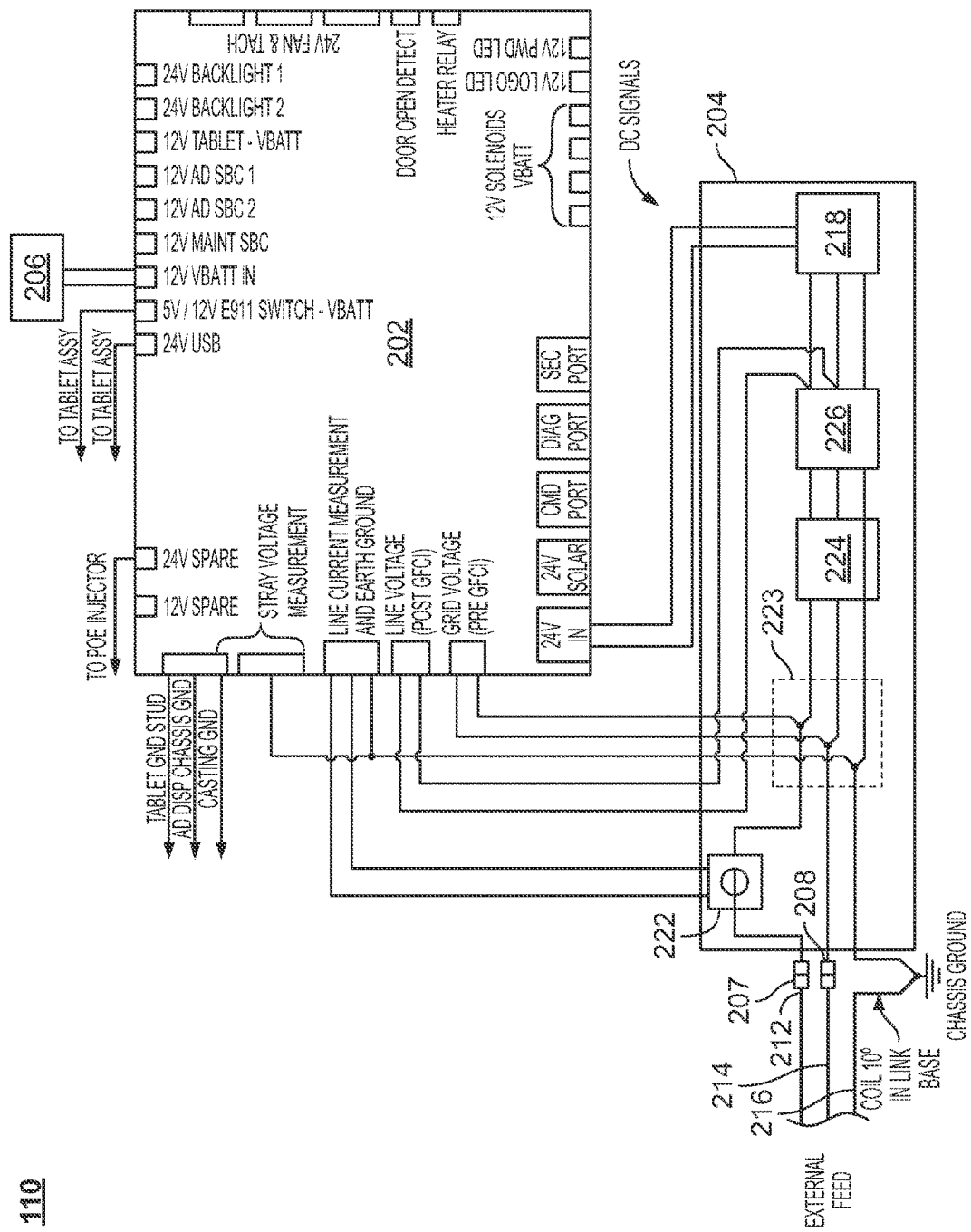
FIG. 2 is a schematic of a power distribution subsystem of a PCS, in accordance with some embodiments.

FIG. 2 shows a schematic of a power distribution subsystem 110, according to some embodiments. In some embodiments, power distribution subsystem (PDS) 110 includes a power conversion system 204, a power distribution board 202, and a battery 206. The inputs to power conversion system 204 include AC power supply signals (e.g., 120 VAC at 60 Hz) carried on a hot line 212, a neutral line 214, and a ground line 216. In some embodiments, the hot line 212 and neutral line 214 may be coupled to power conversion system 204 by quick disconnect devices 207 and 208, respectively, whereby the hot and neutral lines may be safely disconnected from power distribution subsystem 110 if the PCS is separated from its footing. Ground line 216 may be coupled to a ground terminal of the PCS 100. Power conversion system 204 processes the AC power supply signals and converts the processed signals into DC power supply signals. In some embodiments, power conversion system 204 includes a current transformer 222, AC power distribution unit 223, ground-fault circuit interrupter 224 (e.g., circuit breakers), AC line filter 226, and rectifier 218. Rectifier 218 may function as a DC power supply (e.g., a 24 V, 75 A, 2 kW DC power supply). As can be seen in FIG. 2, the outputs of various components of power conversion system 204 may be provided as inputs to power distribution board 202.

Power distribution board 202 may detect power system faults and distribute DC power signals to other components of the PCS. In some embodiments, power distribution board 202 uses the AC signals provided by power conversion system 204 to perform fault detection (e.g., ground fault detection, stray voltage detection, etc.). In some embodiments, power distribution board 202 uses the DC power supply signals provided by power conversion system 204 and/or battery 206 to produce DC power supply signals at various voltage levels (e.g., 5V, 12V, and 24V DC), and distributes those DC power supply signals to suitable components of the PCS 100.

In some embodiments, power distribution system DC power signals can be switched on and off. As those skilled in the art can appreciate, staggered activation of high-power devices (e.g., one or more components of display subsystem 170) reduces in-rush current demand on power supply 218. In some embodiments, the power distribution subsystem 110 is able to measure output current and can shut off power supply signals when the device reaches an over-current threshold. When a device causes over-current and "trips" the output, an error message may be sent to a maintenance center, indicating that the PCS requires servicing.

Battery 206 may provide backup power for components of PCS 100, including but not limited to user interface subsystem 150, which may implement emergency communication (e.g., E911) functionality. In some embodiments, power distribution board 202 may charge battery 206 (e.g., at 24 VDC) when power conversion system 204 is producing DC power and PCS 100 is not using all the available DC power. In some embodiments, a solar charging system may charge battery 206 during power outages or at other times.

In some embodiments, the power distribution subsystem 110 can detect whether the ground-fault circuit interrupter 224 has tripped. The ability to detect activation of the ground-fault circuit interrupter 224 can facilitate maintenance of the PCS. For example, while on back-up battery power, the PDS may determine whether AC power is lost (e.g., by sensing whether AC power supply signals are present) or the ground-fault circuit interrupter 224 has tripped. A suitable message can then be sent to the maintenance center, indicating, for example, whether the PCS requires service.

Returning to FIG. 1, network subsystem 120 controls communication on a network 124 within PCS 100, and communication between internal network 124 and a network 126 external to the PCS. In some embodiments, network subsystem 120 uses network 124 to communicate with power distribution system 110, maintenance subsystem 130, user interface subsystem 150, temperature control subsystem 160, display subsystem 170, and/or communications subsystem 180. The nodes of network 124 may be arranged in one or more suitable network topologies, including, without limitation, a bus (e.g., with network subsystem 120 as the bus controller), star network (e.g., with network subsystem 120 as the central hub), ring network, mesh network, tree network, point-to-point network, etc. Network 124 may be implemented using one or more suitable communication technologies, including, without limitation, Ethernet, DVI (Digital Visual Interface), HDMI (High-Definition Multimedia Interface), USB (Universal Serial Bus), SMB (System Management Bus), I2C (Inter-Integrated Circuit) bus, VGA (Video Graphics Array), SCSI (Small Computer System Interface), SPI (Serial Peripheral Interface) bus, LVDS (low-voltage differential signaling), etc.

Network subsystem 120 may send and receive any suitable data. For example, network subsystem 120 may control the operation of other components of PCS 100 by sending control data to the PCS's subsystems. Network subsystem 120 may forward commands received from a suitable source, including, without limitation, other PCS subsystems and/or network 126. As another example, network subsystem 120 may send operand data to components of PCS 100 for processing by those components (e.g., data to be displayed by display subsystem 170 or user interface subsystem 150, data to be transmitted by communications subsystem 180, etc.).

In some embodiments, network subsystem 120 communicates with network 126 via data link 122. Data link 122 may be implemented using a suitable communications line, including, without limitation, an Ethernet cable, coaxial cable, or optical fiber. In some embodiments, network subsystem 120 may include a signal conversion device adapted to convert the signals received on data link 122 from one form (e.g., optical signals) into another form (e.g., electrical signals).

Figure 3:
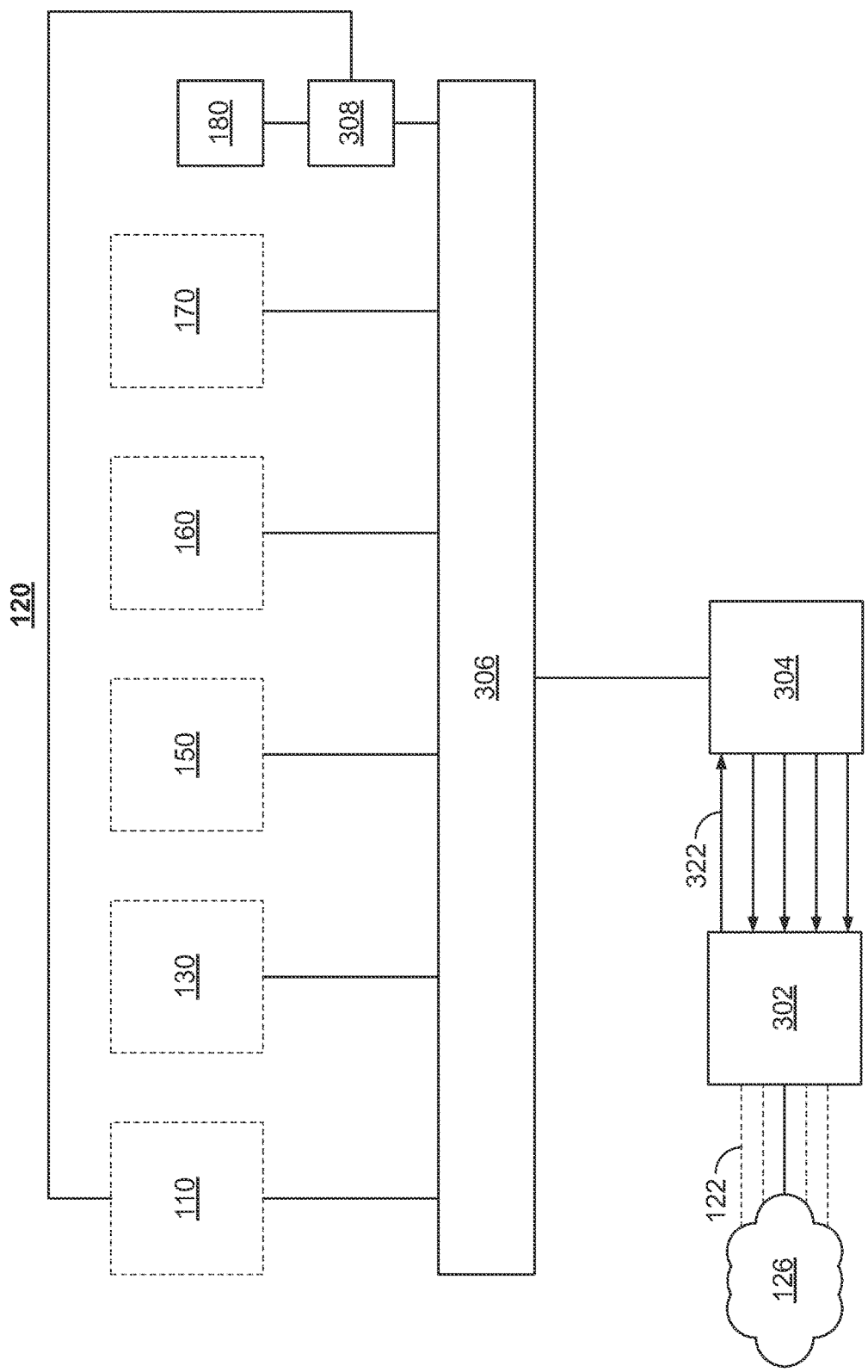
FIG. 3 is a schematic of a network subsystem of a PCS, in accordance with some embodiments.

FIG. 3 shows a schematic of a network subsystem 120, in accordance with some embodiments. In one embodiment, network subsystem 120 includes a fiber junction box 302, a service delivery switch 304, and a network switch 306. In the example of FIG. 3, data link 122 includes one or more optical fibers. Fiber junction box 302 may optically couple the optical fibers of data link 122 to one or more internal optical fibers 322. In some embodiments, fiber junction box 302 includes one or more quick disconnect devices, whereby the optical fibers of data link 122 may be protected from damage if PCS 100 is separated from its footing. Service delivery switch 304 may convert the optical signals received on optical fibers 322 into electrical signals representing network traffic (e.g., Ethernet packets), and provide that network traffic to network switch 306. Likewise, service delivery switch 304 may convert the network traffic (e.g., Ethernet packets) received from network switch 306 into optical signals, and provide those optical signals to fiber junction box 302. Network switch 306 may switch network traffic between PCS subsystems, or between a PCS subsystem and network 126. In some embodiments, network switch 306 is an Ethernet switch. Network switch 306 may be powered by power distribution subsystem 110.

In some embodiments, network subsystem 120 includes a power-over-Ethernet (POE) injector 308. The POE injector 308 may provide power to one or more PCS subsystems, including, without limitation, communications subsystem 180.

Returning to FIG. 1, maintenance subsystem 130 runs maintenance diagnostics on components of PCS 100. In some embodiments, maintenance subsystem 130 performs tests on the PCS's components and/or initiates self-tests of the PCS's components. Such tests may be performed periodically (e.g., daily, weekly, monthly, etc.), intermittently, randomly or at other suitable times. Alternatively or in addition, components of PCS 100 may perform such tests in response to commands received via network subsystem 120

(e.g., commands issued by a PCS operator via network 126 or via communications subsystem 180), or in response to other suitable events.

Based on the results of such tests, maintenance subsystem 130 may determine whether a tested component is operating properly. If a tested component is not operating properly, maintenance subsystem 130 may output data describing the component's malfunction (e.g., transmit an error code to a PCS operator via network 126 or communications subsystem 180, display an error message via display subsystem 170 or user interface subsystem 150, etc.), take action to resolve the malfunction (e.g., reboot the malfunctioning component), turn off power to the faulty component or to the entire PCS (e.g., if the malfunction presents a safety hazard), etc.

In some embodiments, maintenance subsystem 130 may be adapted to control or adjust the operation of power distribution subsystem 110, for safety purposes or other suitable purposes. As described above, if a safety hazard is detected, maintenance subsystem 130 may control power distribution subsystem 110 to deactivate the PCS 100 or the unsafe component(s). Alternatively, maintenance subsystem 130 may control power distribution subsystem 110 to "power cycle" or "reboot" a malfunctioning component.

Figure 4:
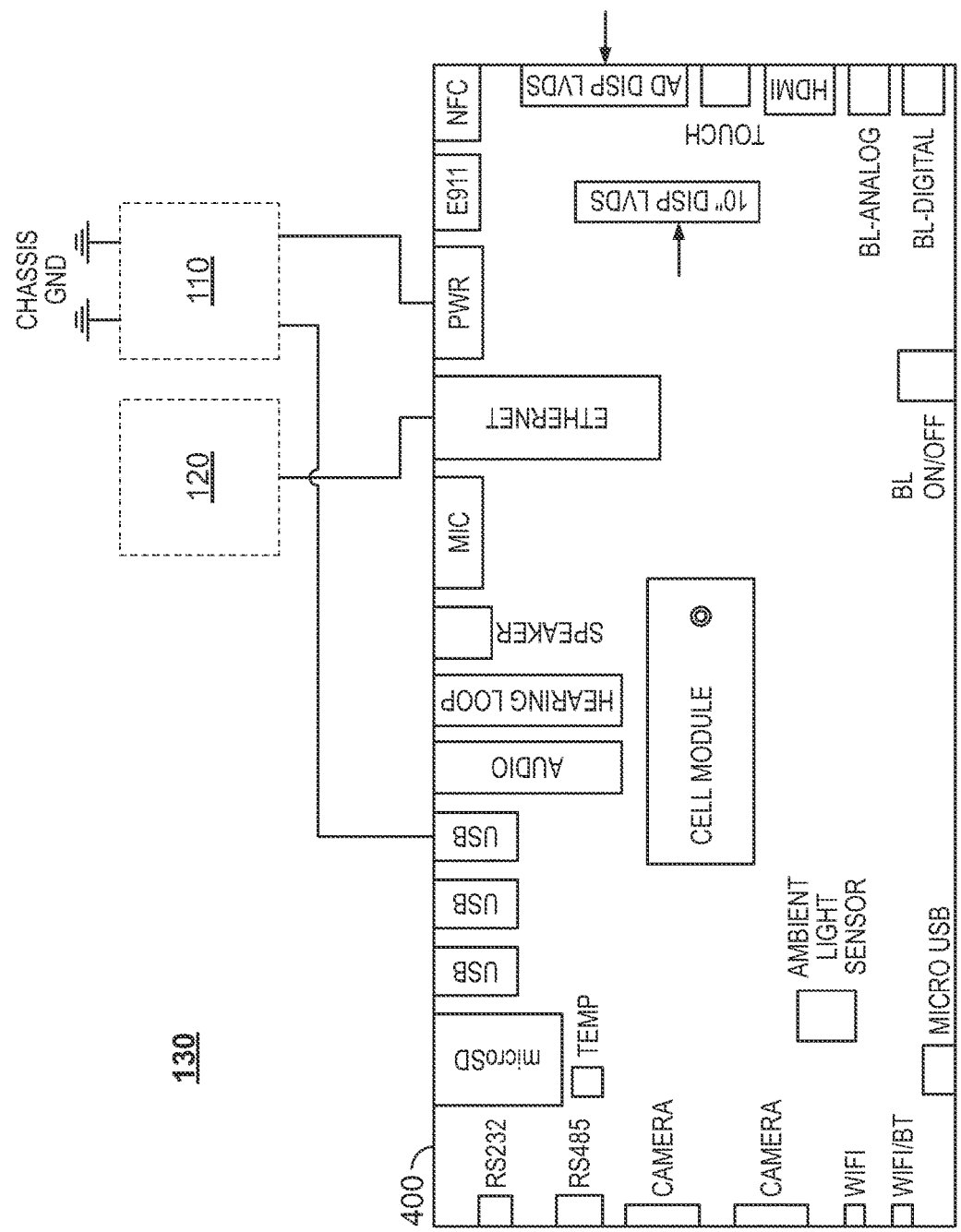
FIG. 4 is a schematic of a maintenance subsystem of a PCS, in accordance with some embodiments.

FIG. 4 shows a schematic of a maintenance subsystem 130, in accordance with some embodiments. In various embodiments, maintenance subsystem 130 includes one or more processing devices 400. The processing device(s) may include, without limitation, a microprocessor, microcontroller, small-board computer, system on a chip (SoC) (e.g., Qualcomm Snapdragon, Nvidia Tegra, Intel Atom, Samsung Exynos, Apple A7, Motorola X8, etc.), or other suitable processing device. The processing device(s) 400 may communicate with other components of PCS 100 via network subsystem 120 to perform maintenance tasks, or for other suitable purposes. In some embodiments, processing device(s) 400 are powered by power distribution subsystem 110.

Returning to FIG. 1, in addition to power distribution subsystem 110, network subsystem 120, and/or maintenance subsystem 130, electronics subsystem 140 may include other components. In some embodiments, electronics subsystem 140 includes one or more illumination controllers, which control illumination of one or more lights coupled to or proximate to the PCS. When lit, the lights controlled by the illumination controller may illuminate user interface subsystem 150 or other portions of PCS 100. In some embodiments, electronics subsystem 140 includes one or more sensor controllers, which control one or more sensor devices (e.g., microphones, cameras, ambient light sensors, pressure sensors, voltage sensors, environmental sensors, accelerometers, etc.). Such sensors may be used for any suitable purpose, including, without limitation, adjusting the brightness of displays and/or lights based on ambient lighting, surveilling the region proximate to the PCS (e.g., when an attempt to gain unauthorized access to the PCS is detected), etc.

Figure 5:
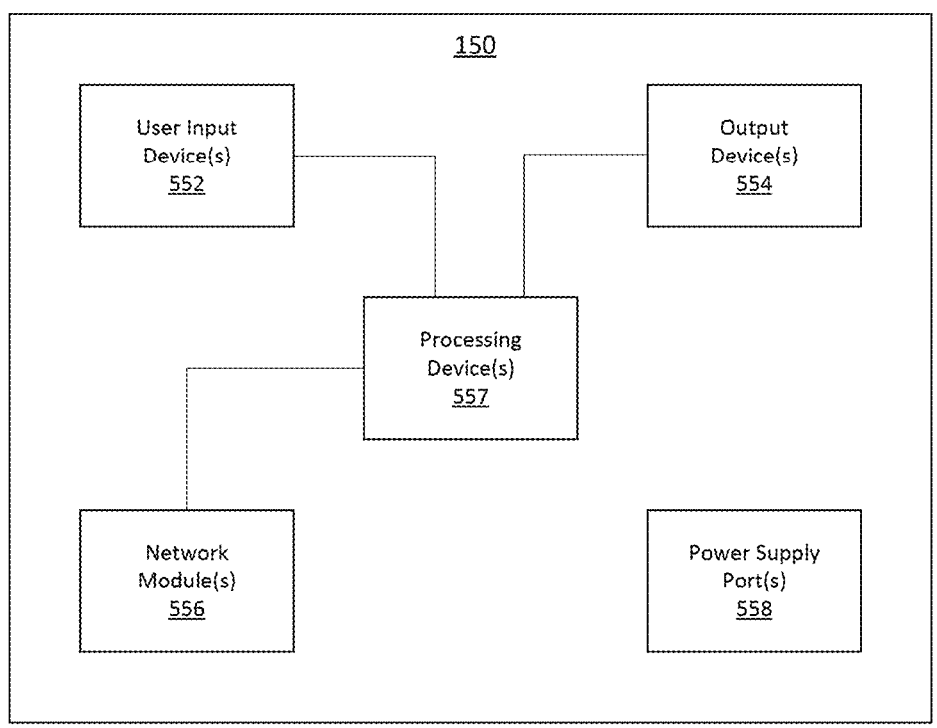
FIG. 5 is a block diagram of a user interface subsystem of a PCS, in accordance with some embodiments.

User interface subsystem 150 provides an interactive user interface, which may be used to access a communication network. Referring to FIG. 5, user interface subsystem 150 may include one or more user input devices 552, output devices 554, network modules 556 (e.g., network interface controllers, wireless transceivers, etc.), processing devices 557, and/or power supply ports 558. The user input device(s) 552 may include, without limitation, a touchscreen, touchpad, keyboard, keypad, trackball, one or more microphones, camera, buttons, switches, etc. The output device(s) 554 may include, without limitation, a display unit (e.g., touchscreen, LCD display, etc.), light(s), speaker(s), audio jack(s) (e.g., headset jacks, including microphone), etc. The one or more network modules 556 may include, without limitation, a 3G mobile network transceiver, 4G mobile network transceiver, LTE mobile network transceiver, Wi-Fi transceiver, RFID reader, Bluetooth transceiver, Near Field Communication (NFC) transceiver, Ethernet adapter, etc. In some embodiments, at least one of the network modules 556 may be configured to access network 126 via network subsystem 120 or to access a communication network via communications subsystem 180. The one or more processing devices may include, without limitation, a microprocessor, microcontroller, small board computer, or system on a chip (SoC) (e.g., Qualcomm Snapdragon, Nvidia Tegra, Intel Atom, Samsung Exynos, Apple A7, Motorola X8, etc.). The one or more power supply ports 558 may include, without limitation, one or more USB charging ports, a two-prong or three-prong AC power outlet (e.g., providing current limited AC power at 120 V, 60 Hz), etc.

User interface subsystem 150 may enhance users' access to communication networks in several ways. In some embodiments, user interface subsystem 150 may provide users access to communication networks (e.g., the Internet) via network module(s) 556. For example, a user may provide inputs via user input device(s) 552 to control a web browser or other network-based application executing on processing device(s) 557, which may access a communication network via network module(s) 556. The data obtained from the communication network may be processed by processing device(s) 557 and provided to the user via output device(s) 554. As another example, a user may connect a computing device (e.g., a mobile computing device) to user interface subsystem 150 via a network module 556 (e.g., a Wi-Fi access point), and access a communication network via another network module 556 (e.g., a mobile network transceiver), via communications subsystem 180, or via network 126. As yet another example, users may charge mobile computing devices via power supply port(s) 558, and access communication networks through the charged devices.

In some embodiments, PCS 100 includes an assisted listening unit that transmits the PCS's audio outputs to hearing assistance devices (e.g., hearing aids, Cochlear implants, etc.) within the assisted listening unit's range via a "hearing loop" (e.g., an "audio induction loop" or "audio-frequency induction loop"). The assisted listening unit may include a loop coil and a loop amplifier adapted to drive amplified signals into the loop coil, thereby creating a magnetic field that delivers the amplified signals to hearing assistance devices within the unit's range. The loop coil may be included in or located proximate to user interface subsystem 150, or disposed at another suitable location in, on, or near PCS 100.

In some embodiments, user interface subsystem 150 includes an interface for adjusting the assisted listening unit (e.g., for increasing or decreasing the signal strength or range of the assisted listening unit). The assisted listening unit's interface may include, without limitation, one or more buttons, dials, switches, and/or software-based interfaces. By adjusting the assisted listening unit, a user may control the range of the assisted listening unit and/or the volume of the audio output provided by the assisted listening unit.

In some embodiments, user interface subsystem 150 includes interface components for placing a phone call. User interface subsystem may implement the phone calls using voice-over-IP (VOIP) technology. The user's speech may be captured via the user interface subsystem's microphone, and the speech of other parties to the phone call may be provided via the user interface subsystem's speaker(s). In some embodiments, the user interface subsystem 150 permits users to place phone calls to emergency responders (e.g., E911 calls). The E911 calls may be placed using VOIP technology (e.g., via a network module 556 of user interface 150, via communications subsystem 180, or via network 126) or another suitable technology.

In some embodiments, the user input devices 552 include a microphone system, and the processing device 557 is able to perform noise cancellation on the microphone system. It can be appreciated that the PCS may be located in an environment with high levels of ambient street noise. The processing device 557 may perform a noise cancelling process that distinguishes the user's speech from the background noise and removes at least some of the background noise from the audio stream. When a user plugs in a headset that contains a microphone, the noise cancellation technique may also detect and remove background noise picked up by the headset's microphone.

Figure 6:
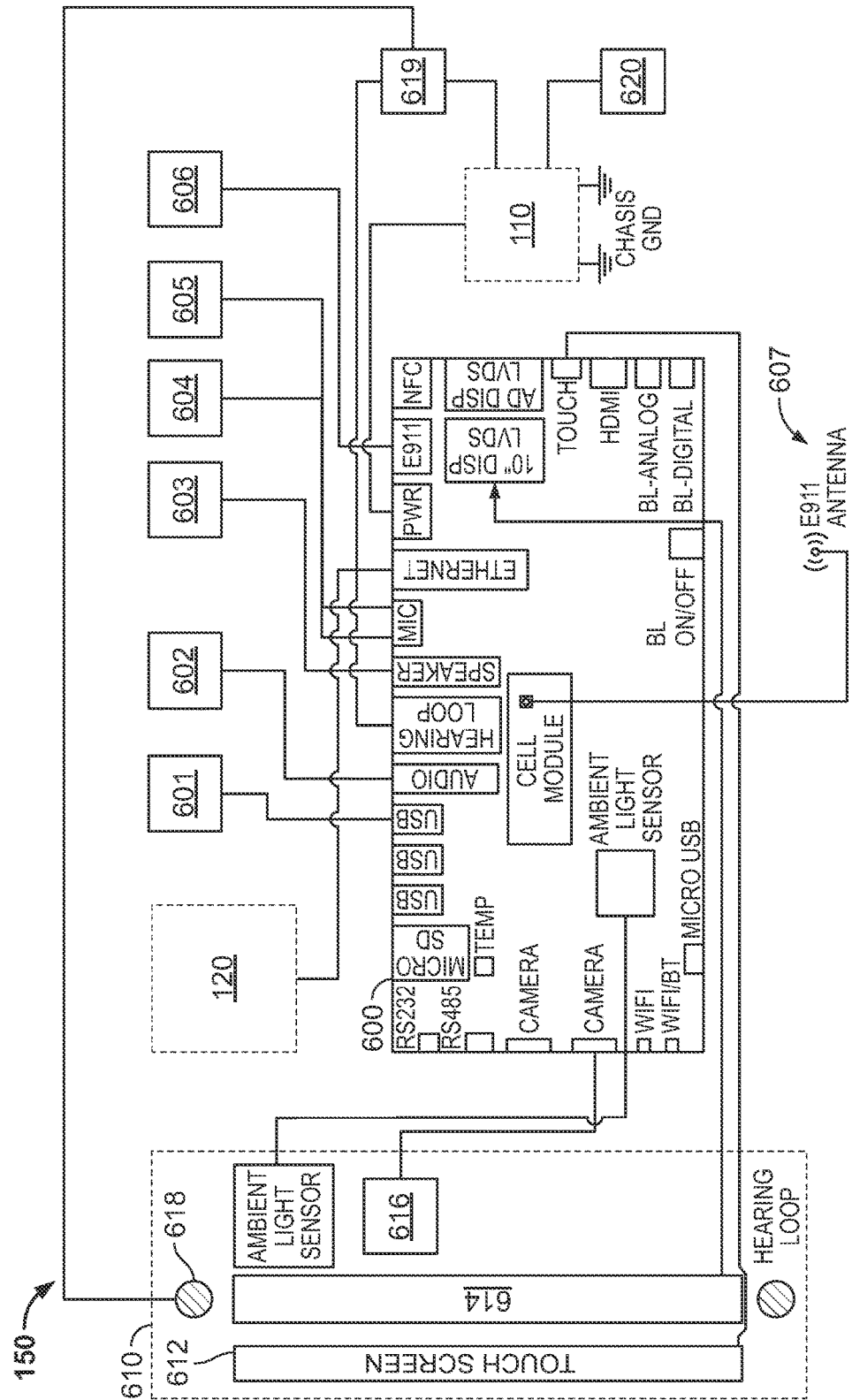
FIG. 6 is a schematic of a user interface subsystem of a PCS, in accordance with some embodiments.

FIG. 6 shows an exemplary schematic of the user interface subsystem 150, in accordance with some embodiments. In some embodiments, user interface subsystem 150 includes one or more processing devices 600. The processing device(s) 600 may include, without limitation, a microprocessor, microcontroller, small-board computer, system on a chip (SoC) (e.g., Qualcomm Snapdragon, Nvidia Tegra, Intel Atom, Samsung Exynos, Apple A7, Motorola X8, etc.), or other suitable processing device. The processing device(s) 600 may communicate with other components of PCS 100 via network subsystem 120. In some embodiments, processing device(s) 600 are powered by power distribution subsystem 110.

In the example of FIG. 6, user interface subsystem 150 includes a keypad 601, headset jack 602, speaker 603, two microphones (604, 605), and an E911 button 606, all of which are coupled to the processing device(s) 600. Processing device(s) 600 may be adapted to initiate an E911 communication when E911 button 606 is pressed, and to send and receive E911 messages via a wireless communication module 607 (e.g., a 3G, 4G, or LTE mobile network transceiver, including a suitable antenna, which may be located proximate to the top of the PCS).

In some embodiments, the E911 button contains an indicator. One example of the indicator is an illumination ring. The illumination ring may help a user to locate the button at night, and/or may flash when a user presses the button to indicate a E911 call is in progress.

In the example of FIG. 6, user interface subsystem 150 includes a touchscreen 612, display 614, camera 616, hearing loop coil 618, hearing loop amplifier 619, and USB charging port(s) 620. In some embodiments, the touchscreen 612, display 614, camera 616, and hearing loop coil 618 may be packaged together in a tablet computing device 610. The USB charging port(s) 620 and hearing loop amplifier 619 may be powered by power distribution subsystem 110.

Returning to FIG. 1, temperature control subsystem 160 controls the temperature within PCS 100. For example, temperature control subsystem 160 may cool the components of PCS 100. Some of the PCS's components generate heat and the PCS 100 may absorb heat from its environment (e.g., via radiation or convection), particularly when the ambient temperature is high or the PCS is exposed to direct sunlight. Extreme heat can interfere with the operation of the PCS or even permanently damage some of the PCS's components.

Alternatively or in addition, temperature control system 160 may, under appropriate conditions, heat the components of PCS 100. Some PCSs may be located in cold environments (e.g., outdoors in regions with cold ambient temperatures). Like extreme heat, extreme cold can interfere with the PCS's operation or damage its components.

Temperature control subsystem 160 may include one or more components suitable for heating and/or cooling the PCS. In some embodiments, temperature control subsystem 160 includes one or more fans operable to circulate ambient air through the PCS, which can cool the PCS. In some embodiments, the PCS 100 includes one or more heat sinks, and the ambient air circulated by temperature control subsystem 160 passes proximate to the heat sink(s). In some embodiments, temperature control subsystem 160 includes one or more fans operable to recirculate air in portions (e.g., airtight compartments) of PCS 100, which can facilitate the transfer of heat from those portions of the PCS to other regions of the PCS and/or to the ambient environment. The fans may be single-speed fans or variable-speed fans. In some embodiments, temperature control subsystem 160 includes one or more heaters, which can heat the PCS. In some embodiments, one or more fans and/or heaters are located apart from temperature control subsystem 160, but controlled by the temperature control subsystem.

Temperature control subsystem 160 may control the PCS's temperature by controlling the operation of the fan(s) and/or heater(s). In some embodiments, temperature control subsystem 160 controls the PCS's temperature based, at least in part, on the temperature inside or in an area proximate to the PCS. Temperature control subsystem 160 may obtain temperature information regarding the temperature in or near PCS 100 from one or more temperature sensors. The temperature sensors may be located inside the PCS, on an outer surface of the PCS, proximate to the PCS, and/or in any other suitable location. Temperature control subsystem 160 may include one or more sensor drivers that can activate the sensor(s) and obtain temperature measurements from the sensor(s). Alternatively or in addition, temperature control subsystem may obtain temperature information regarding the temperature in the vicinity of the PCS from a suitable source (e.g., a website) via a communication network (e.g., network 126).

In some embodiments, the temperature control system 160 adds or removes active fans (e.g. switches fans on or off) in specific areas of the PCS based on the temperature sensor information. For example, active fans may be added when the ambient temperature is high (e.g., above a threshold). Conversely, active fans may be removed when the ambient temperature is low (e.g., below a threshold) to reduce power usage. The fans may be organized in addressable groups to facilitate addition and removal of active fans.

In some embodiments, the temperature control subsystem 160 uses a feedback-based control system (e.g., a feedback loop) to control the speeds of the fans. The fans may include tachometers, and the tachometer outputs may be fed back to the temperature control subsystem, which may use the tachometer outputs to determine the speeds of the fans. In addition to adding and removing active fans, the temperature control subsystem 160 may increase the speeds of the fans as the internal temperature increases or decrease the speeds of the fans as the temperature decreases.

In some embodiments, the temperature control subsystem 160 uses the fan tachometer output to determine whether a fan fault has occurred. For example, the temperature control subsystem 160 may detect a fan fault when the tachometer output indicates that there is little or no fan rotation (e.g., the rate of fan rotation is below a threshold). When a fan fault is detected, the PCS may notify the maintenance center of the fault, so the PCS can be serviced to replace or repair the faulty fan.

In some embodiments, temperature control subsystem 160 controls the PCS's temperature based on environmental information, which may include temperature information and/or other information associated with the PCS's environment. For example, environmental information may include sunlight information indicating whether the PCS is exposed to direct sunlight. Sunlight information may be obtained from a camera or other suitable optical sensor. Alternatively or in addition, environmental information may include humidity information indicating the humidity levels in the PCS's environment, time-of-day information indicating the current time at the PCS's location, weather information indicating the weather in the PCS's environment, etc.

Based on the environmental information, temperature control subsystem 160 may control the fan(s) and/or heater(s) to adjust the PCS's temperature. In some embodiments, temperature control subsystem 160 may activate one or more heaters when the PCS's temperature is below a lower threshold temperature, and/or activate one or more fans when the PCS's temperature is above an upper threshold temperature. In some embodiments, the number of heater units and/or fans activated by temperature control subsystem 160 is determined based on the environmental information. In some embodiments, the settings of the activated heaters and/or fans (e.g., the fan speeds, the heater temperatures, etc.) may be determined based on the environmental information. In some embodiments, if the temperature in the PCS is determined to be outside a safe operating range, temperature control subsystem may instruct power distribution subsystem 110 to deactivate the PCS or at least one component thereof.

Display subsystem 170 includes one or more display modules, each of which includes at least one display device. The display device may include, without limitation, a liquid crystal display (LCD), light-emitting diode (LED) display, organic light-emitting diode (OLED) display, cathode ray tube (CRT), electroluminescent display (ELD), electronic paper/electronic ink display (e.g., a bi-stable or multi-stable electrophoretic or electro-wetting display), plasma display, thin-film transistor (TFT) display, 3D display (e.g., volumetric display, holographic display, integral imaging display, compressive light field display, etc.), stereoscopic display, etc. In some embodiments, display subsystem 170 includes two display modules disposed on opposite sides of the PCS, such that the modules' display devices face in opposite directions.

A display device may display suitable information, including, without limitation, news information, weather information, emergency information (e.g., instructions for dealing with an emergency, evacuation routes, etc.), travel information (e.g., traffic conditions, road conditions, speed limits, alternative route information, public transit schedules, locations of and/or directions to public transportation facilities, etc.), tourism information (e.g., locations of and/or directions to popular tourist attractions), advertisements, etc. The displayed information may be displayed in one or more suitable formats, including, without limitation, text, still images, and/or video. Display subsystem 170 may include one or more processing devices adapted to control the display of information by the display device(s). For example, each display module may include a processing device adapted to control the display module's display device.

In some embodiments, display subsystem 170 includes one or more cameras. For example, each display module may include one or more cameras. Display subsystem 170 may use the cameras to determine the ambient light levels, and may adjust the brightness of the display device(s) accordingly. For example, if the ambient light level at the PCS is high (e.g., because the sun is shining on the PCS), display subsystem 170 may increase the brightness of the display(s) (e.g., by increasing the brightness of the display backlight(s)), so that the displayed information is readily viewable by onlookers or passers-by. On the other hand, if the ambient light level at the PCS is low, display subsystem 170 may decrease the brightness of the display(s), to reduce the display subsystem's power usage and/or heat generation. In some embodiments, the brightness levels of the PCS's displays may be controlled independently.

Alternatively or in addition, display subsystem 170 may use the cameras to obtain information about "potential viewers" (e.g., people viewing the PCS, viewing a display device of the PCS, using the PCS, and/or in the vicinity of the PCS). In some embodiments, display subsystem 170 may determine, based on images of the area proximate to the PCS (e.g., images acquired by the PCS's camera(s)), a potential viewer's apparent demographic information, including, without limitation, age, sex, race/ethnicity, etc. In some embodiments, display subsystem 170 may use facial-recognition techniques to determine a potential viewer's identity.

Display subsystem 170 may use information about the PCS's potential viewers to select the information to be displayed by the display device(s) (e.g., to select advertisements for display based on the identities or demographics of the potential viewers). Alternatively or in addition, display subsystem 170 may track the identities and/or demographics of the potential viewers who have been in the vicinity of the PCS when particular advertisements have been displayed. Tracking information about potential viewers of advertisements and/or controlling the display of advertisements based on information about the potential viewers may increase the value of the PCS's advertising impressions to potential advertisers.

Display subsystem 170 may obtain information about a potential viewer from the potential viewer, from analysis of images of the potential viewer, and/or from the potential viewer's computing device (e.g., smartphone). For example, a potential viewer who connects to a communication network through a PCS 100 (e.g., via user interface subsystem 150 or via the user's computing device) may provide authentication data (e.g., a username, password, and/or other credentials), and the PCS may use that authentication data to access the potential viewer's account information, which may identify the potential viewer and/or provide information about the potential viewer (e.g., the potential viewer's attributes and/or interests). The potential viewer may have provided such information when registering for access to the PCS (or set of PCSs), or the PCS may have inferred such information based on the potential viewer's activities on the communication network.

Even if potential viewers do not register for PCS access, information about a potential viewer's attributes and/or interests can still be inferred based on the potential viewer's activities, and this information can be tracked in connection with information identifying the potential viewer's computing device (e.g., a mobile device's phone number, mobile equipment identifier (MEID), or unique device identifier (UDID); a computing device's media access control (MAC) address; etc.). In some embodiments, a PCS 100 may identify a potential viewer or attributes thereof based on identifying information transmitted by the potential viewer's computing device when the computing device is within range of the PCS, even if the computing device is not connected to a network via the PCS 100.

Figure 7:
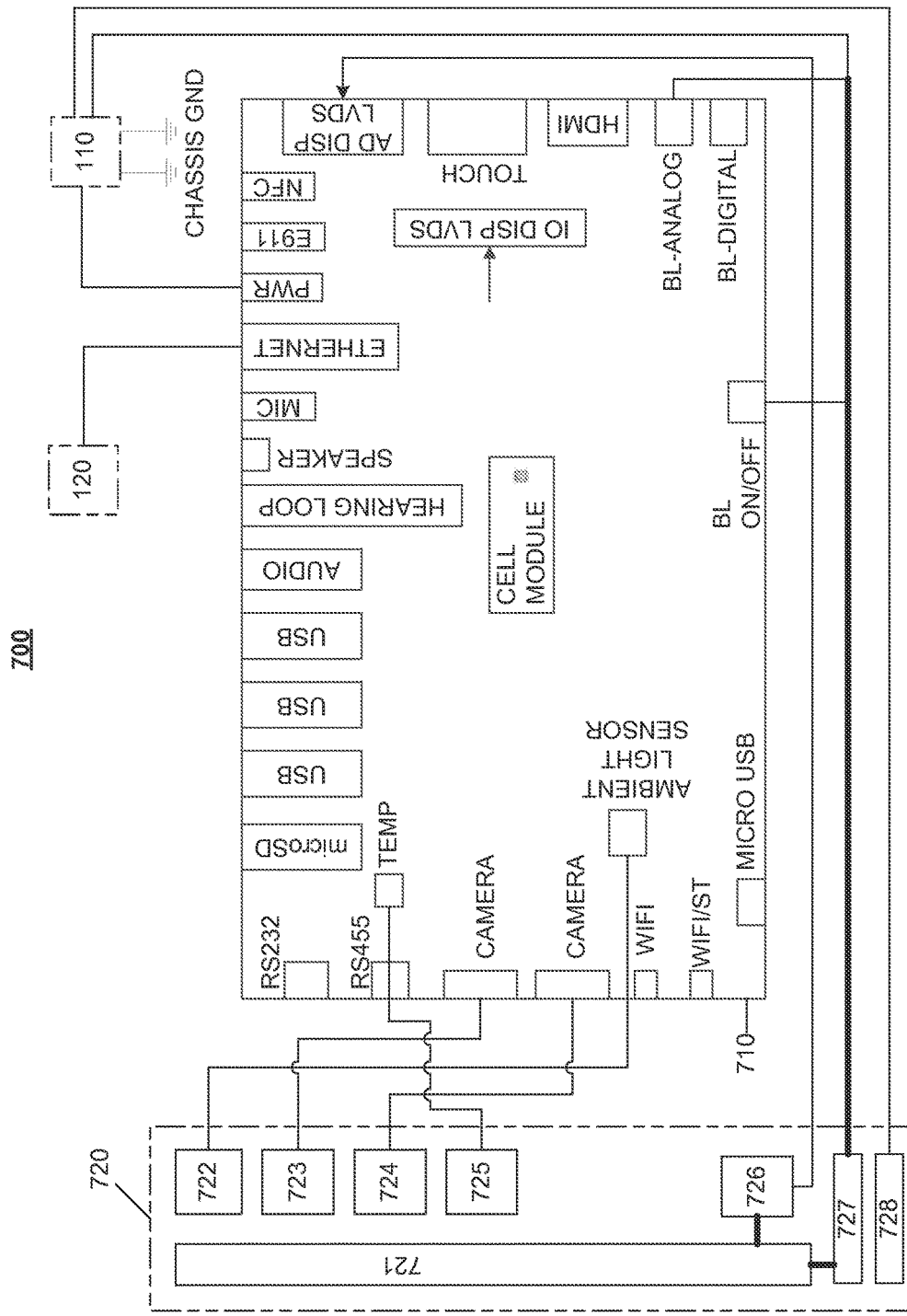
FIG. 7 is a schematic of a display module of a PCS, in accordance with some embodiments.

FIG. 7 is a schematic of a display module 700, in accordance with some embodiments. In some embodiments, a PCS 100 includes two display modules 700. In some embodiments, a display module 700 includes one or more processing device(s) 710. Each processing device 710 may include, without limitation, a microprocessor, microcontroller, small-board computer, system on a chip (SoC) (e.g., Qualcomm Snapdragon, Nvidia Tegra, Intel Atom, Samsung Exynos, Apple A7, Motorola X8, etc.), or other suitable processing device. The processing device(s) 710 may communicate with other components of PCS 100 via network subsystem 120. In some embodiments, each processing device 710 is powered by power distribution subsystem 110. In the example of FIG. 7, display module 700 also includes a display device 720. Display device 720 may include a display panel 721, ambient light sensor 722, two cameras (723, 724), temperature sensor 725, frame rate controller 726, power/backlight controller 727, and one or more fans 728.

In some embodiments, the processing device 710 is able to read the ambient light sensor 722 and send a control signal to the power/backlight controller 727. One example of the control signal is a pulse width modulated (PWM) output. In response to the ambient light sensor 722 detecting the presence of high ambient light, the duty cycle of the PWM signal may be increased, thereby causing the power/backlight controller to increase the backlight brightness, so that the display image is viewable in bright sunlight. Those skilled in the art can appreciate that the PWM control signal may be digital or converted to an analog output via a digital to analog converter.

Returning to FIG. 1, communications subsystem 180 includes one or more communication modules. In some embodiments, the communication module(s) include one or more radio access nodes. The radio access node(s) may include small cells (e.g., low-power radio access nodes with ranges between roughly 10 m and 1-2 km, including, but not limited to, femtocells, picocells, and microcells), macrocells (e.g., radio access nodes with ranges of up to a few tens of kilometers), etc. The radio access node(s) may reduce congestion in mobile data networks (e.g., 3G, 4G, or LTE networks) by expanding network capacity and offloading traffic from more congested portions of the network to the portions of the network associated with the radio access node(s). In areas where mobile data networks are highly congested (e.g., portions of New York City, and particularly portions of Manhattan), deploying PCSs with radio access node(s) in an area where mobile data networks are congested may, in some embodiments, greatly reduce network congestion and improve quality of service for many network users.

In some embodiments, communications subsystem 180 includes at least one wireless access point. Computing devices may connect to the wireless access point using a suitable wireless adapter, including, without limitation, a Wi-Fi or WiMAX adapter. Through the wireless access point, communications subsystem 180 may provide access to a local area network (LAN) or wide area network (WAN) (e.g., network 126, or a 3G, 4G, or LTE network accessed via the communications subsystem's radio access node(s)). PCS operators may use the wireless access points to provide wireless broadband network access to individuals, subscribers, communities, etc. Use of the wireless access points may further improve the quality of service on mobile data networks by offloading some users from the mobile data networks to the wireless access point.

Returning to FIG. 1, mounting subsystem 190 includes a mounting device that releasably secures the PCS to a support (e.g., a footing). The mounting device may be adapted to break when a shear force above a predetermined value is applied to the mounting device, thereby allowing the PCS to move. Such releasable mounting can reduce the damage caused to people and property when an automobile collides with the PCS.

Figure 8:
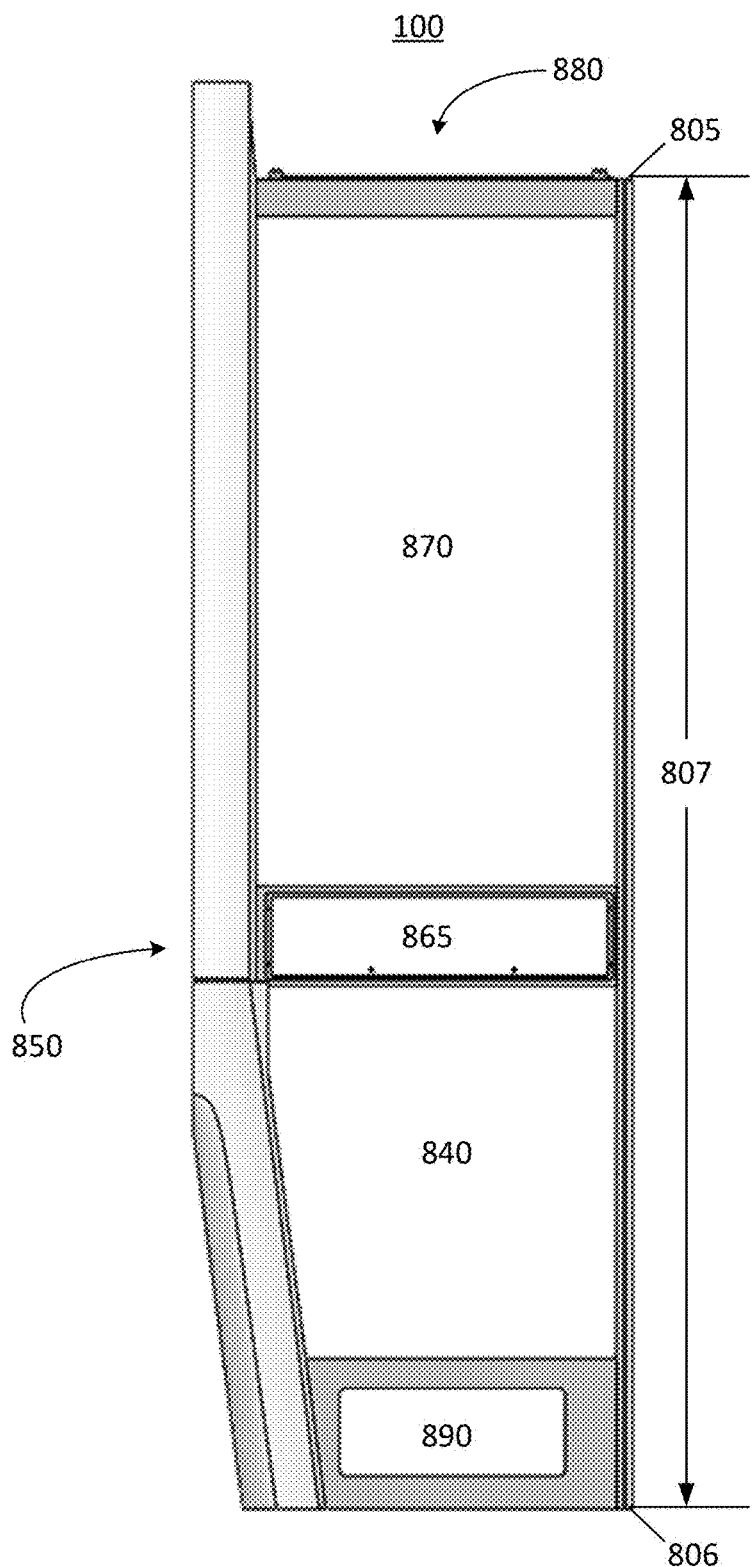
FIG. 8 illustrates an arrangement of compartments of a PCS, in accordance with some embodiments.

PCS 100 may include compartments and components of PCS 100 may be disposed in the compartments. FIG. 8 illustrates an arrangement of compartments of a PCS 100, according to some embodiments. For convenience, the PCS's top portion 805 and base portion 806 are identified in FIG. 8, as is the PCS's height 807.

In the example of FIG. 8, PCS 100 includes mounting compartment 890, electronics compartment 840, user interface compartment 850, air intake compartment 865, display compartment 870, and communications compartment 880. Electronics compartment 840 may enclose electronics subsystem 140. User interface compartment 850, display compartment 870, and communications compartment 880 may enclose user interface subsystem 150, display subsystem 170, and communications subsystem 180, respectively. In some embodiments, display compartment 870 may enclose, in addition to display subsystem 870, one or more heat sinks. Mounting compartment 890 may enclose at least a portion of a mounting subsystem 190.

Air intake compartment 865 may enclose at least portions of temperature control subsystem 160. In some embodiments, air intake compartment 865 may enclose one or more fans, which may draw ambient air into the air intake area. In some embodiments, the one or more fans may also draw air into the air intake area from electronics compartment 840. The fans may move the air through display compartment 870 (e.g., across one or more heat sinks), and the air may be discharged through an exhaust in communications compartment 880. In some embodiments, air intake compartment 865 may enclose one or more heaters.

In the example of FIG. 8, communications compartment 880 is located proximate to the top 805 of the PCS, display compartment 870 is disposed along an upper portion of the PCS and below communications compartment 880, and an air intake compartment 865 is located proximate to a middle portion of the PCS (in the direction of the PCS's height) and below display compartment 870. Mounting compartment 890 is located proximate a base 806 of the PCS, electronics compartment 840 is disposed along a lower portion of the PCS between mounting compartment 890 and air intake compartment 865, and user interface compartment 850 is disposed along a lower portion of the PCS adjacent to air intake compartment 865 and electronics compartment 840.

Embodiments of a PCS are not limited by the compartmentalization scheme illustrated in FIG. 8. A PCS may include none of the compartments illustrated in FIG. 8, any combination of the compartments illustrated in FIG. 8, and/or other compartments not illustrated in FIG. 8. In cases where a PCS includes a compartment illustrated in FIG. 8 (e.g., mounting compartment 890, electronics compartment 840, user interface compartment 850, air intake compartment 865, display compartment 870, or communications compartment 880), the location and/or shape of that compartment may differ from the location and/or shape of the corresponding compartment in FIG. 8. In some embodiments, a PCS may include a compartment that encloses two or more PCS subsystems that are enclosed by different compartments in the example of FIG. 8. In some embodiments, a PCS may include separate compartments enclosing respective portions of a PCS subsystem that is enclosed by a single compartment in the example of FIG. 8. In some embodiments, a PCS may include a compartment that encloses other compartments.

Figure 9A:
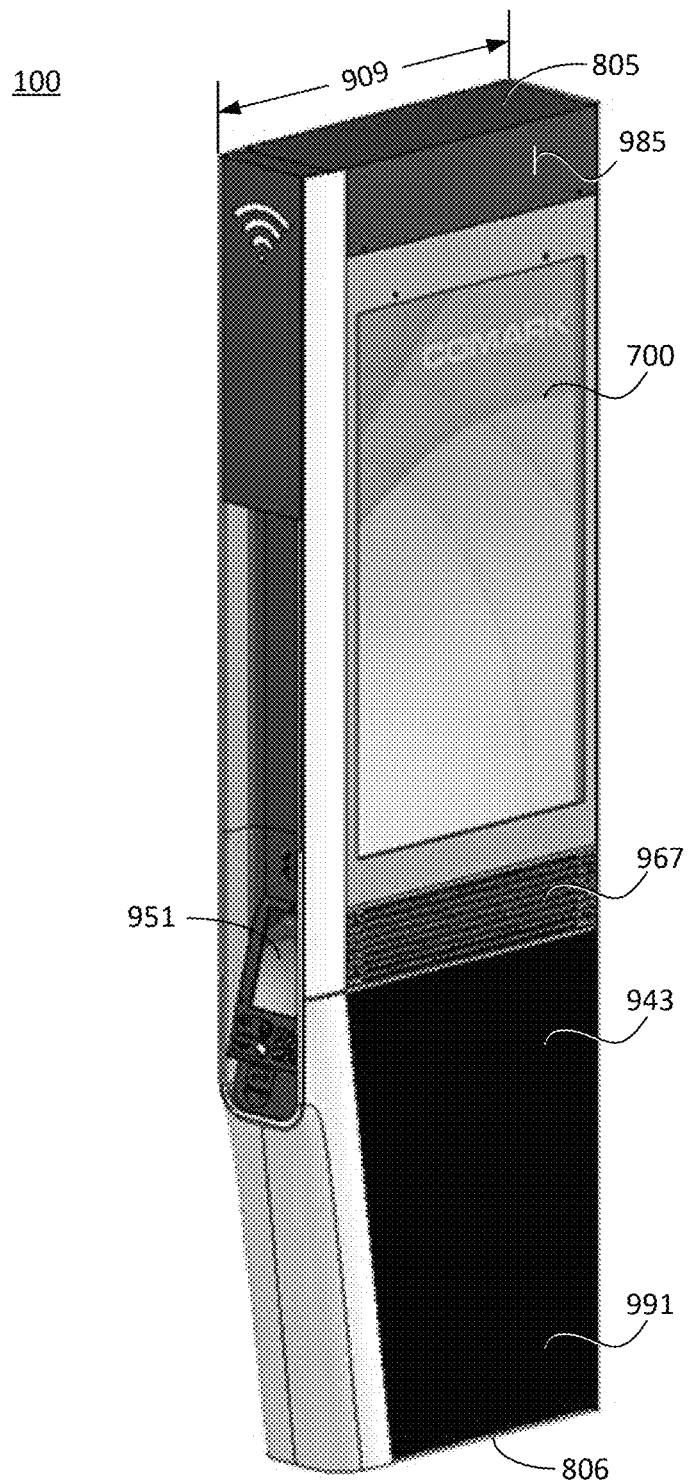
FIGS. 9A, 9B, and 9C show respective front perspective, side, and exploded front perspective views of a PCS, in accordance with some embodiments.
Figure 9B:
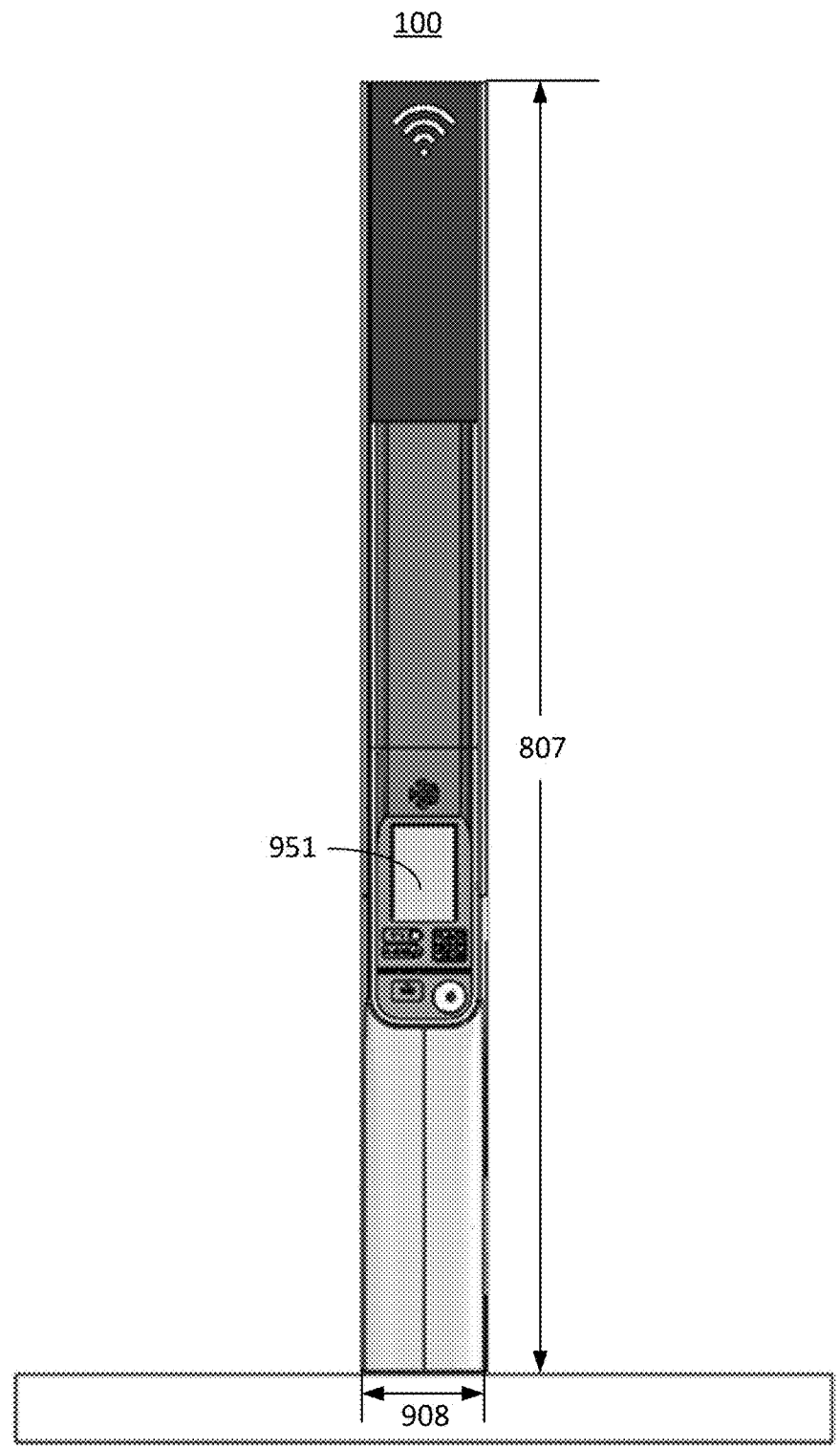
Figure 9C:
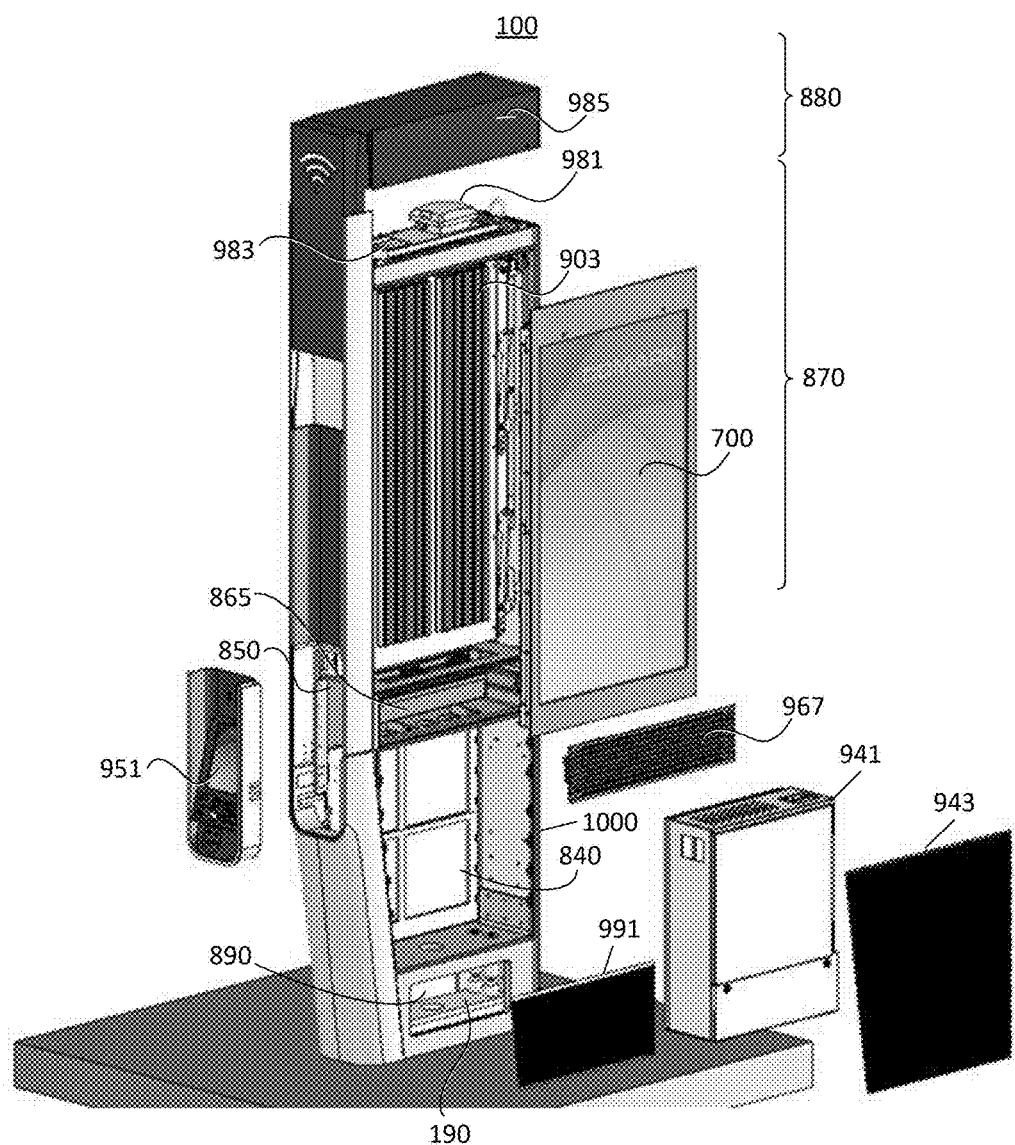

FIGS. 9A, 9B, and 9C show respective front perspective, side, and exploded front perspective views of a PCS 100, in accordance with some embodiments. For convenience, the PCS's top portion 805 and base portion 806 are identified in FIGS. 9A-9B, as are the PCS's height 807, width 908, and length 909.

As can be seen in FIG. 9C, PCS 100 may include a frame 1000. The frame 1000 is (or is part of) a structural system that supports the components of PCS 100. In some embodiments, the frame 1000 forms portions of the PCS's compartments (e.g., communications compartment 880, display compartment 870, air intake compartment 865, user interface compartment 850, electronics compartment 840, and mounting compartment 890).

As can further be seen in FIG. 9C, communications compartment 880 may include a radio access node 981 and a wireless access point 983. The bottom of communications compartment 880 may be formed by a portion of frame 1000, and the top and sides of communications compartment 880 may be formed by a removable cap 985.

Display compartment 870 may include a heat sink 903 and a display module 700. In some embodiments, display compartment 870 includes a second display module (and, optionally, a second heat sink) arranged back-to-back (e.g., in parallel) with display module 700 and heat sink 903, such that display module 700 and the second display module face in opposite directions.

Air intake compartment 865 may include an air intake assembly 967. The air intake assembly 967 may include a grill, a filter, and a fan assembly. User interface compartment 850 may include a user interface device 951. The user interface device 951 may include a table computer, keypad, an emergency call button, microphone(s), speakers, and a mobile device charging port. Electronics compartment 840 may include an electronics cabinet 941, and may be formed by portions of frame 1000 and a cover panel 943. Mounting compartment 890 may at least partially enclose mounting subsystem 190, and may be formed by portions of frame 1000 and a cover panel 991.

Figure 10A:
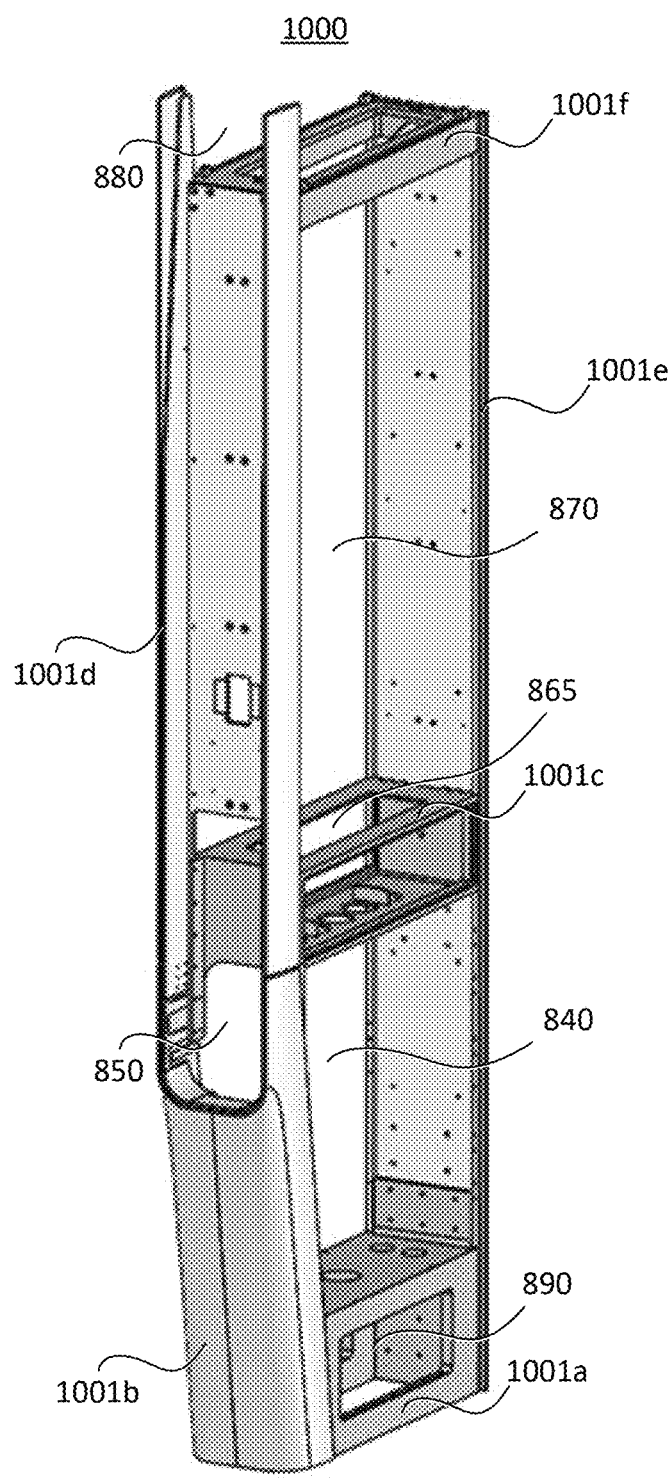
FIGS. 10A, 10B, and 10C show respective side perspective, front perspective, and exploded front perspective views of a frame of a PCS, in accordance with some embodiments.
Figure 10B:
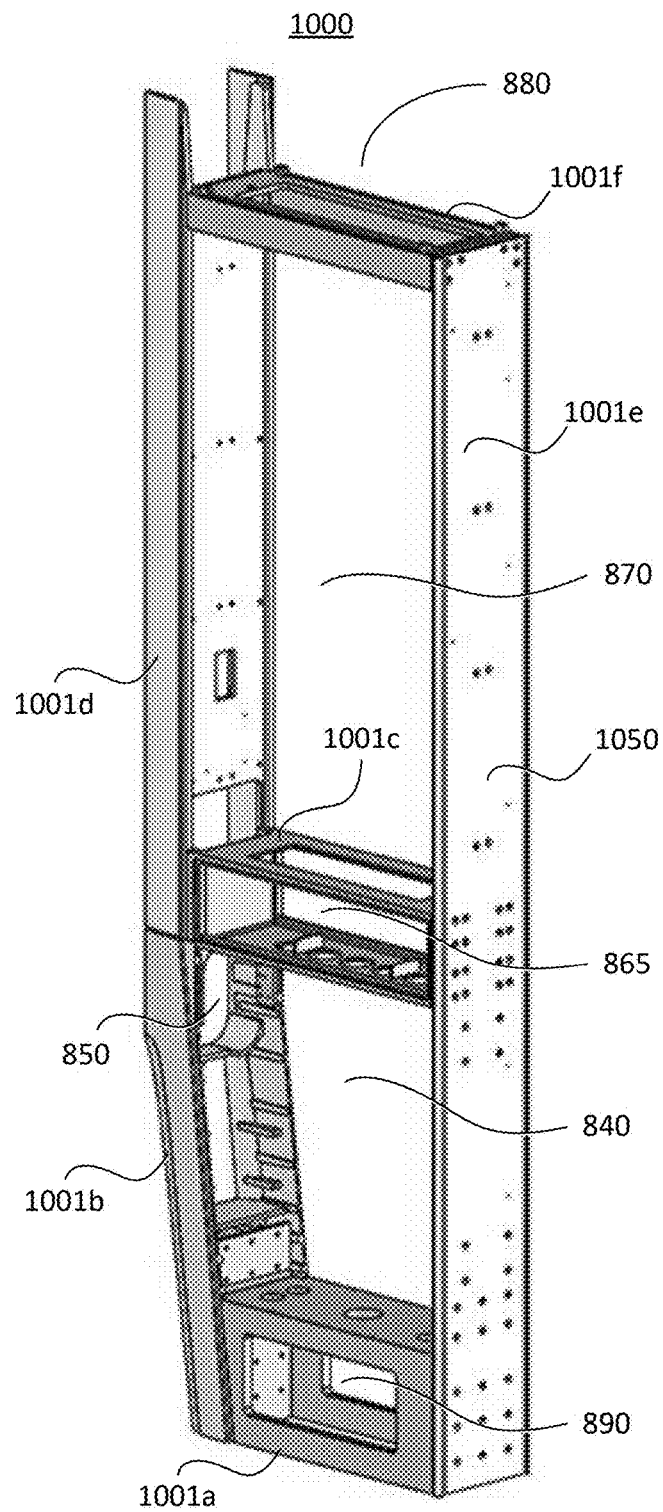
Figure 10C:
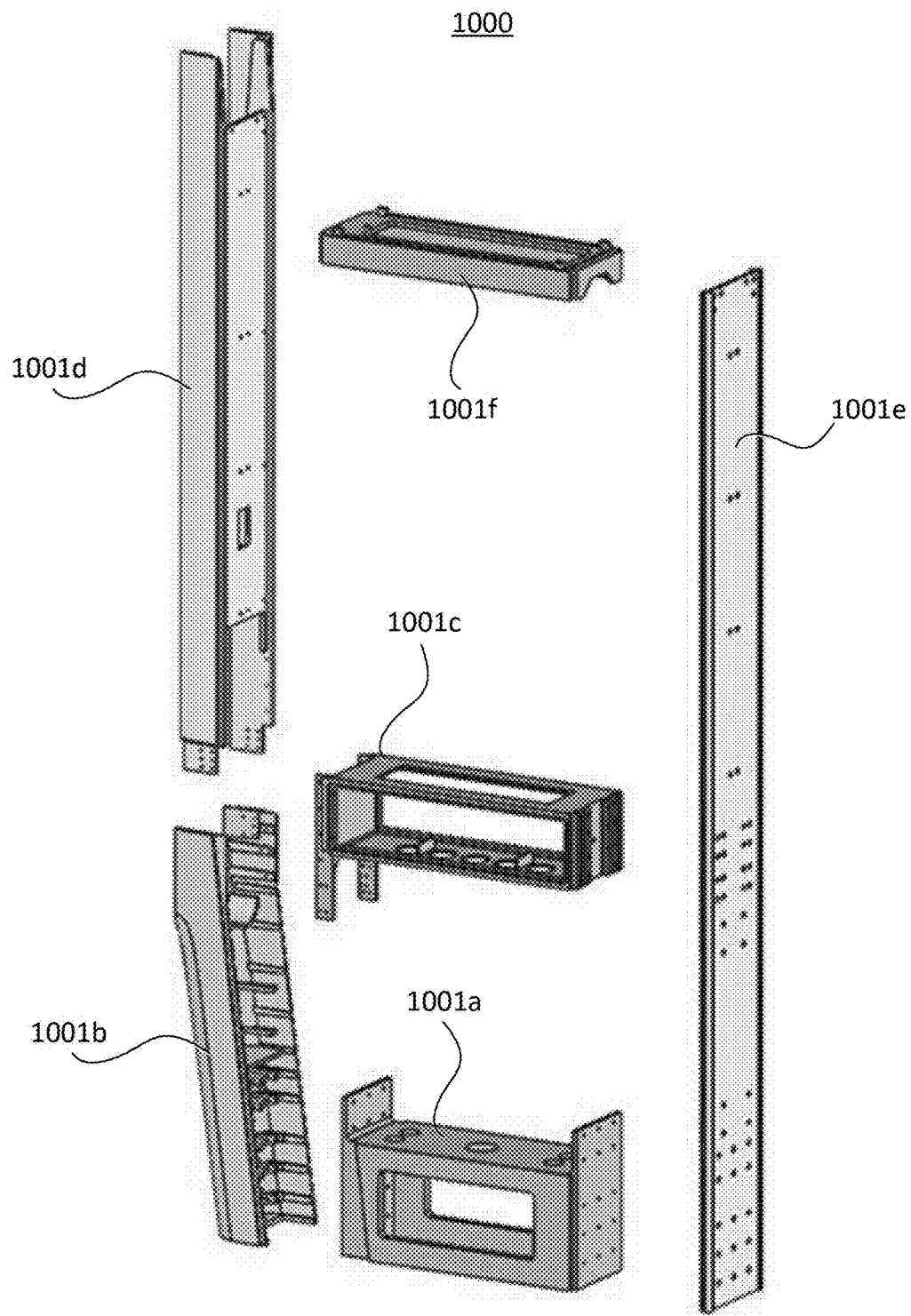

FIGS. 10A-10C show the frame 1000 of a PCS 100, according to some embodiments, and illustrate how the frame 1000 partially forms the PCS's compartments. In some embodiments, the frame 1000 is the frame of a monocoque structure, wherein the frame supports the components, forms the compartments and is also the outer face (or "skin") of portions of the PCS (e.g., the user interface compartment 850 and the opposing side 1050 of the PCS). This approach may simplify construction by reducing the number of brackets, mounting accessories, part count, etc.

In another embodiment, the frame 1000 is that of a traditional structure, and the outer skins are attached to the frame. In such embodiments, the frame supports the components of the PCS, forms the compartments of the PCS, and acts as a rigid structural chassis. One advantage of this approach is field replaceability. If an outer skin is damaged (e.g., by vandalism or by ordinary wear and tear), the damaged skin can be replaced with a new skin. As long as the frame remains uncompromised, damaged outer skins can be removed, replaced, and (optionally) sent to a service facility for refurbishing. Refurbishing methods may include removing dents and/or scratches, sanding, texturing, reshaping, and/or re-painting. Skins that are not suitable for refurbishing (e.g., due to extensive damage) may be recycled and turned into new parts.

As can be seen in FIGS. 10A-10C, frame 1000 may include a bottom member 1001a, a lower front member 1001b, a cross-frame member 1001c, an upper front member 1001d, a rear member 1001e, and a top member 1001f. In the example of FIGS. 10A-10C, lower portions of lower front member 1001b and rear member 1001e are joined to opposite sides of bottom member 1001a. One side of cross-frame member 1001c is joined to an upper portion of lower front member 1001b and a lower portion of upper front member 1001d. The opposite side of cross-frame member 1001c is joined to rear member 1001e proximate to a midpoint between the rear member's top and base ends. The upper portions of upper front member 1001d and rear member 1001e are joined to opposite sides of top member 1001f.

In the example of FIGS. 10A-10C, top member 1001f and the upper portion of upper front member 1001d form a bottom and a side of communications compartment 880. Two sides of display compartment 870 are formed by upper front member 1001d and rear member 1001e, and the top and bottom of display compartment 870 are formed by top member 1001f and cross-frame member 1001c, respectively. Cross-frame member 1001c forms the top, bottom, and two sides of air intake compartment 865. User interface compartment 850 is formed in part by the bottom portion of upper front member 1001d, the top portion of lower front member 1001b, and a side of cross-frame member 1001c. Two sides of electronics compartment 840 are formed by lower front member 1001b and the lower portion of rear member 1001e, and the top and bottom of electronics compartment 840 are formed by cross-frame member 1001c and bottom member 1001a, respectively. Bottom member 1001a forms mounting compartment 890.

Figure 11:
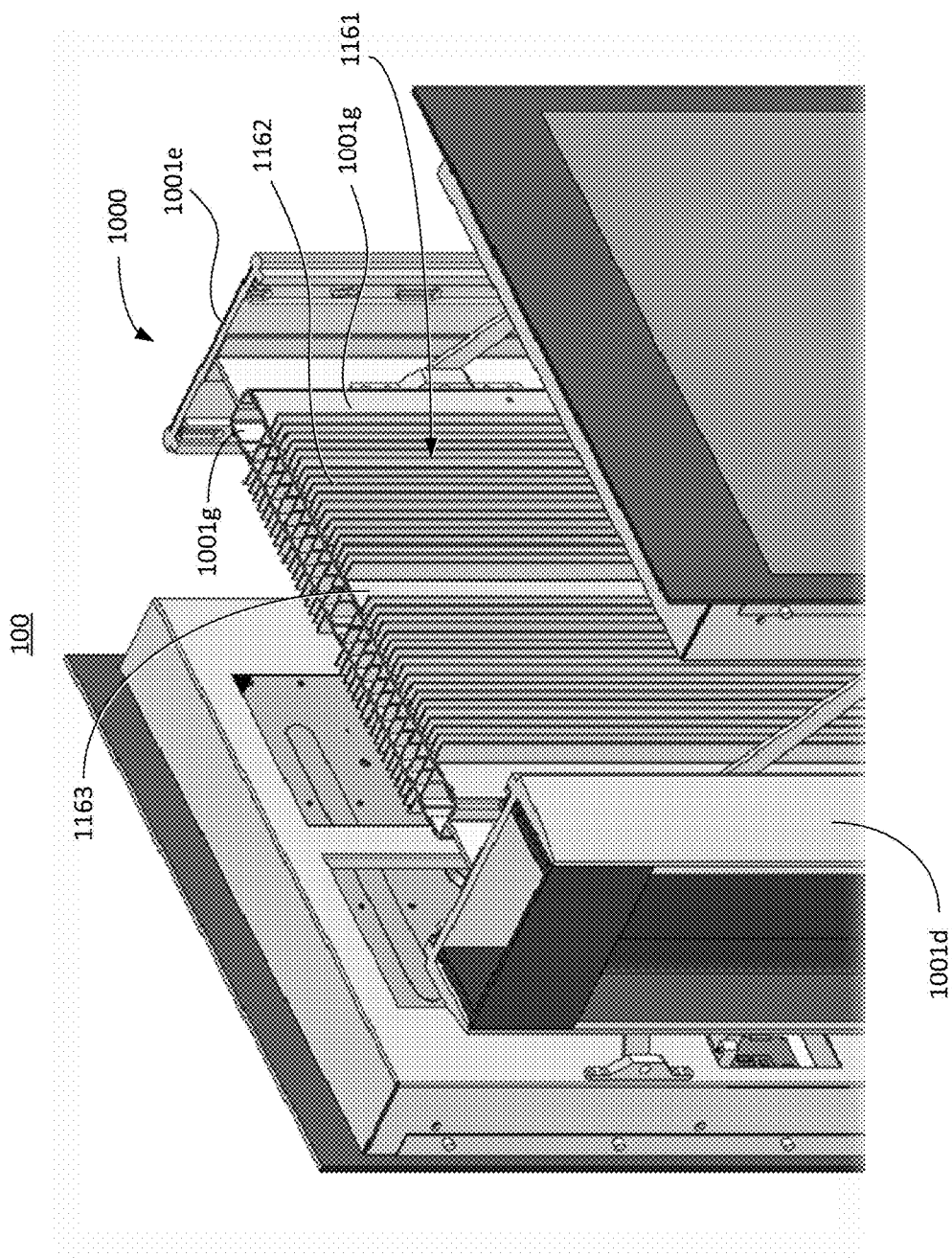
FIG. 11 shows a perspective view of a portion of a PCS, in accordance with some embodiments.

Embodiments of frame 1000 are not limited by the configuration shown in FIGS. 10A-10C. As can be seen in FIG. 11, which shows a front-perspective view of a portion of PCS 100, some embodiments of frame 1000 further include one or more cross-frame members 1001g coupled to upper front member 1001d and an upper portion of rear member 1001e to form an I-beam. In some embodiments, cross-frame member(s) 1001g may include one or more ribbed heat sinks 1161. A ribbed heat sink 1161 may include a substantially planar member 1163 and fins 1162 extending from the substantially planar member 1163 (e.g., in one or more directions substantially perpendicular to the surface of the substantially planar member).

Frame 1000 may facilitate cooling of the PCS's compartments. In some embodiments, one or more (e.g., all) members of frame 1000 may have relatively high thermal conductivity (e.g., average thermal conductivity of at least 90, 100, 110, or 120 Btu/(hr*° F.*ft)). When the temperature within a PCS compartment is greater than the ambient temperature in the area proximate to the PCS, the frame member(s) with relatively high thermal conductivity may function as heat sinks (including, but not limited to, cross-frame member(s) 1001g), such that heat from the compartments is transferred to the PCS's ambient environment through the frame member(s). The member(s) of frame 1000 with relatively high thermal conductivity may substantially consist of materials with relatively high thermal conductivity, including, without limitation, aluminum, thermal pyrolytic graphite, silicon carbide, etc. For example, one or more member(s) of frame 1000 may substantially consist of aluminum.

Members of frame 1000 may be manufactured using suitable techniques. In some embodiments, bottom member 1001a, lower front member 1001b, cross-frame member 1001c, cross-frame member(s) 1001g, and/or top member 1001f may be metal castings. In some embodiments, upper front member 1001d and/or rear member 1001e may be extruded metal, polymer, composite, etc.

Figure 12A:
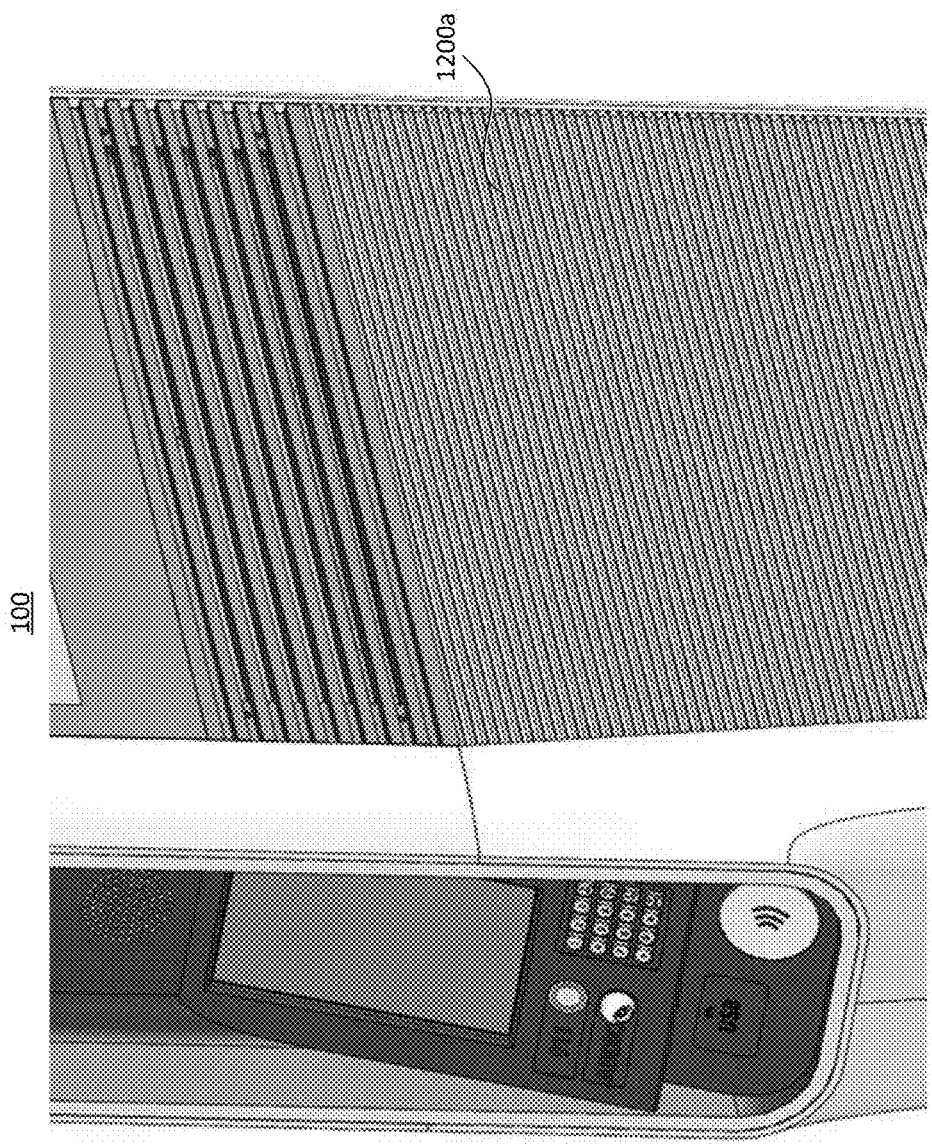
Figure 12C:
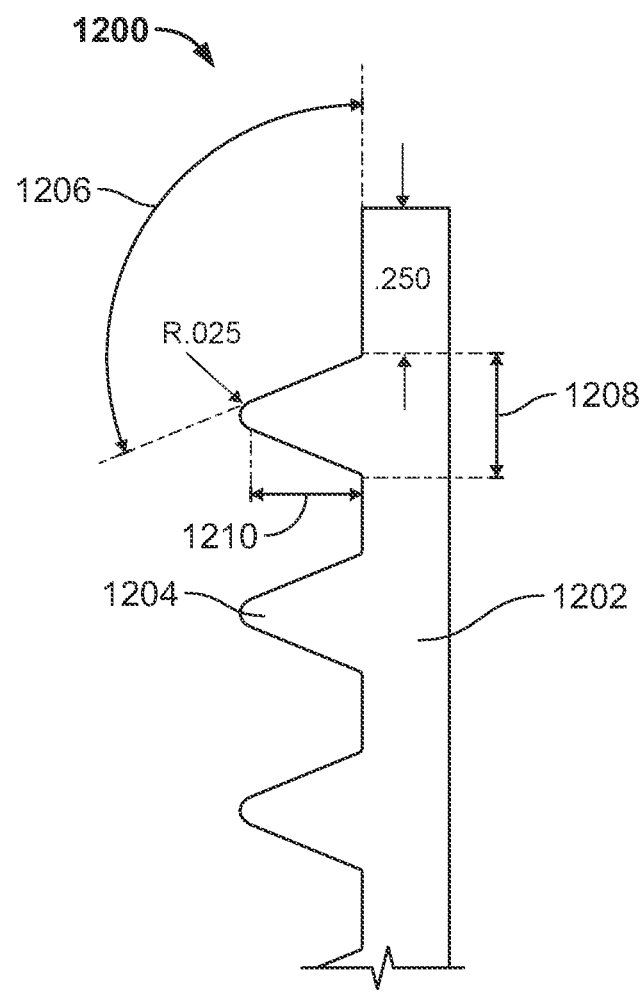
FIG. 12C shows a schematic side view of a ribbed panel, in accordance with some embodiments.

Referring to FIGS. 12A-12C, portions of a PCS's frame 1000 and/or compartments may be covered by ribbed panels 1200. The ribbed panels 1200 may discourage vandalism of PCS 100, since the panel ribs might offer a less appealing target for drawing, painting, or etching than other, smoother surfaces. In addition, the ribbed panels may be swappable, as shown in FIG. 12B, such that a damaged or vandalized panel could be quickly replaced with a pristine panel.

Referring to FIG. 12C, a ribbed panel 1200 may include a substantially planar member 1202 and a set of ribs 1204 extending from the planar member. In some embodiments, the angle 1206 between the outer surface of a rib and the outer surface of the planar member is between approximately 95° and 115°. In some embodiments, the thickness 1208 of a rib 1204 at the rib's base may be between approximately 0.25" and 0.5" and the width 1210 of a rib 1204 may be between approximately 0.3" and 0.6". Other dimensions may be used.

Techniques for Controlling the Temperature of a PCS

Figure 13:
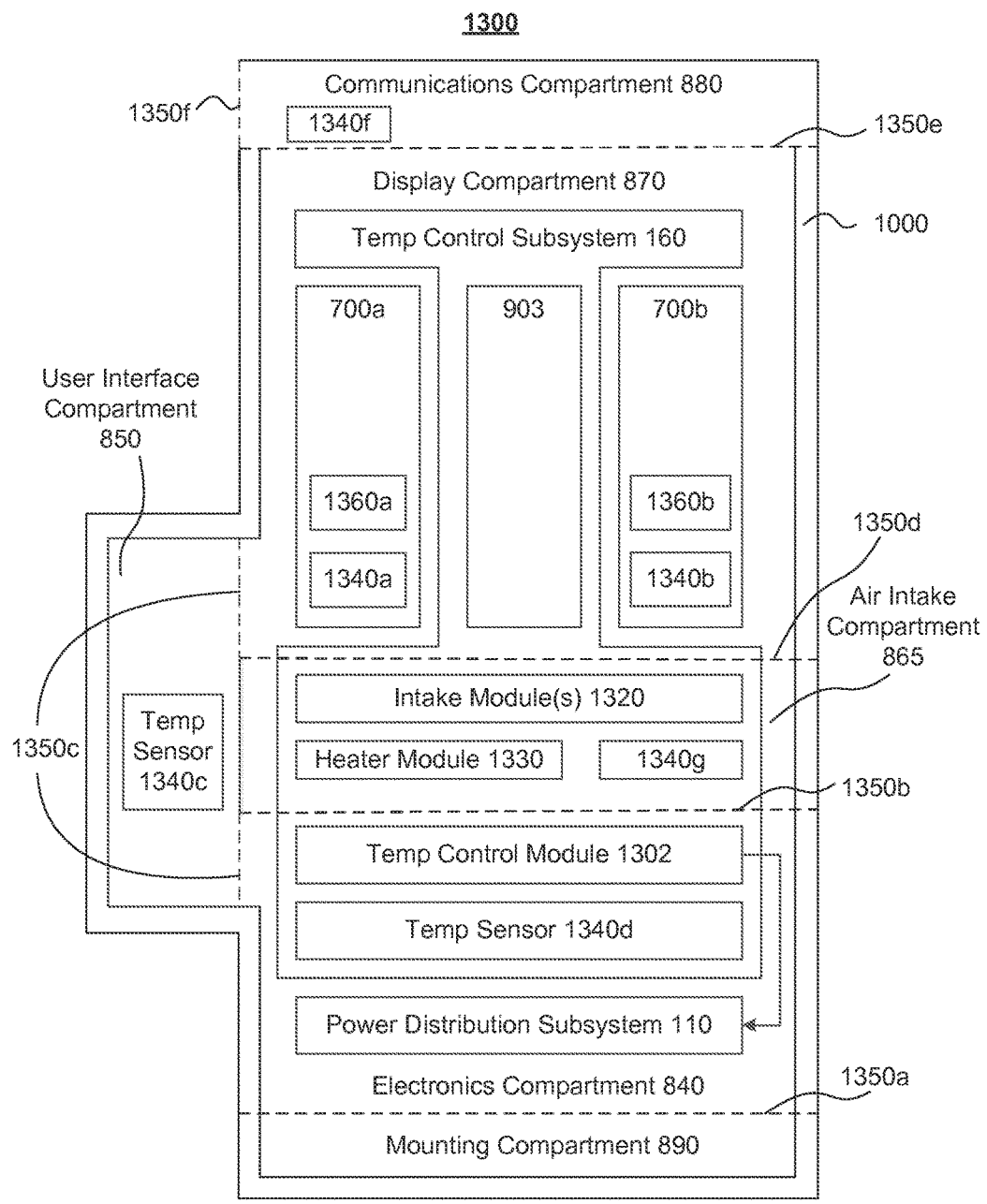
FIG. 13 shows a block diagram of a temperature control system of a PCS, in accordance with some embodiments.

According to an aspect of the present disclosure, the temperature of a personal communication structure (PCS) 100 is controlled, which can facilitate proper operation of the PCS's components and prevent damage to the PCS's components. FIG. 13 illustrates a system 1300 for controlling the temperature of a PCS, according to some embodiments. Temperature control system 1300 may use ambient-air-based cooling techniques (e.g., ambient-air ventilation, air circulation, etc.) to cool the PCS's components, which can be less expensive and more reliable than liquid-based cooling techniques or refrigerant-based cooling techniques. In some embodiments, the temperature control system 1300 may use less power (e.g., significantly less power) than liquid-based or refrigerant-based cooling techniques. In some embodiments, the temperature control system may be more compact than liquid-based or refrigerant-based cooling systems, and therefore may be more suitable for use in a PCS 100 that has a slim profile.

In some embodiments, temperature control system 1300 includes the PCS's frame 1000, one or more vents 1350, one or more temperature sensors 1340, and one or more fans 1360. The frame 1000 may directly or indirectly transfer heat from the PCS's compartments to the PCS's ambient environment. The vent(s) 1350 may allow air to enter or exit the PCS, or to move between compartments in the PCS. The fan(s) 1360 may circulate air between or within portions of the PCS, draw air into the PCS, or exhaust air from the PCS.

The temperature sensor(s) 1340 may be located in or on the PCS and adapted to measure the temperature of the PCS or portions thereof (e.g., compartments, components, etc.). In some embodiments, a temperature sensor 1340d is located in electronics compartment 840 (e.g., communicatively coupled to and controlled by processing device(s) 400 of maintenance subsystem 130). In some embodiments, a temperature sensor 1340c is located in user interface compartment 850 (e.g., communicatively coupled to and controlled by processing device(s) 600 of user interface subsystem 150 or processing device(s) 400 of maintenance subsystem 130). In some embodiments, temperature sensors 1340a and 1340b are located in display compartment 870 (e.g., in display modules 700a and 700b, respectively). In some embodiments, a temperature sensor 1340f is located in the communications compartment 880 to monitor the temperature of devices (e.g., RF devices) in the communications subsystem 180. In some embodiments, a temperature sensor 1340g is located proximate to an air intake grill of the air intake compartment 865 (e.g., the temperature sensor 1340g may be located in the air intake compartment 865 and proximate to the air intake grill). The temperature measurement from sensor 1340g therefore may be indicative of the ambient temperature outside the PCS 100. A temperature sensor associated with a display module 700 may be communicatively coupled to and controlled by processing device(s) 710 of the display module 700 or processing device(s) 400 of maintenance subsystem 130. Each of temperature sensors 1340 may include, without limitation, a thermistor (e.g., a Negative Temperature Coefficient (NTC) thermistor or Positive Temperature Coefficient (PTC) thermistor), thermocouple, resistance thermometer, silicon bandgap temperature sensor, and/or any other suitable temperature sensor. As just one example, one or more temperature sensors 1340 may include a 10 kOhm NTC thermistor.

In some embodiments, temperature control system 1300 includes a temperature control subsystem 160. Temperature control subsystem 160 may include a temperature control module 1302, an intake module 1320, a heater module 1330, and a heat sink 903. The temperature control module 1302 may determine the PCS's temperature (e.g., based on data provided by the temperature sensor(s) 1340 and/or other suitable data), and control the operation of PCS components (e.g., user interface subsystem 150, display subsystem 170, power distribution subsystem 110, intake module 1320, heater module 1330, fans 1360, etc.) to keep the temperature of the PCS within a desired range, or to keep the temperatures of portions of the PCS within desired ranges. Intake module 1320 may include one or more fans adapted to circulate air within and/or through the PCS. Heater module 1330 may include one or more heating elements disposed within or on the PCS, which can heat the interior of the PCS. Techniques for controlling the PCS's temperature are described in further detail below.

As described above with reference to FIGS. 9-10, some embodiments of the frame 1000 of PCS 100 can facilitate cooling of the PCS by transferring heat from the PCS's compartments to the PCS's ambient environment. The frames of conventional kiosks are generally made of stainless steel, galvanized steel, and/or other materials that have relatively strong structural properties but relatively low thermal conductivity. Such frames generally do not facilitate efficient transfer of heat from the kiosk's interior to the kiosk's ambient environment. By contrast, as described above, one or more (e.g., all) members of frame 1000 may have relatively high thermal conductivity, such that frame 1000 functions as a heat sink that transfers heat from the PCS's components to the PCS's ambient environment. In some embodiments, one or more (e.g., all) members of frame 1000 may be made of aluminum or an aluminum alloy.

Measures may be taken to enhance the strength or durability of frame 1000. In some embodiments, one or more treatments may be applied to the frame 1000 or to members thereof to increase the frame's structural strength or durability. Such treatments may include, without limitation, applying an aluminum chromate conversion coating, epoxy-priming, wet-painting, clear-coating, etc. In some embodiments, the frame's members may be arranged to increase the frame's structural strength. As can be seen in FIGS. 10A-10C and 11, frame 1000 may be cross-braced in one or more locations (e.g., at the PCS's base by bottom member 1001*a*, at the top of the PCS by top member 1001*f*, at the air intake compartment by cross-frame member 1001*c*, and at the display compartment by cross-frame member(s) 1001*g*).

Returning to FIG. 13, temperature control system 1300 of PCS 100 may include one or more vents 1350. In some embodiments, the vents are arranged as shown in FIGS. 14A-E. As can be seen in the exploded perspective view of FIG. 14A, PCS 100 may include a vent 1350*a* between the mounting compartment 890 and the electronics compartment 840, a vent 1350*b* between the electronics compartment 840 and the air intake compartment 865, and a vent 1350*d* between the air intake compartment 865 and the display compartment 870.

Figure 14A:
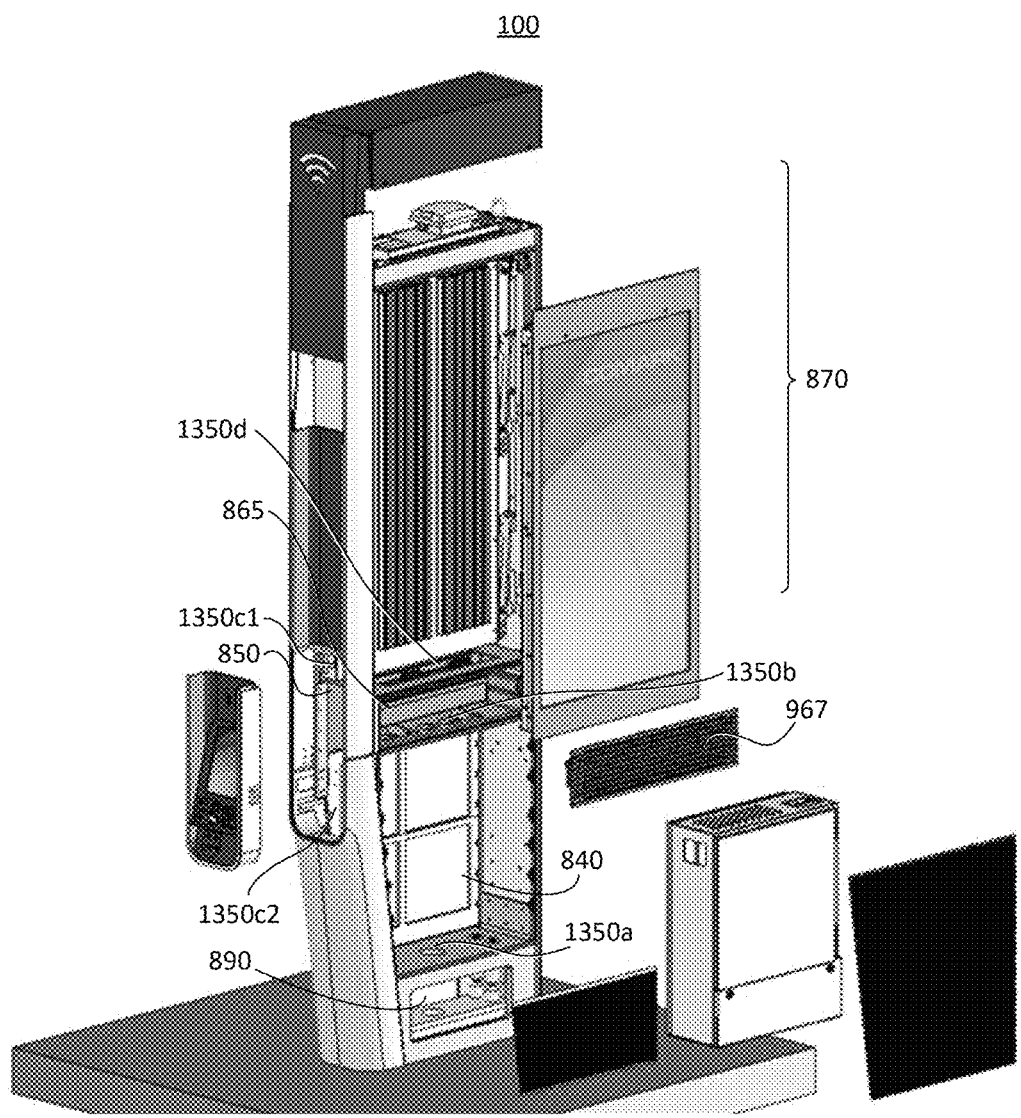
FIGS. 14A, 14B, and 14C show one or more vents of a temperature control system in exploded perspective views of a PCS, in accordance with some embodiments.
Figure 14B:
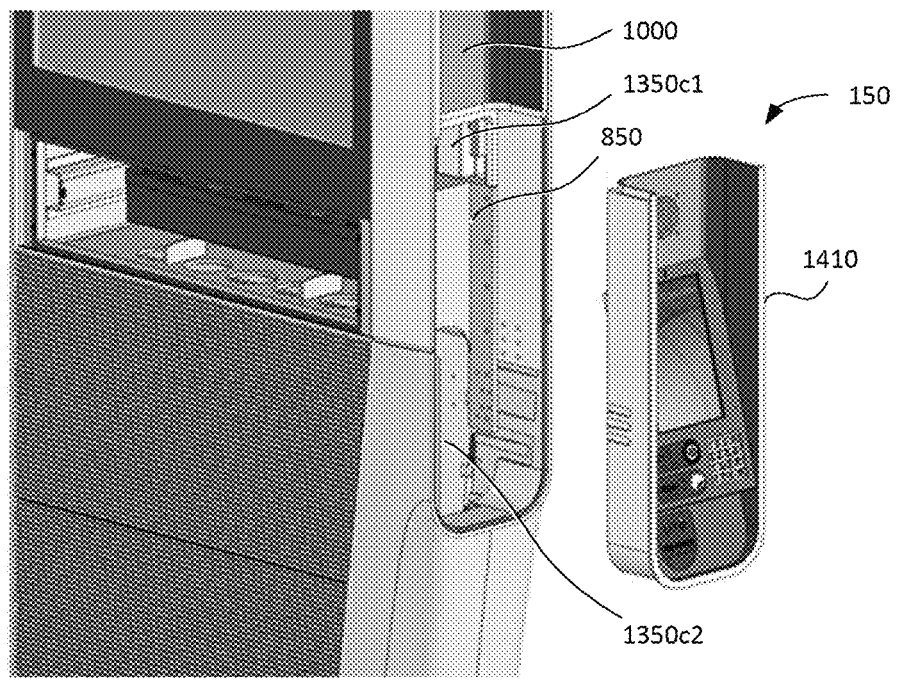
Figure 14C:
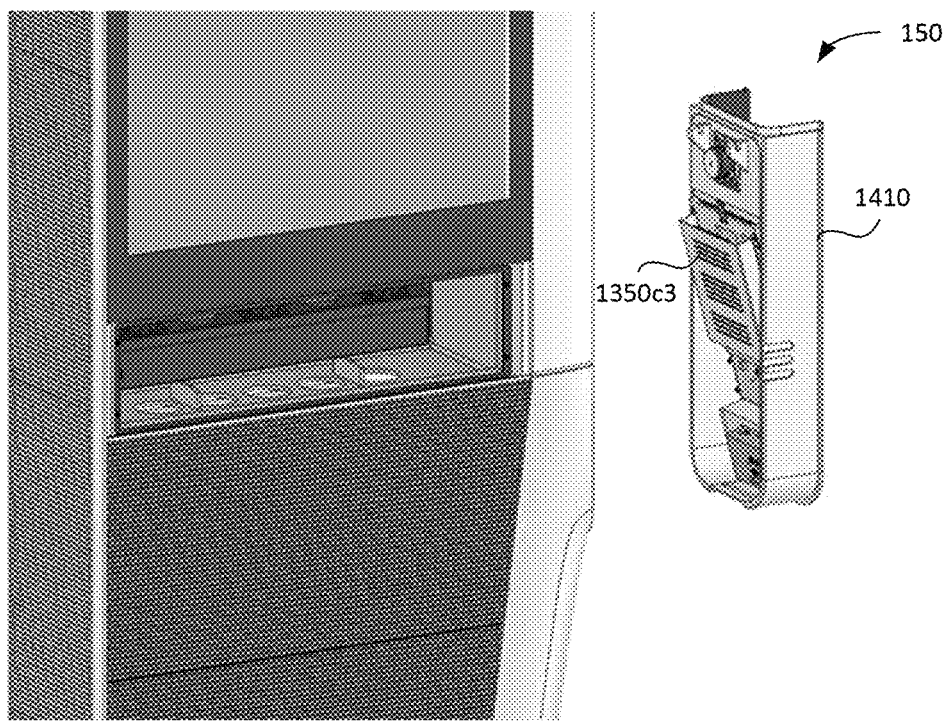

In some embodiments, PCS 100 includes a vent 1350*c*1 between user interface compartment 850 and display compartment 870, and/or a vent 1350*c*2 between user interface compartment 850 and electronics compartment 840. One possible arrangement of vents 1350 associated with user interface compartment 850 is shown in FIGS. 14B-C. In the example of FIGS. 14B-C, vents 1350*c*1 and 1350*c*2 are formed in the frame 1000 of the PCS, and user interface subsystem 150 includes a housing 1410, which includes a vent 1350*c*3 in communication with user interface compartment 850. Alternatively or in addition, PCS 100 may include a vent between user interface compartment 850 and air intake compartment 865.

Figure 14D:
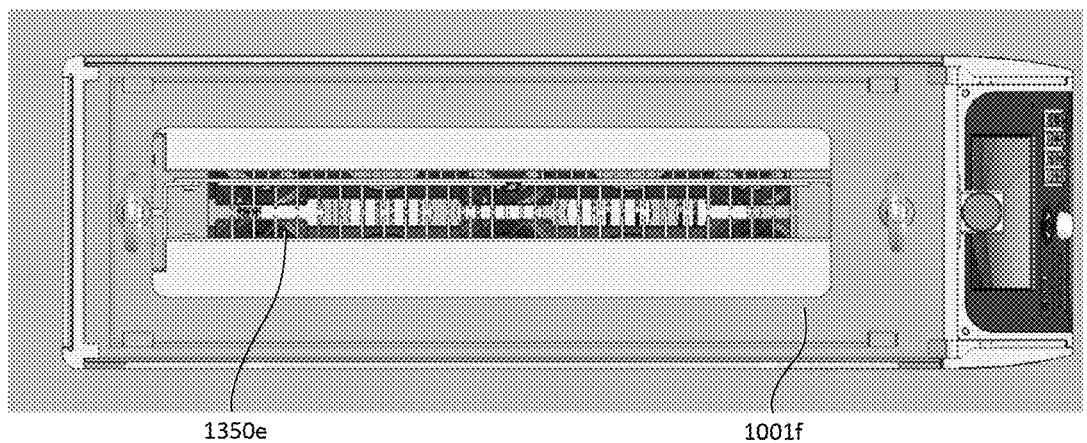
FIG. 14D shows a vent of a temperature control system in a top view of a PCS, in accordance with some embodiments.

Returning to FIG. 13, temperature control system 1300 of PCS 100 may include a vent 1350*e* between display compartment 870 and communications compartment 880. One possible configuration of vent 1350*e* is shown in FIG. 14D, which illustrates a top view of PCS 100 with some components of communications compartment 880 not shown for clarity. In the example of FIG. 14D, vent 1350*e* is formed in top member 1001*f* of frame 1000 between display compartment 870 and communications compartment 880.

Figure 14E:
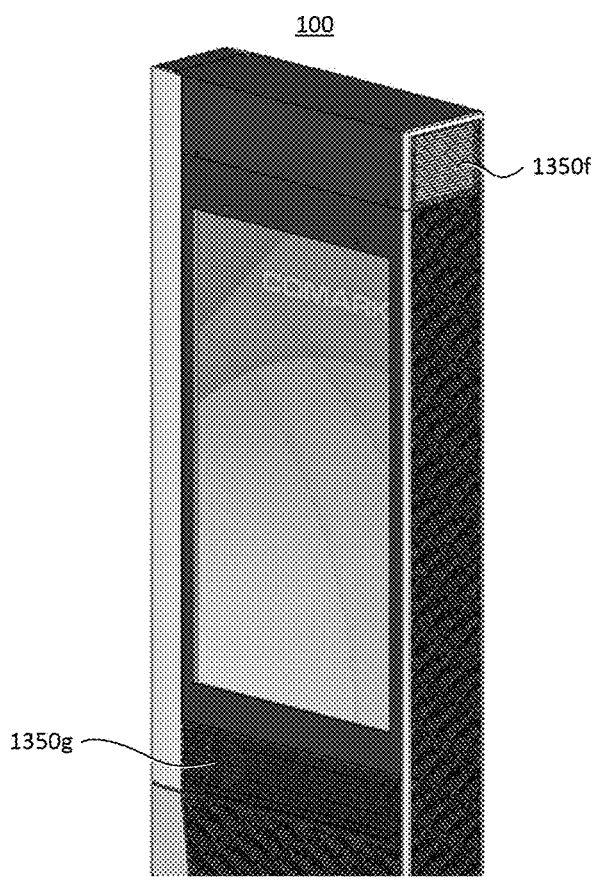
FIG. 14E shows vents of a temperature control system in a perspective view of a PCS, in accordance with some embodiments.

Returning to FIG. 13, temperature control system 1300 may include an intake vent (not shown in FIG. 13) between air intake compartment 865 and the ambient environment, and an exhaust vent 1350*f* between communications compartment 890 and the ambient environment. In some embodiments, the intake vent 1350*g* and exhaust vent 1350*f* are arranged as shown in FIG. 14E. The intake and exhaust vents may be covered by respective intake and exhaust grills, to prevent unauthorized access to the PCS's components. The rear exhaust vent 1350*f* may direct warm air away from the PCS 100 toward the street or another area where people would not usually be standing. This exhaust configuration avoids having warm air being blown down around the PCS (e.g., the base of the PCS), which could attract bystanders on cold days.

Figure 15:
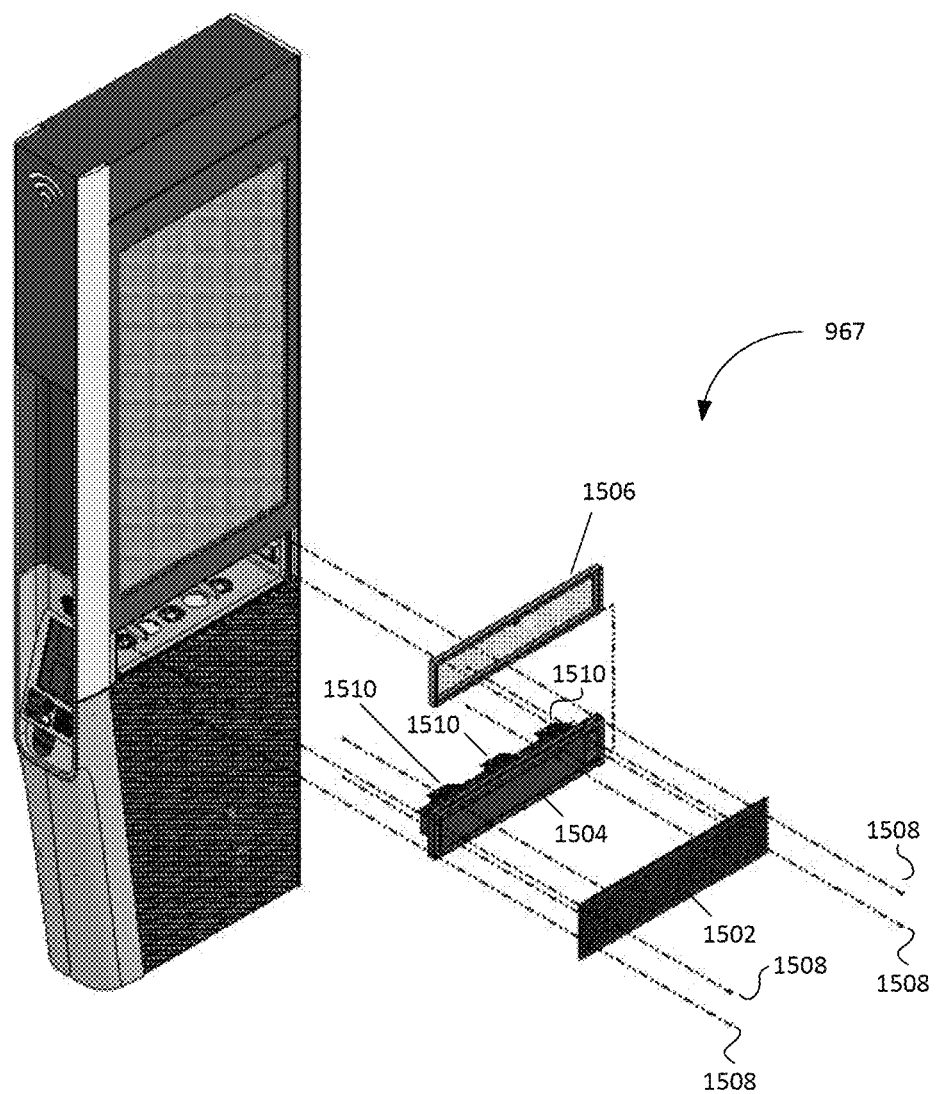
FIG. 15 shows an exploded perspective view of an intake module, in accordance with some embodiments.

In some embodiments, air intake module 1320 includes one or more air intake assemblies. In some embodiments, air intake module 1320 includes two air intake assemblies 967 disposed adjacent to each other, on opposite sides of PCS 100. FIG. 15 shows an exploded front perspective view of one air intake assembly 967, according to some embodiments. Air intake assembly 967 may be at least partially enclosed in air intake compartment 865 and may implement a portion of temperature control subsystem 160. In some embodiments, air intake assembly 967 includes a grill 1502, a filter 1506, and a fan assembly 1504. The grill 1502 may be secured to the PCS by security fasteners 1508. The filter 1506 may be a semi-permeable membrane suitable for passing air while filtering out unwanted particles (e.g., moisture particles, etc.).

Fan assembly 1504 includes one or more fans 1510 (e.g., three fans 1510, as shown in the example of FIG. 15). The fans 1510 may be powered by power distribution subsystem 110. In some embodiments, one or more of the fans 1510 may be adaptable to provide different airflow rates (e.g., by adjusting the rate of rotation of a fan's blades). A fan's airflow rate may be controlled by an input signal. For example, a fan 1510 may be powered by a pulse-width modulated (PWM) signal, and the airflow rate through the fan may increase as the duty cycle of the PWM power signal increases. As another example, the fan may have a control input, which may select between multiple fan speeds.

In some embodiments, the fans 1510 provide tachometer outputs. As those skilled in the art can appreciate, the temperature control system 1300 may determine a fan's speed based on the fan's tachometer output. The temperature control system 1300 may adjust the duty cycle of the fan's input signal in response to the tachometer reading, thereby forming a closed loop system.

In some embodiments, the temperature control system 1300 may identify a fan fault based on the fan's tachometer reading. For example, if the duty cycle of the fan's input signal exceeds a duty cycle threshold (e.g., 50%) but the fan's tachometer output indicates that the fan's rate of rotation is less than a threshold rate of rotation or that the fan is not rotating, the system may determine that the fan has failed. Maintenance system 130 may report a fan fault to a remote service center, which may dispatch service personnel to replace the fan 1510.

In some embodiments, the temperature control system 1300 may determine that an air intake or exhaust vent is blocked based on the operation of one or more fans 1510. For example, if a fan 1510 located in the air intake assembly 967 is operating below a predetermined performance threshold (e.g., the fan's airflow rate is below an airflow rate threshold), maintenance system 130 may report to the service center that an air intake vent is blocked. Likewise, if a fan 1510 located proximate to an exhaust vent 1350*f* is operating below a predetermined performance threshold (e.g., the fan's airflow rate is below an airflow rate threshold), maintenance system 130 may report to the service center that an exhaust vent is blocked. It can be appreciated that if air intake or exhaust vents become blocked, the lack of air flow could result in a serious temperature hazard for the components of the PCS 100.

In some embodiments, heater module 1330 includes one or more heating elements. The heating element(s) may be located in air intake compartment 865 or in other suitable locations in or on the PCS. In some embodiments, one or more of the heating elements can operate at different temperatures. A heating element's temperature may be controlled by an input signal. For example, the temperature of a heating element may depend on characteristics of the power signal applied to the heating element (e.g., amplitude of the power signal's voltage, frequency of the power signal, duty cycle of a pulse-width modulated power signal, etc.). As another example, the heating element may have a control input, which may select between multiple temperatures.

In some embodiments, the temperature control system 1300 may include an automated vent flap and one or more recirculating fans, which may be used to increase the internal temperature of the PCS 100 by trapping and recirculating heat generated by the PCS's electronic components. It can be appreciated that some of the PCS's electronic components may generate considerable heat, and that some of the electronic components (e.g., display modules 700) may have lower operating performance at colder temperatures. When the temperature is below a threshold, temperature controller 160 may close the vent and turn on the recirculating fans, thereby recirculating the heat generated by the PCS's electronic components to allow the temperature inside the PCS 100 to rise. When the temperature reaches a second, higher threshold, the temperature control system 1300 may open the vent flap, turn off the re-circulating fans, and/or turn on the intake fans to allow the temperature inside the PCS 100 to decrease. The automated vent flap and recirculating fan(s) may be used in addition to or as an alternative to the heater module 1330.

Figure 16B:
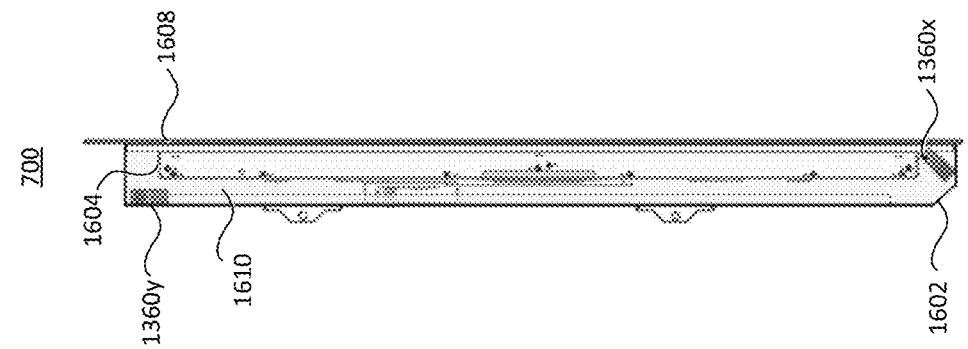
FIGS. 16A and 16B show, respectively, an exploded perspective view and a side view of a display module, in accordance with some embodiments.
Figure 16A:
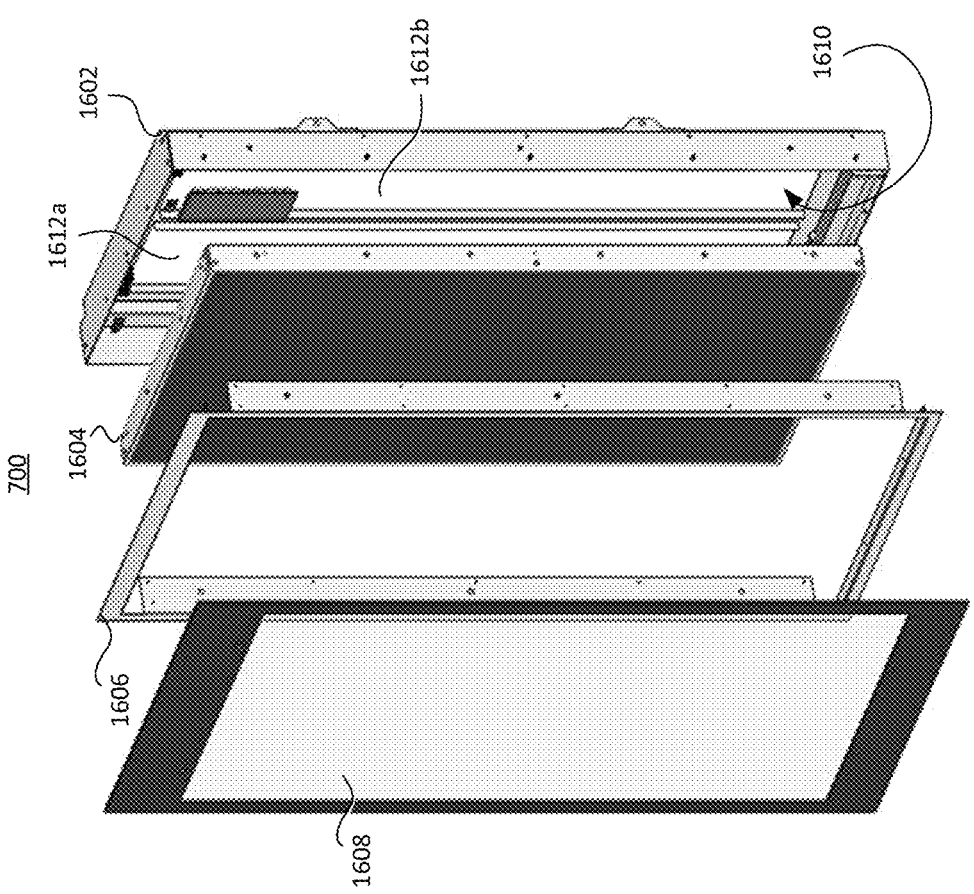

Returning to FIG. 13, display compartment 870 may enclose one or more display modules 700. FIGS. 16A and 16B show an exploded perspective view and a side view of a display module 700, respectively. In some embodiments, display module 700 includes a housing and a display panel 1604. The housing may include a housing frame 1602, a covering frame 1606, and a transparent covering 1608. Display module 700 may be assembled by positioning display panel 1604 in cavity 1610, fastening the display panel to housing frame 1602, and using covering frame 1606 to secure transparent covering 1608 over display panel 1604. Transparent covering 1608 may be a toughened glass (e.g., Gorilla® Glass manufactured by Corning, Inc.).

Display module 700 may include features that facilitate control of the temperature of display panel 1604. In some embodiments, housing frame 1602 includes one or more apertures 1612, which may facilitate heat exchange between display panel 1604 and other portions of the PCS. For example, fins of ribbed heat sink 903 may be inserted into the aperture(s) 1612 to facilitate heat transfer from display panel 1604 to heat sink 903.

In some embodiments, display module 700 includes one or more fans 1360 arranged to circulate air within the display module's cavity 1610. The fans may circulate air along the top of display panel 1604, between a viewing surface of display panel 1604 and transparent covering 1608, along the bottom of display panel 1604, and within cavity 1610 behind display panel 1604. In the example of FIG. 16B, one or more fans 1360x are disposed proximate to the bottom of display panel 1604 in display module 700, and one or more fans 1360y are disposed proximate to the top of display panel 1604.

In some embodiments, display module 700 includes one or more temperature sensors 1340 (e.g., temperature sensor 725 as shown in FIG. 7). The temperature sensor(s) may be included as part of display panel 1604. In some embodiments, if display module 700 or the temperature control module 1302 determines that the temperature of the display panel 1604 is above a first threshold, the display module (or temperature control processor) may decrease the brightness of the backlight until the temperature of the display module is below a second threshold.

Figure 17:
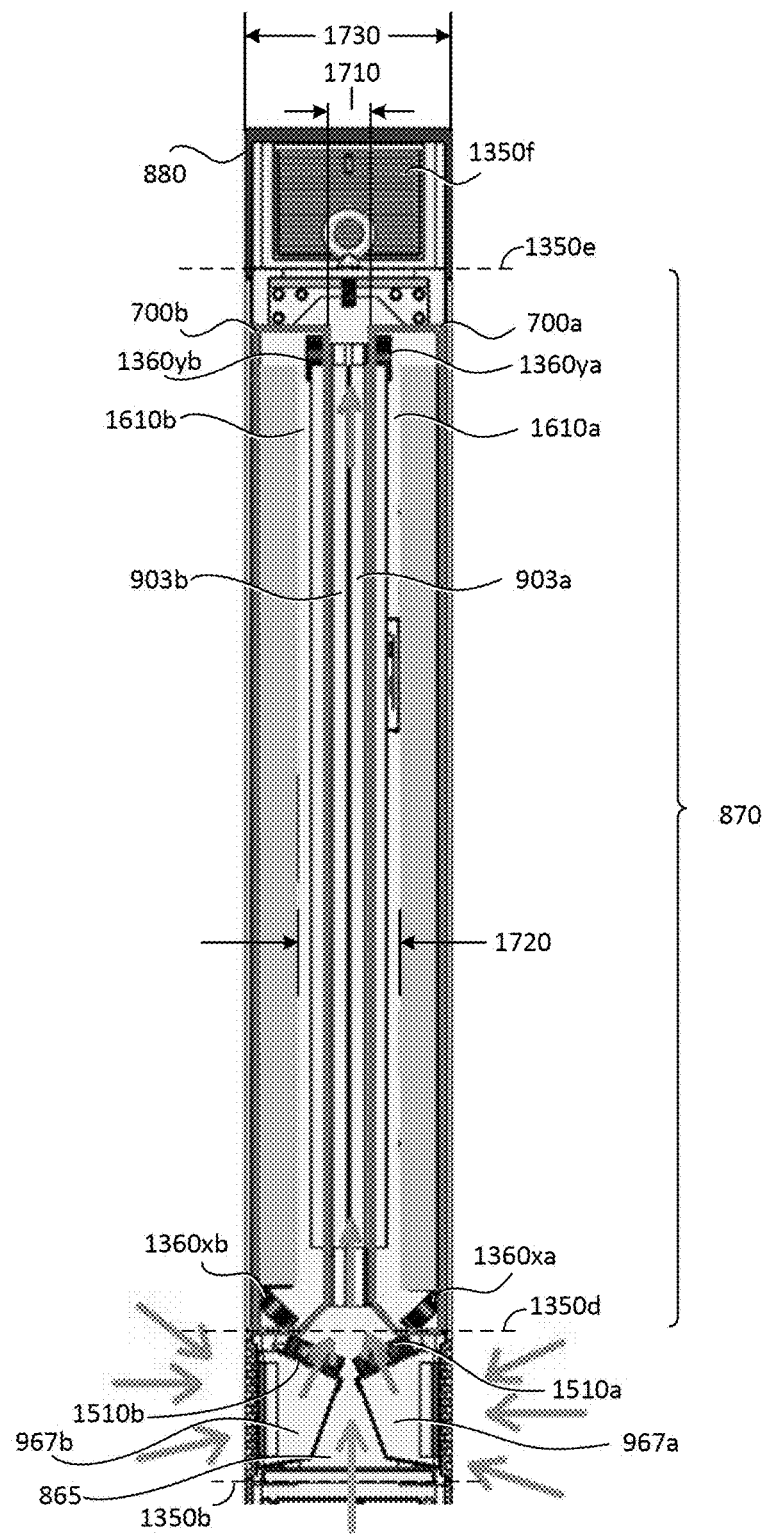
FIG. 17 shows a side view of a top portion of a PCS, in accordance with some embodiments.

Aspects of the operation of temperature control system 1300 are illustrated in FIG. 17, which shows a side view of an upper portion of PCS 100, in accordance with some embodiments. In the example of FIG. 17, air is drawn into air intake compartment 865 by air intake assemblies 967a and 967b. The air may be drawn into air intake compartment 865 from outside the PCS (e.g., through the grills of the air intake assemblies), from user interface compartment 850 (e.g., through vent 1350c), from electronics compartment 840 and mounting compartment 890 (e.g., through vent 1350b), or from any other portion of PCS 100 in fluid communication with the air intake assemblies.

Fan assemblies 1510a-b may discharge the air from air intake compartment 865 into display compartment 870 (e.g., through vent 1350d). Within display compartment 870, the air may move from the bottom of the compartment to its top through a cavity formed between two ribbed heat sinks 903a and 903b. After passing through the cavity between the heat sinks, the air may enter communications compartment 880 (e.g., through vent 1350e). Communications compartment 880 may exhaust the air into the PCS's ambient environment through vent 1350f. In this manner, circulation of ambient air through the PCS may exhaust heat generated by the PCS's components into the ambient environment.

In the example of FIG. 17, PCS 100 includes two display modules 700a and 700b. In some embodiments, fins of ribbed heat sink 903a are inserted through the aperture(s) 1612 in the back of display module 700a to facilitate cooling of display module 700a. Furthermore, heat sink 903a and display module 700a may be arranged such that cavity 1610a within display module 700a is substantially airtight. For example, a compression seal may be disposed on the back of display module 700a around the aperture(s) in the display housing, and the compression seal may form a seal between the display housing and the heat sink when the fins of the heat sink are inserted through the aperture(s). Display module 700b and heat sink 903b may be arranged in substantially the same configuration as display module 700a and heat sink 903a.

Making cavity 1610 of display module 700 substantially airtight may facilitate maintenance of display panel 1604. Many display panels are not designed to operate in environments where the air is not clean and conditioned. However, the ambient air drawn into the PCS through air intake assemblies 967a-b may be unclean and unconditioned. Thus, sealing the display panels 1604 in substantially airtight cavities 1610 may limit the display panels' exposure to harmful particles and other contaminants entrained in the ambient air.

Alternatively, in some embodiments, the fins of the ribbed heat sinks may not be inserted through apertures in the backs of the display modules. Rather, the fins of the ribbed heat sinks may be disposed proximate to or in contact with the backs of the display modules, to facilitate cooling of the display modules. In such embodiments, the display modules may not include apertures. Rather, the attachment of transparent covering 1608 to display frame 1602 may create a substantially airtight cavity 1610 within the display module. Forming the substantially airtight cavities in this manner may further protect the display panels from harmful particles and contaminants, because the substantially airtight cavities could be sealed in a controlled, clean environment, rather than being sealed in the PCS's ambient environment. On the other hand, forming the airtight cavities in this manner may require additional structure to transfer heat effectively from the display modules to other portions of display compartment 870.

In some embodiments, the minimum distance 1710 between the backs of the display modules 700 may between approximately 1 inches and approximately 3 inches. In some embodiments, the minimum distance 1720 between the backs of the display panels 1604 may between approximately 7 inches and approximately 9 inches. In some embodiments, the minimum distance 1730 between the viewing surfaces of the display panels 1604 may be between approximately 10 inches and approximately 12 inches.

Returning to FIG. 13, temperature control subsystem 160 may include a temperature control module 1302 that controls the PCS's temperature. Temperature control module 1302 may control the PCS's temperature based on environmental information, including but not limited to temperature information indicating the temperature in or near PCS 100. Based on the temperature information, temperature control module 1302 may determine the temperature of the PCS and/or of portions of the PCS (e.g., components or compartments of the PCS) either directly or indirectly.

Temperature control module 1302 may obtain such temperature information from temperature sensor(s) 1340. In some embodiments, temperature control module 1302 includes one or more sensor drivers that can activate the temperature sensor(s) 1340. When activated, the temperature sensor(s) may obtain temperature measurements and provide data indicative of those temperature measurements to temperature control module 1302. Alternatively or in addition, other components of PCS 100 (e.g., processor(s) 600 of user interface subsystem 150; processor(s) 710 of display modules 700; and/or processor(s) 400 of maintenance subsystem 130) may include one or more sensor drivers that can activate corresponding temperature sensors (e.g., temperature sensors 1340c; 1340a-b; and 1340d, f, and g, respectively), and temperature control module 1302 may obtain the temperature information from the PCS components that drive the temperature sensors. Temperature control module 1302 may communicate with such components via network subsystem 120. In some embodiments, temperature control module 1302 may obtain temperature information regarding the temperature in the vicinity of the PCS from a suitable source (e.g., a website) via a communication network (e.g., network 126).

Temperature control module 1302 may control the PCS's temperature by controlling the operation of other PCS components, including, without limitation, heater module 1330, fan(s) 1360, power distribution subsystem 110, display subsystem 170, etc. Temperature control module 1302 may communicate with and control other PCS components via network subsystem 120.

In some embodiments, temperature control module 1302 activates one or more heating elements when the PCS's temperature is below a threshold temperature, and/or adjusts the operation of the heating element(s) based on the PCS's temperature. To activate the heating element(s) and/or adjust the settings of the heating element(s), temperature control module 1302 may provide inputs to power distribution subsystem 110 to control the power provided to the heater module 1330, thereby controlling the activation and temperature(s) of the heater module's heating element(s). The power distribution subsystem 110 may provide power to the heater module 1330 via one or more heater control terminals (e.g., external solid state relays).

In some embodiments, temperature control module 1302 activates one or more fans 1360 when the PCS's temperature is above a threshold temperature, and/or adjusts the operation of the fan(s) 1360 based on the PCS's temperature. To activate the fan(s) 1360 and/or adjust the settings of the fan(s), temperature control module 1302 may provide inputs to power distribution subsystem 110 to control the power provided to the fan(s) 1360, thereby controlling the activation and speed(s) of the fan(s).

In some embodiments, if temperature control module 1302 determines that the temperature in the PCS (or in a portion thereof) is outside a safe operating range, temperature control module 1302 may deactivate the PCS (or at least one component thereof), and/or adjust the operation of the PCS (or at least one component thereof) to reduce the amount of heat being generated by the PCS (or the component(s)). For example, if the temperature control module determines that the temperature of the PCS, the display compartment 870, or either of the display modules 700 is above a safe operating range, temperature control module 1302 may deactivate or dim one or both display modules 700, thereby reducing the amount of heat generated by the display modules. To deactivate the PCS or component(s) thereof, or to reduce the heat being generated by the PCS or component(s) thereof (e.g., by dimming the display module(s) 700), temperature control module 1302 may send suitable control signals to power distribution subsystem 110.

Temperature control module 1302 may include any suitable hardware and/or software configured to control the temperature of a PCS. In some embodiments, maintenance subsystem 130 implements temperature control module 1302. For example, temperature control module 1302 may include software executing on one or more processing devices 400 of maintenance subsystem 130. In some embodiments, temperature control module 1302 is powered by power distribution system 110.

In some embodiments, temperature control module 1302 determines a target temperature for the interior of the PCS 100. The process of determining the target temperature may take into account the temperatures of at least some of the different compartments of the PCS 100, and/or the ambient temperature outside PCS 100. In some embodiments, the process of determining the target temperature also accounts for the power used by the PCS 100. Those skilled in the art can appreciate that when the ambient temperature around the PCS is high (e.g., on hot summer days), the PCS may use the fans to move large volumes of air to keep the PCS temperature from continuously rising. In addition, in the presence of high ambient sunlight, the displays may use substantial backlight power to make the images viewable, further increasing the temperature of the PCS. In some embodiments, the temperature control module 1302 balances the PCS's power dissipation against its temperature, so that the PCS's temperature and power dissipation remain within acceptable ranges. In some embodiments, the temperature control module 1302 uses the formula $Tt=[P(e^{Ta})+10]$ to calculate the target temperature Tt in degrees Celsius, where Ta is the ambient temperature (for Ta>1) in degrees Celsius, and P is a power factor. In some embodiments, the power factor P equals 12.21. Applying the power factor P to the above formula may allow the temperature in the PCS 100 to rise to a safe equilibrium when ambient temperatures are at average or below average levels, while conserving (e.g., minimizing) consumption of power by the fans. When ambient temperatures are at above average levels, temperature control module 1302 may increase fan power until the fan(s) 1360 reach their maximum speed, and techniques described above may be used to further reduce the temperature in PCS 100.

Techniques for Servicing a Display Subsystem of a PCS

Those skilled in the art can appreciate that it may be beneficial for the PCS 100 (or portions thereof) to be field serviceable. Field serviceability may decrease the time and expense associated with repairing and maintaining the PCS, thereby decreasing any inconvenience to users or passers-by and increasing the PCS's profitability. Features that facilitate field servicing of the PCS display module(s) 700 may be particularly beneficial. The PCS display module(s) 700 may be heavy (e.g., 40-100 pounds or more) and may be located relatively high above the PCS's base (e.g., the top of a display module may be approximately 10 feet or more above the PCS's base). Naive approaches to servicing the display module(s) (e.g., using ladders or scaffolding) may pose significant problems. For example, some PCS s may be located on busy city streets where ladders are prohibited. The construction and use of scaffolding may be time-consuming and costly, and may require the presence of a police officer. Thus, there is a need for techniques for quickly and efficiently servicing the display subsystem of a PCS.

Figure 18:
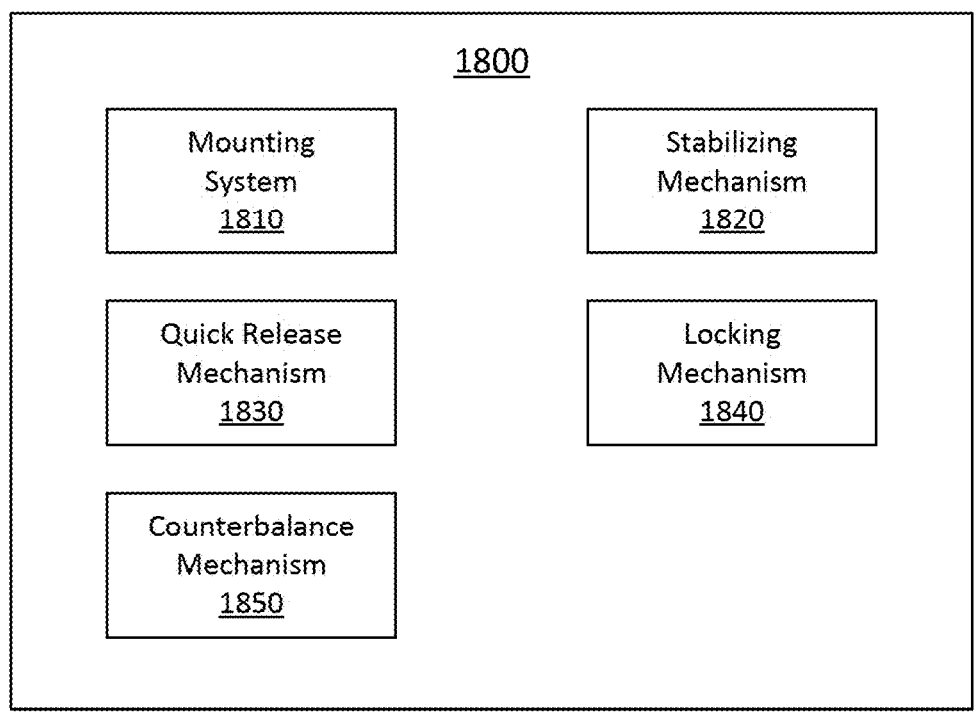
FIG. 18 shows a block diagram of a system for servicing a display subsystem of a PCS, in accordance with some embodiments.

According to an aspect of the present disclosure, a system for servicing a display subsystem 170 of a personal communication structure (PCS) 100 is provided. Referring to FIG. 18, in some embodiments a system 1800 for servicing a display subsystem includes a mounting system 1810, stabilizing mechanism 1820, quick-release mechanism 1830, locking mechanism 1840, and/or counterbalance mechanism 1850. The system 1800 may facilitate lowering of a display module 700 to street level, where the display module can be quickly removed, carried away, and replaced. Mounting system 1810 may include components for mounting one or more display modules 700 to a PCS 100. Stabilizing mechanism 1820 may prevent mounting system 1810 and display module 700 from moving when the mounting system (or display module) is in a "servicing" position. Quick-release mechanism 1830 may releasably connect mounting system 1810 to a display module 700 or to a frame 1000 of the PCS 100. Locking mechanism 1840 may lock the display module 700 in a closed position for normal PCS operation. Counterbalance mechanism 1850 may support a display module 700 relative to the frame 1000 of the PCS 100, which may facilitate movement of the display module 700 between the closed and servicing positions. The components of servicing system 1800 are described in further detail below.

Figure 19A:
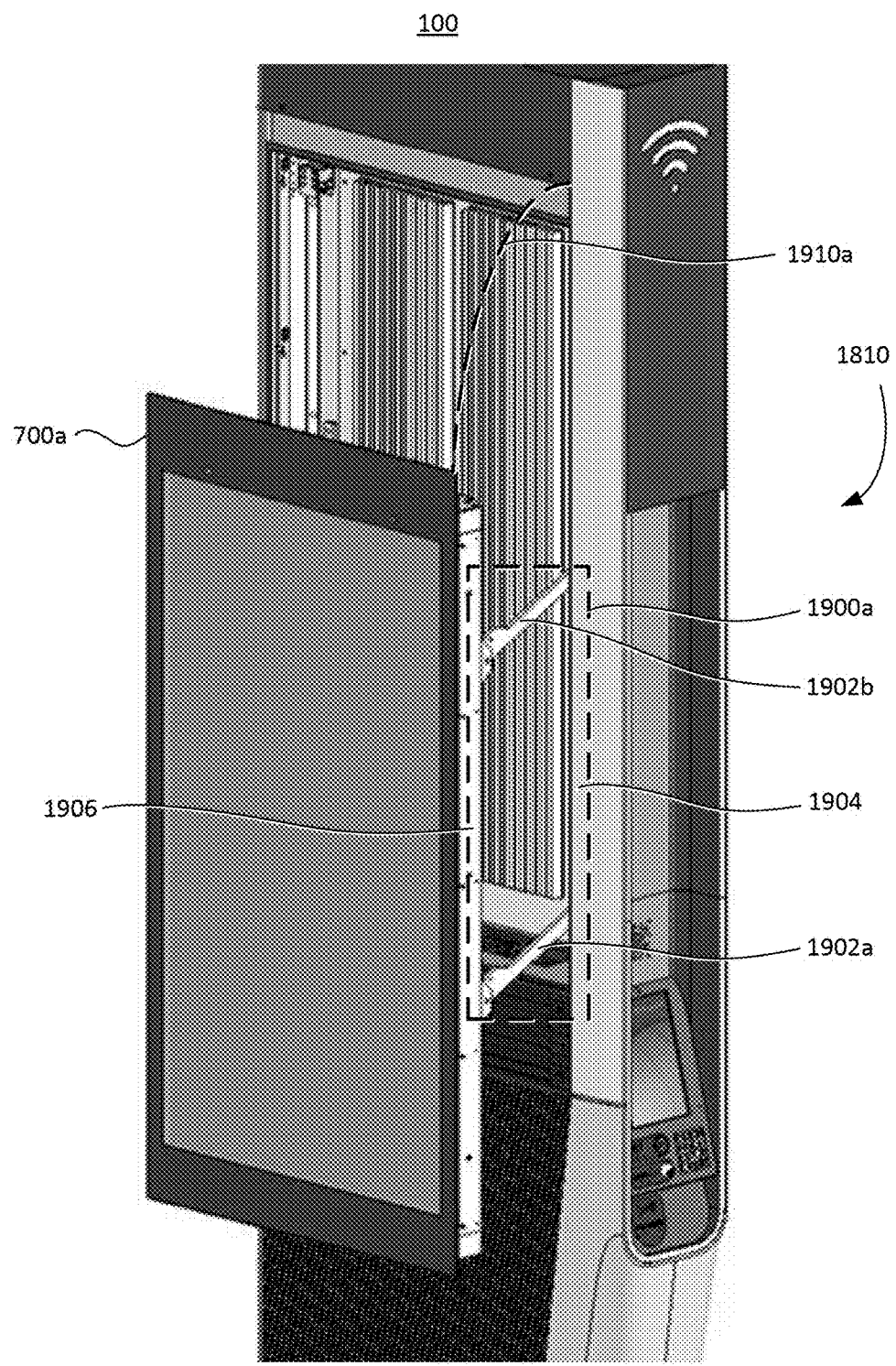
FIGS. 19A and 19B show, respectively, a perspective view and a side view of a display mounting system, in accordance with some embodiments.
Figure 19B:
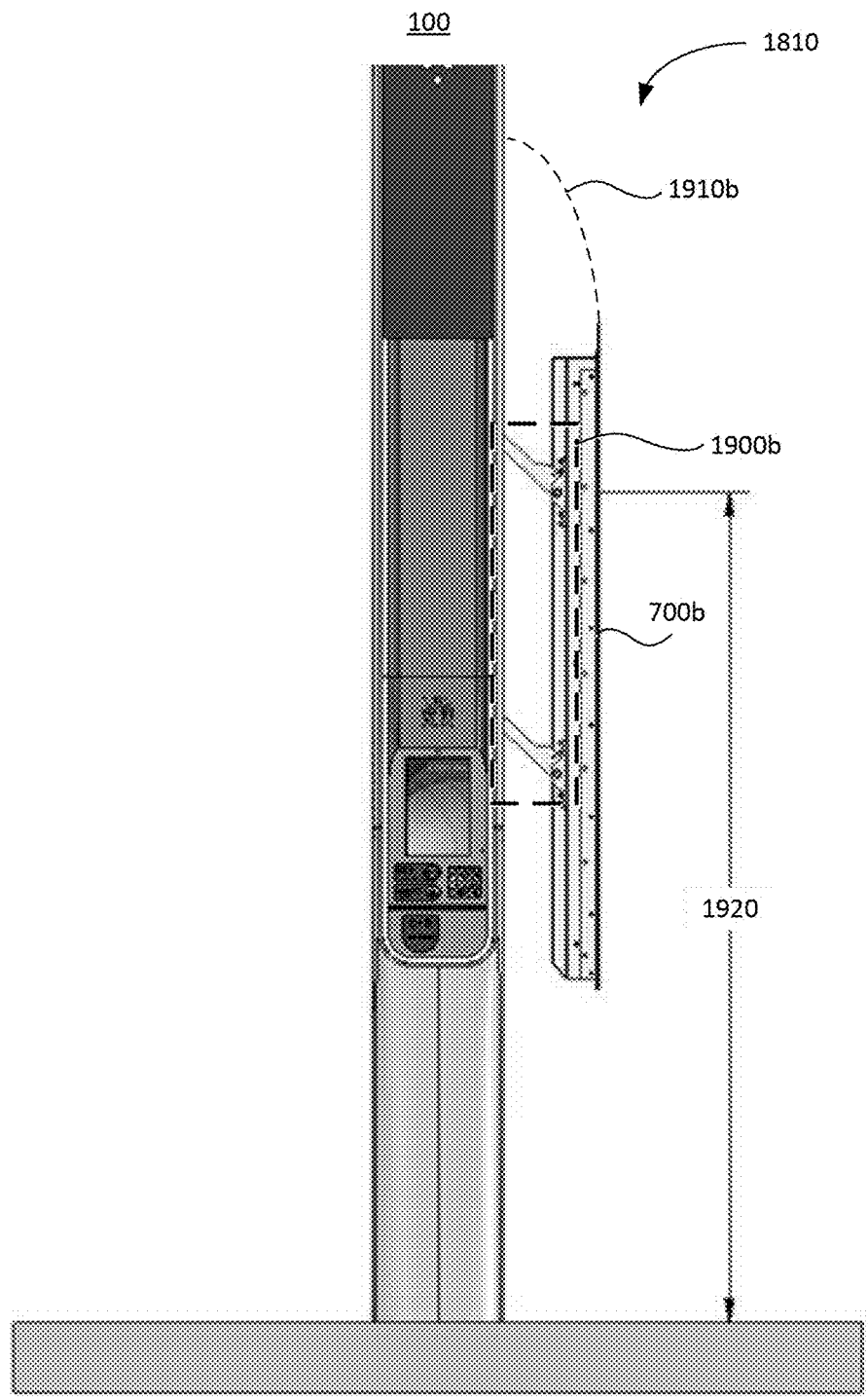

Referring to FIGS. 19A and 19B, a mounting system 1810 may include a plurality of four-bar linkages 1900 (e.g., two four-bar linkages) coupling each display module 700 to the PCS's frame. In the example of FIG. 19A, the mounting system 1810 includes a four-bar linkage 1900a coupling one side of display module 700a to the PCS's frame, and a second four-bar linkage (not visible in the view of FIG. 19A) arranged in parallel to four-bar linkage 1900a and coupling the opposite side of display module 700a to the PCS's frame. In some embodiments, the rotation of these four-bar linkages causes display module 700a to move along a generally arcuate path 1910a between a closed position and a servicing position (e.g., a lowered servicing position), while keeping the display module 700a in a substantially vertical orientation. The closed position may be the position illustrated in FIG. 9A, in which display compartment 870 is closed (e.g., inaccessible from the exterior of the PCS). In some embodiments, the servicing position includes any position in which display compartment 870 is open (e.g., accessible from the exterior of the PCS), including (but not limited to) the position illustrated in FIG. 19A. In some embodiments, the servicing position is a position in which display compartment 870 is open and the mounting system 1850 is stabilized to prevent further movement of the display module 700a toward the base of the PCS. This stabilization may prevent the module 700a from being damaged when it is lowered and keep it in the servicing position, so it can be removed by service personnel.

In the example of FIG. 19B, mounting system 1810 further includes a third four-bar linkage 1900b coupling one side of display module 700b to the PCS's frame, and a fourth four-bar linkage (not visible in the view of FIG. 19B) arranged in parallel to the four-bar linkage 1900b and coupling the opposite side of display module 700b to the PCS's frame. In some embodiments, the rotation of these four-bar linkages causes display module 700b to move along a generally arcuate path 1910b between a closed position and a servicing position, while keeping the display module 700b in a substantially vertical orientation.

Figure 20B:
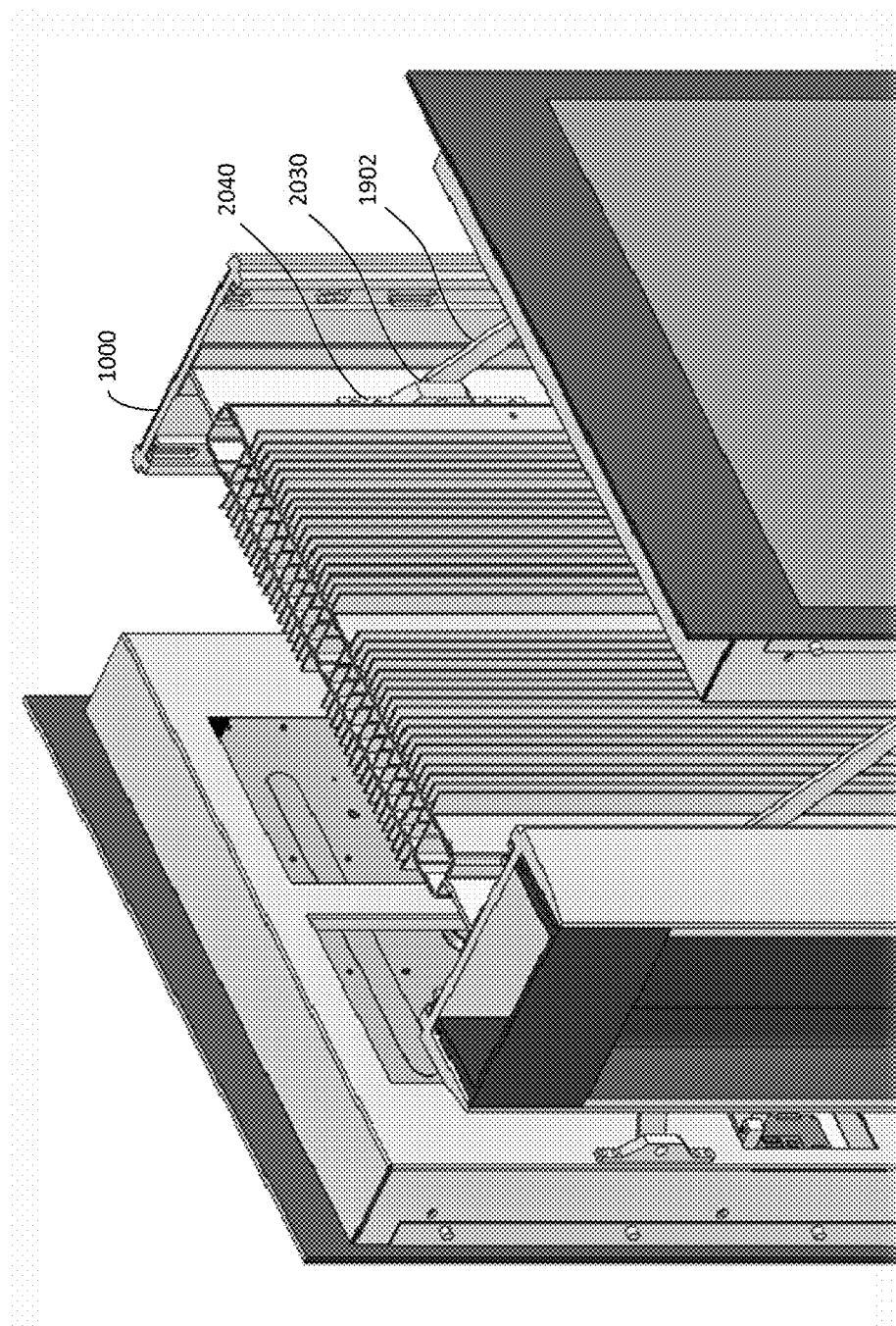

In some embodiments, a four-bar linkage 1900 includes two links (a lower link 1902a and an upper link 1902b), a portion 1904 of the PCS's frame 1000 coupled between the links, and a portion 1906 of the display module's housing frame 1602 coupled between the links. Referring to FIG. 20A, a four-bar linkage 1900 may further include two connectors 2020 coupled to the display module's housing frame 1602 and coupled to respective links 1902 by respective pin joints 2010. Referring to FIG. 20B, a four-bar linkage 1900 may further include two connectors 2040 coupled to the PCS's frame 1000 and coupled to respective links 1902 by respective pin joints 2030.

In some embodiments, each of the mounting system's four-bar linkages is a substantially planar four-bar linkage. In some embodiments, each of the substantially planar four-bar linkages forms a parallelogram linkage system.

In some embodiments, when a display module is in the servicing position, the height 1920 (e.g., height above the base of the PCS) of the pin joint 2010 coupling the upper link 1902 of a four-bar linkage 1900 to the display module 700 may be between approximately four feet and approximately eight feet, between approximately five feet and approximately seven feet, between five feet and approximately six feet, or equal to approximately 70 inches. Lowering this pin joint to such a height may facilitate disconnection of the display module 700 from the upper link 1902 by a person of average height without the aid of a ladder. One or more of the pin joints may include a suitable quick-release mechanism, to facilitate pin removal without the use of any tools, as discussed below.

Figure 21B:
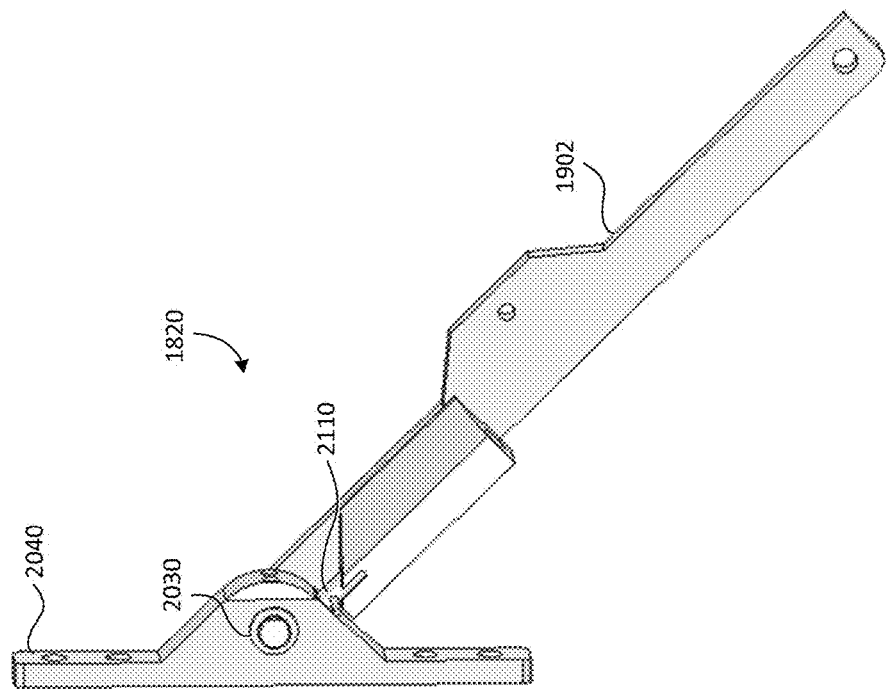
FIGS. 21A and 21B show, respectively, a side view and a perspective view of a portion of a linkage of a display mounting system, in accordance with some embodiments.
Figure 21A:
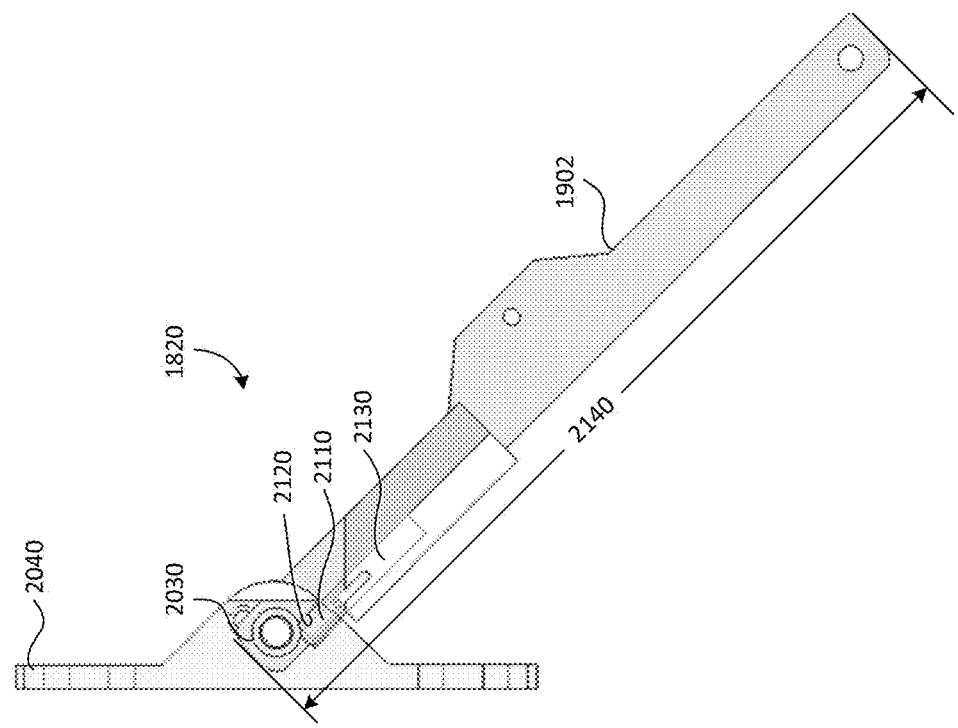

Referring to FIGS. 21A and 21B, a servicing system 1800 may include one or more stabilizing mechanisms 1820. The stabilizing mechanism(s) may be engaged to prevent the mounting system 1810 from moving when it is in the servicing position, and may be disengaged to permit the mounting system 1810 to move between the servicing position and the closed position. In some embodiments, the stabilizing mechanism(s) 1820 prevent the mounting system 1810 from moving by preventing one or more four-bar linkages 1900 of mounting system 1810 from rotating. In some embodiments, engaging the stabilizing mechanism(s) 1820 may oppose or prevent twisting of the four-bar linkages 1900 (e.g., out-of-plane twisting of planar four-bar linkages).

In some embodiments, a stabilizing mechanism 1820 includes a pin 2110 movably coupled to a link 1902, and an aperture 2120 formed in a connector 2040 coupling the link 1902 to the PCS's frame 1000. Inserting at least a portion of the movable pin 2110 into the aperture 2120 may prevent the link 1902 from rotating about pin joint 2030 relative to PCS frame 1000, and/or may oppose twisting of the four-bar linkages 1900. Retracting the movable pin 2110 from the aperture 2120 may permit the link 1902 to rotate about pin joint 2030.

In some embodiments, movable pin 2110 is movably attached to link 1902 by a retaining member 2130. The retaining member may include, without limitation, a groove in mechanical communication with a ridge on the movable pin 2110, a sleeve partially enclosing the movable pin 2110, or any other suitable mechanism that permits pin 2110 to move but constrains the pin's movement and maintains a coupling between the pin and the link 1902.

In some embodiments, movable pin 2110 is biased toward aperture 2120. In such embodiments, an end portion of movable pin 2110 may automatically slide into aperture 2120 when movable pin 2110 is aligned with aperture 2120 (e.g., when link 1902 is in the servicing position). Movable pin 2110 may be biased toward the aperture 2120 by a spring, a pair of magnets, and/or any other suitable bias mechanism.

As described above, a mounting system 1810 for a display module 700 may include two four-bar linkages, which may include two upper links 1902*b* coupled to PCS frame 1000 at respective connectors 2040, and two lower links 1902*a* coupled to PCS frame 1000 at respective connectors 2040. There may be stabilizing mechanisms disposed at each of the four joints coupling a link 1902 to a connector 2040, at each of the two joints coupling a lower link 1902*a* to a connector 2040, at either of the joints coupling a lower link 1902*a* to a connector 2040, or at any other suitable single or combination of the joints coupling links 1902 to respective connectors 2040. Arranging the stabilizing mechanisms 1820 only at one or both of the joints coupling a lower link 1902*a* to a connector 2040 may facilitate manual disengagement of the stabilizing mechanism(s) by one or two service workers without the aid of a ladder.

Figure 21C:
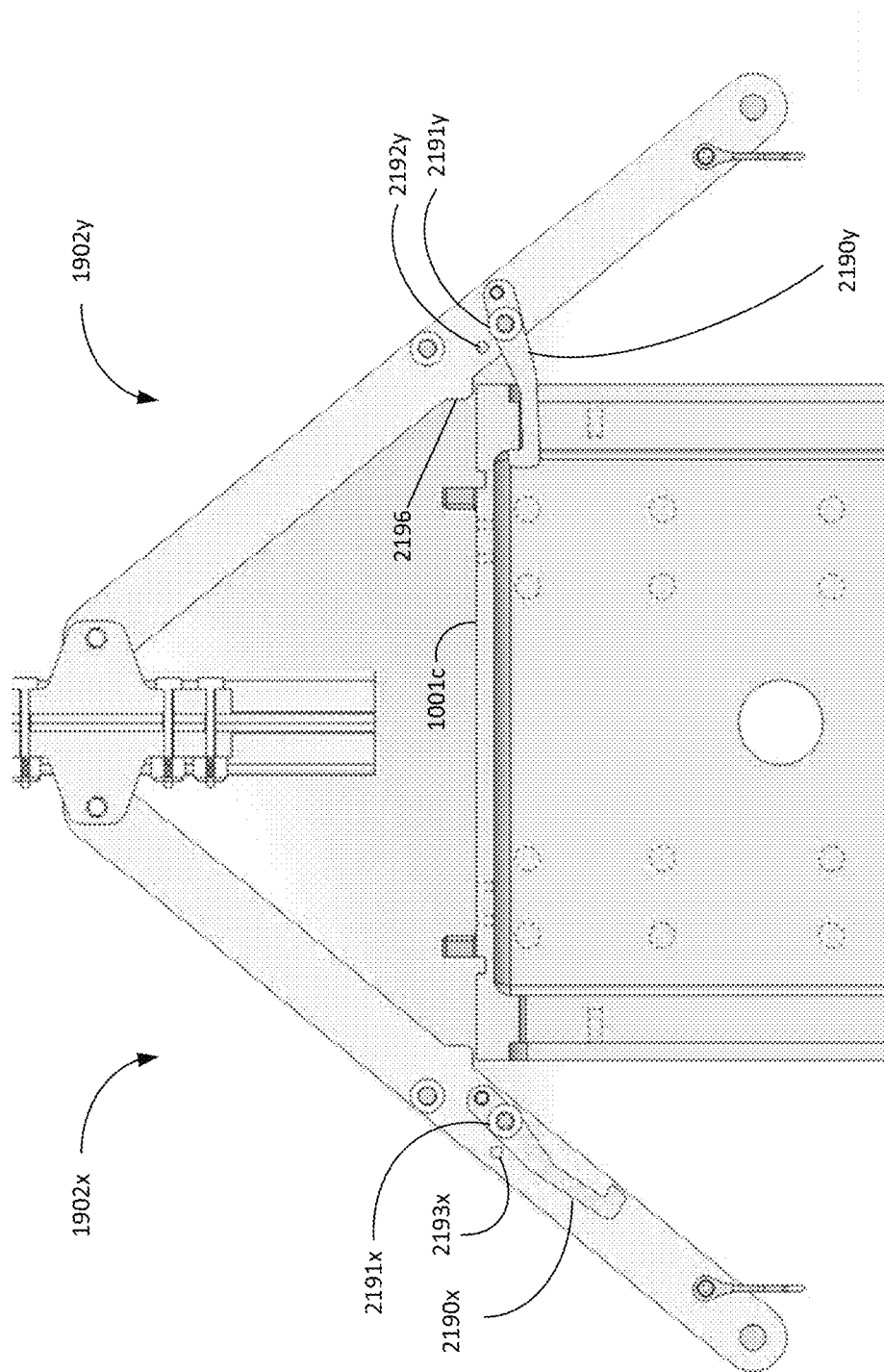
FIG. 21C shows a side view of a portion of a display mounting system, in accordance with some embodiments.

In some embodiments, the stabilizing mechanism 1820 includes a latch 2190. FIG. 21C shows two lower links 1902, each of which is coupled to a corresponding latch 2190. In FIG. 21C, the latch 2190*x* is shown in an unlatched position, and the latch 2190*y* is shown in a latched position. In some embodiments, when the latch 2190 is in the latched position, the latch releasably fastens the link 1902 to the PCS 100 (e.g., to the cross-frame member 1001*c* of the PCS frame 1001, to the air intake assembly 967, to the air intake compartment 865, or to any other suitable portion of the PCS). In some embodiments, engaging the latch 2190 may prevent the link 1902 (and the linkage 1900 and the mounting system 1810) from moving out of the servicing position. In some embodiments, the latch 2190 may be disengaged to permit the link 1902, linkage 1900, and mounting system 1810 to move between the servicing position and the closed position.

In some embodiments, the latch 2190*x* is held in the unlatched position by inserting a spring-loaded plunger 2191*x* into an aperture 2192*x* (not visible in FIG. 21C), and the latch 2190*y* is held in the latched position by inserting a spring-loaded plunger 2191*y* into an aperture 2193*y* (not visible in FIG. 21C). Now referring to FIG. 21D, when the pin 2194 of the spring loaded plunger 2191 is retracted (e.g., by pulling the spring-loaded plunger's ring 2195), the plunger 2191 may be permitted to move between the latched and unlatched positions. Other mechanisms for holding a latch 2190 in latched and unlatched positions, and for releasing a latch, are possible.

Returning to FIG. 21C, in some embodiments a link 1902 may have a protrusion 2196, which may contact the PCS 100 when the mounting system 1810 is in the servicing position. For example, the protrusion 2196 may contact the cross-frame member 1001*c* of the PCS frame 1001, the air intake assembly 967, the air intake compartment 865, or any other suitable portion of the PCS 100. In some embodiments, the portion of the PCS 100 contacted by the protrusion 2196 may provide load-bearing support to the mounting system 1810 when the mounting system is in the servicing position. In some embodiments, the protrusion 2196 may protect the link 1902 and the contacted portion of the PCS 100 from each other, so that the link 1902 does not wear down an edge of the PCS 100, and the PCS does not wear down an edge of the link. Thus, the protrusion 2196 may enhance the durability of the PCS 100 and the mounting system 1810.

In some embodiments, the length 2140 of the links 1902 may be between approximately 8 inches and approximately 16 inches, between approximately 10 inches and approximately 14 inches, or equal to approximately 12 inches.

Returning to FIG. 18, in some embodiments servicing system 1800 includes one or more quick-release mechanisms 1830 coupling the display module(s) 700 to the PCS 100. The use of quick-release mechanisms may facilitate coupling of the display module 700 to the PCS 100 during installation of the display module, and de-coupling of the display module 700 from the PCS 100 during servicing or replacement of the display module.

Referring to FIG. 20A, in some embodiments the pin joints 2010 coupling the links 1902 to the display module 700 at the connectors 2020 are secured by quick-release mechanisms 1830. Referring to FIG. 20B, in some embodiments the pin joints 2030 coupling the links 1902 to the PCS frame 1000 at the connectors 2040 are secured by quick-release mechanisms 1830.

Figure 21D:
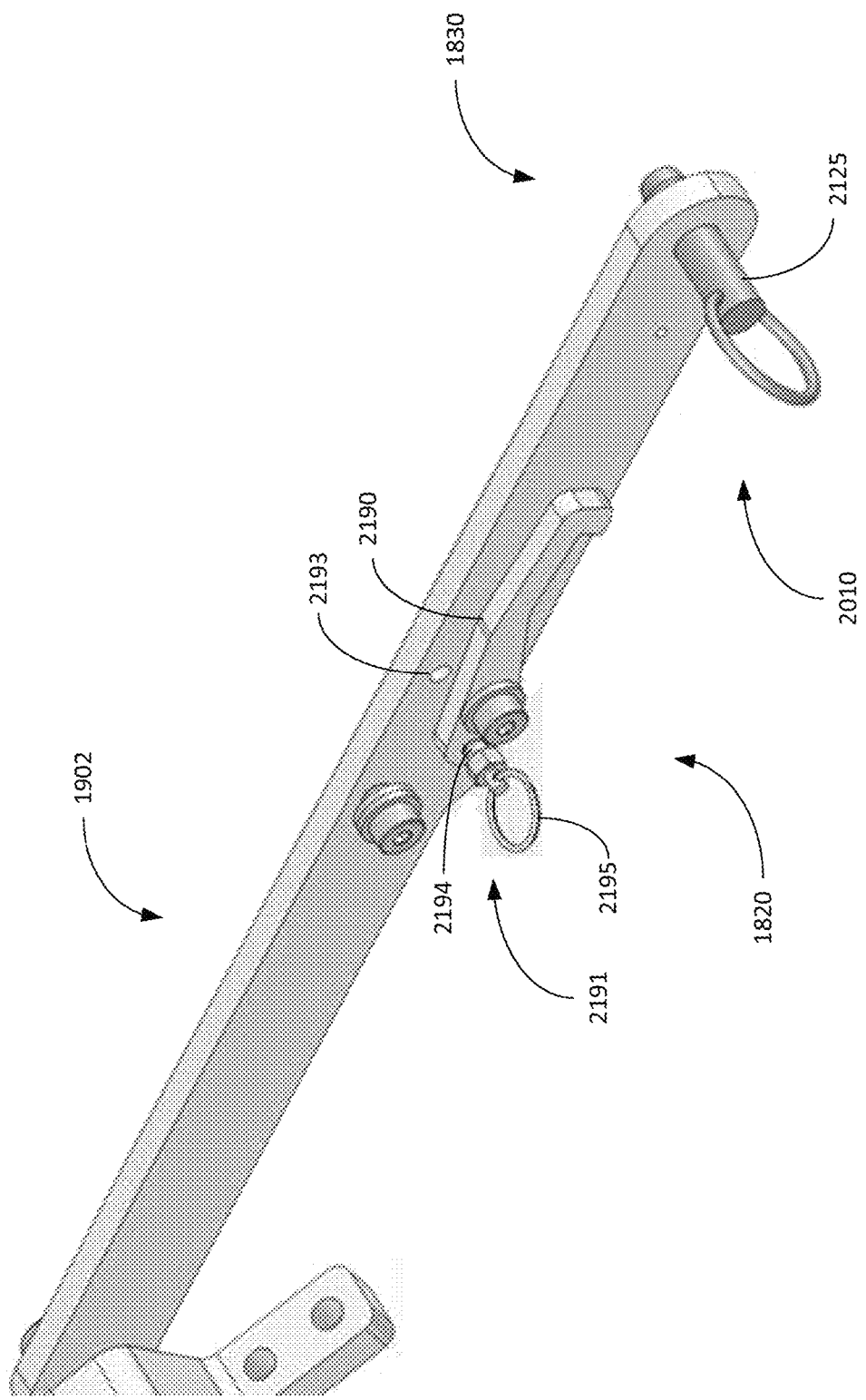
FIG. 21D shows a perspective view of a portion of a linkage of a display mounting system, in accordance with some embodiments.

In some embodiments, quick-release mechanism 1830 includes a pin (e.g., the pin that forms pin joint 2010 or 2030) with threads at one end and a lever-operated cam assembly at the other end. The level-operated cam assembly may be used to tighten or loosen a nut on the threaded end of the pin. In some embodiments, quick-release mechanism 1830 includes a push-pull pin, a positive-locking pin (e.g., a cotter pin), or any other suitable mechanism that releasably secures a display module 700 to PCS 100. In some embodiments, the quick-release mechanism 1830 includes a detent pin (e.g., the pin that forms pin joint 2010 or 2030) that attaches the link 1902 to the display module 700 or to the connector 2040. FIG. 21D illustrates a detent pin 2125 that forms the pin joint 2010 that attaches the link 1902 to the display module 700, according to some embodiments.

Returning to FIG. 18, in some embodiments servicing system 1800 includes one or more locking mechanisms 1840. FIG. 22 shows a cut-away perspective view of a locking mechanism 1840 of display compartment 870, according to some embodiments. In some embodiments, locking mechanism 1840 includes a lock 2210 and an actuator 2206. The lock 2210 may include a connector 2212 (e.g., a pin) coupled to the housing of display module 700, and a mating interlocking connector 2214 (e.g., an L-shaped receptacle) formed in a retention member 2218 of PCS 100. The actuator 2206 may be operable to disengage lock 2210 by moving retention member 2218 such that connector 2212 is released from mating interlocking connector 2214 (e.g., by moving retention member 2218 toward the PCS's base). The operation of lock 2210 and actuator 2206 are described in more detail below, with reference to FIGS. 23A and 23B.

Figure 23A:
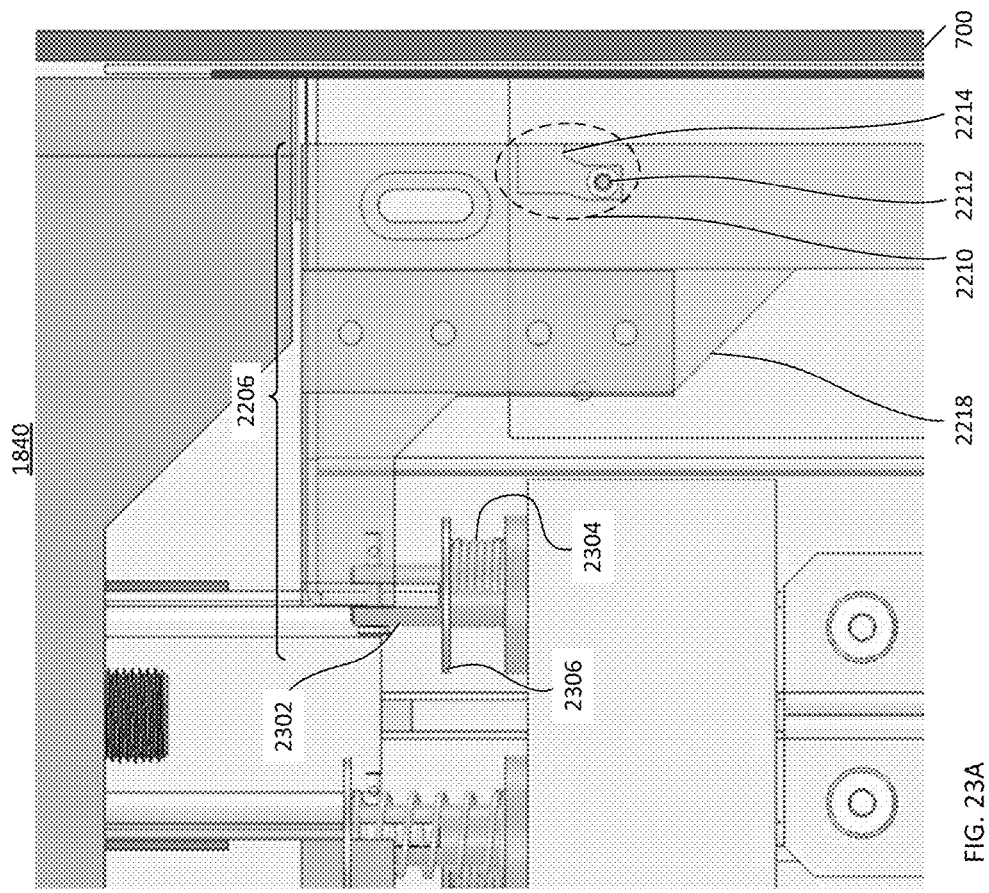
FIGS. 23A and 23B show side views of a locking mechanism of a display compartment with the lock engaged (FIG. 23A) and disengaged (FIG. 23B), in accordance with some embodiments.

FIG. 23A shows a cross-sectional view of locking mechanism 1840 of display compartment 870 with the lock 2210 engaged and the mounting system in the closed position, according to some embodiments. In some embodiments, lock 2210 is engaged by positioning connector 2212 within mating interlocking connector 2214, such that mating interlocking connector 2214 prevents connector 2212 from moving laterally. As can be seen, when lock 2210 is engaged, the mounting system holds display module 700 in the closed position. In some embodiments, actuator 2206 is operable to disengage lock 2210 by retracting a pin 2302 into an aperture of a spool 2306, thereby moving mating interlocking connector 2214 downward such that connector 2212 can move laterally toward the exterior of the PCS 100. In some embodiments, actuator 2206 includes a bias member 2304 (e.g., a spring) that biases lock 2210 toward the engaged position.

Actuator 2206 may be controlled by an access control device, which may control actuator 2206 to disengage lock 2210 when valid authentication information is provided by a user. The control mechanism by which the access control device controls actuator 2206 to disengage (or "release") lock 2210 may be a lever, a cam, a solenoid, a motor with drive gear, any suitable combination thereof, or any other suitable control mechanism.

Figure 23B:
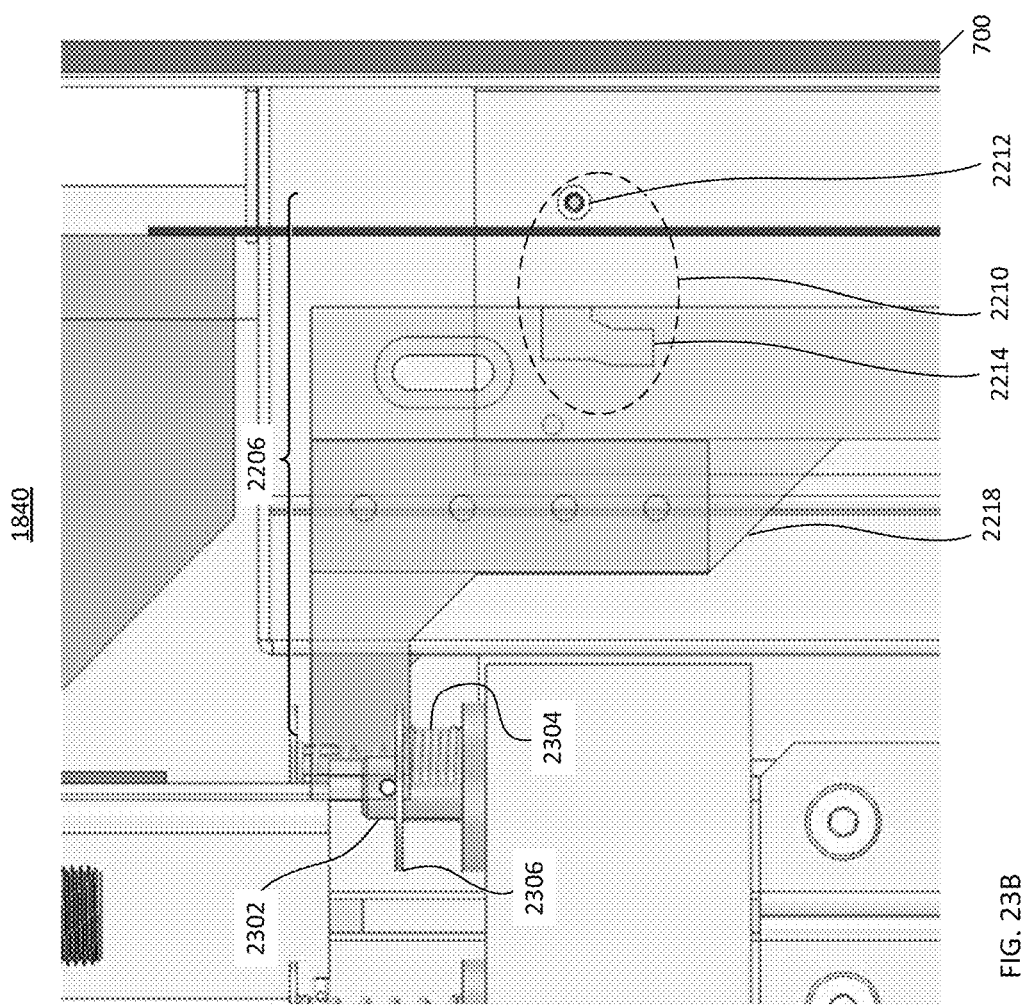

FIG. 23B shows a cross-sectional view of locking mechanism 1840 of display compartment 870 with the lock 2210 disengaged and the mounting system in the open position, according to some embodiments. In the example of FIG. 23B, pin 2302 has been retracted, thereby causing retention member 2218 and mating interlocking connector 2214 to move downward, thereby releasing connector 2212 to move laterally toward the exterior of PCS 100. An embodiment has been described in which locking mechanism 1840 includes a connector 2212 and a mating interlocking connector 2214. In some embodiments, locking mechanism 1840 includes multiple pairs of connectors and mating interlocking connectors. The connectors may be arranged around a periphery of display module 700, and the mating interlocking connectors may be arranged around a periphery of display compartment 870. For example, retention member 2218 may include one or more mating interlocking connectors, and a second retention member disposed on the opposite side of display module 700 may also include one or more mating interlocking connectors. In some embodiments, one or more of the connectors 2212 may include respective pin joints 2030 of the mounting system 1810. In some embodiments, the connectors 2212 may be disposed on the retention members 2218, and the mating interlocking connectors 2214 may be disposed on the display module 700.

Figure 24:
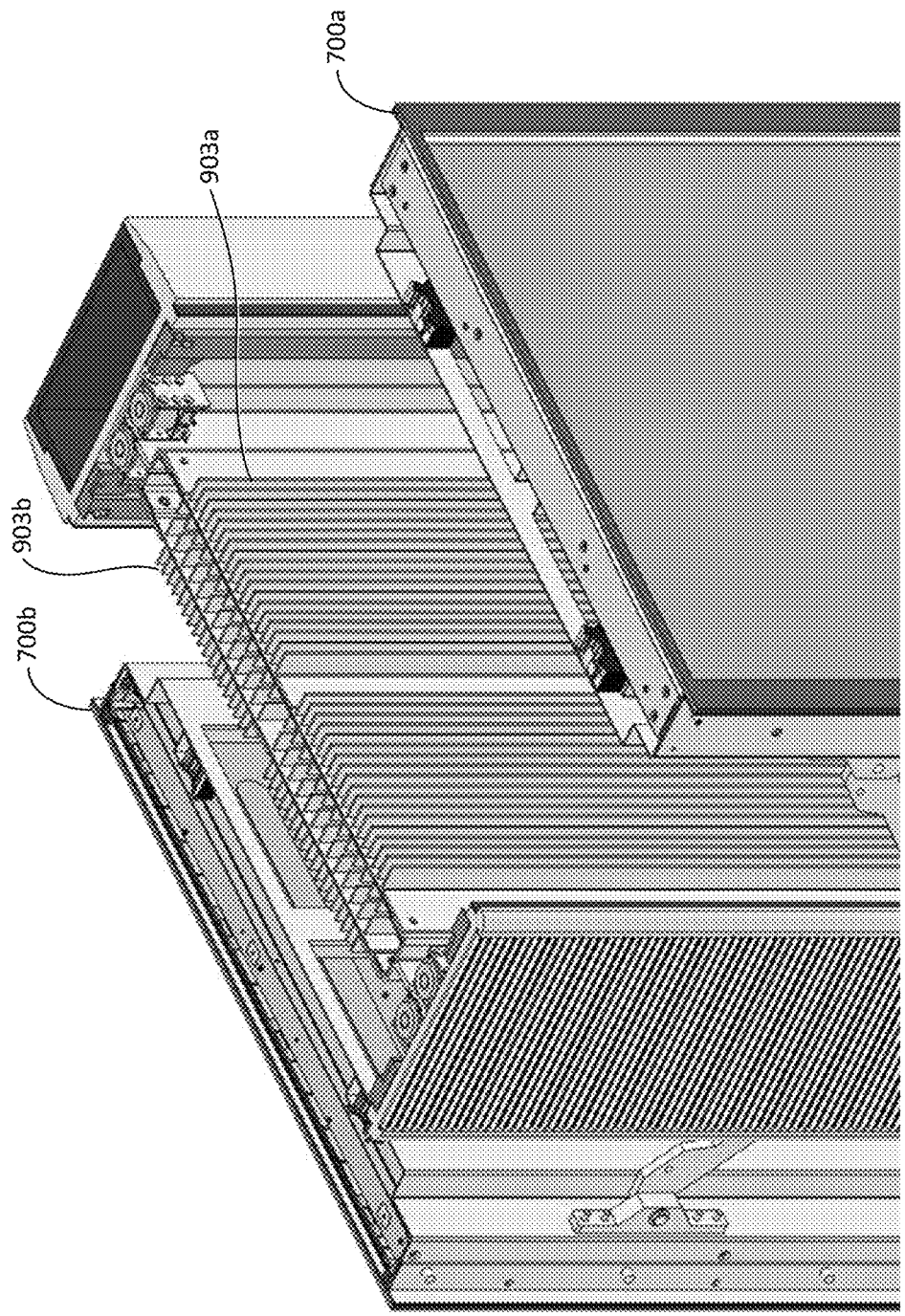
FIG. 24 shows a perspective view of a display subsystem of a PCS, in accordance with some embodiments.

As can be seen in FIG. 24, PCS 100 may include two display modules 700 facing in opposite directions. In such embodiments, either or both display modules may be equipped with locking mechanisms 1840 that operate in conjunction or independently.

Returning to FIG. 18, in some embodiments servicing system 1800 includes one or more counter-balance mechanisms 1850, which may support the display module(s) 700 relative to the PCS frame 1000, thereby facilitating movement of the display module(s) 700 between the closed and servicing positions. It can be appreciated that the display module in some embodiments weighs more than 100 pounds (e.g., approximately 130 pounds). The counter-balance mechanism 1850 may prevent the display module from becoming a safety hazard when being serviced.

Figure 25A:
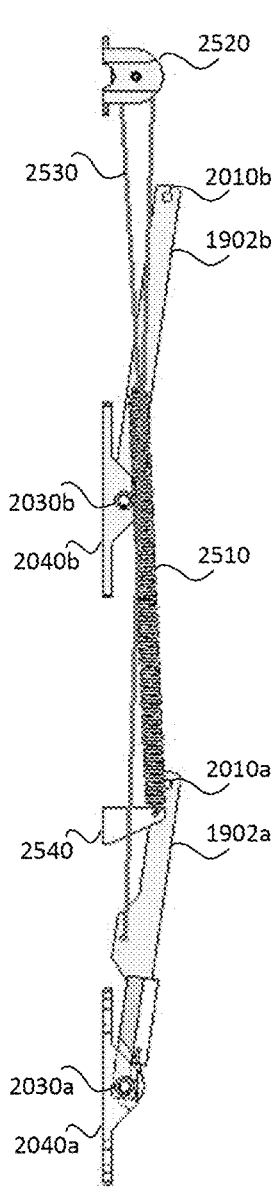
FIGS. 25A and 25C show side views of a counterbalance mechanism of a servicing system in a closed position, in accordance with some embodiments.
Figure 25B:
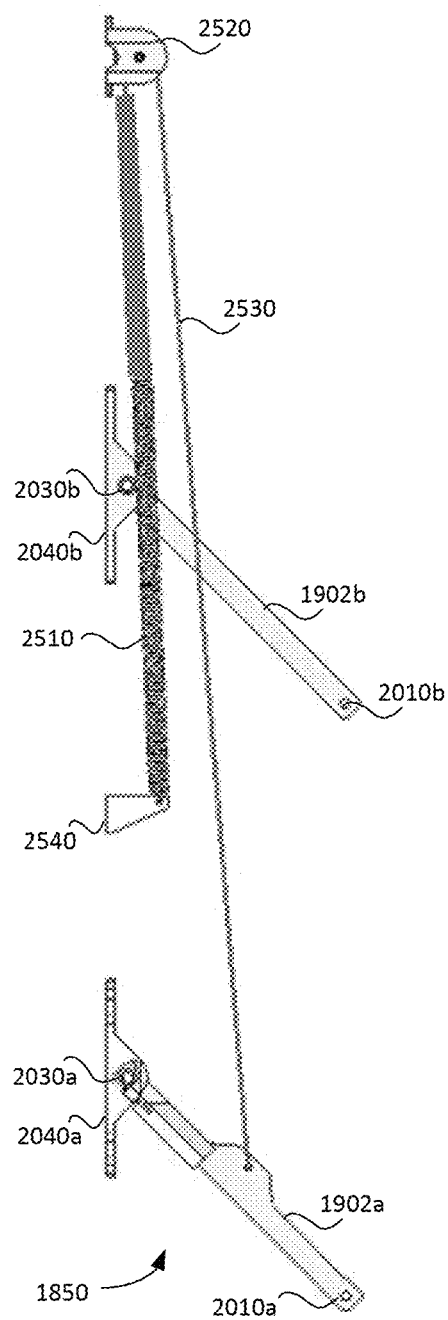
FIG. 25B shows a side view of a counterbalance mechanism of a servicing system in a servicing position, in accordance with some embodiments.

Referring to FIGS. 25A and 25B, in some embodiments, a counterbalance mechanism 1850 includes a counterbalance member 2510, a pulley 2520, and a cable 2530. One end of cable 2530 may be coupled to the counterbalance member 2510, and the other end of cable 2530 may be coupled to the mounting system 1810, with an intermediate portion of cable 2530 supported by pulley 2520. The counterbalance member 2510 may exert a force on cable 2530 that opposes a force exerted on cable 2530 by the mounting system 1810 due to the weight of the display module. Thus, counterbalance member 2510 may permit a service worker to move a display module 700 coupled to mounting system 1810 between the open and servicing positions by exerting relatively small forces on the display module.

In some embodiments, counterbalance member 2510 includes a spring and/or a counterweight. In embodiments in which counterbalance member 2510 includes a spring, one end of the spring may be coupled to the PCS frame 1000 via a connector 2540. The other end of the spring may be coupled to one end of cable 2530. The connector 2540 may be disposed at any suitable location within the PCS, including, without limitation, a location between connectors 2030a and 2030b of mounting system 1810. The spring may be any suitable type of spring, including, without limitation, a coil extension spring, a torsion spring, etc. As can be seen by comparing FIGS. 25A and 25B, the extension of the spring may increase as the links 1902 of mounting system 1810 move toward the servicing position. In other embodiments, the counterbalance member 2510 may be a gas-charged cylinder, to provide both biasing and damping.

In the example of FIGS. 25A-B, the cable 2530 is coupled to lower link 1902a of the mounting system 1810. In some embodiments, the cable 2530 is coupled to upper link 1902b. In either case, the cable may be coupled to a link 1902 at any suitable location on the link 1902, including, without limitation, a location approximately midway between the link's pin joints 2010 and 2030.

In some embodiments, servicing system 1800 may include multiple counterbalance mechanisms. For example, one counterbalance mechanism 1850 may be coupled to a four-bar linkage 1900 on one side of a display module 700, and another counterbalance mechanism 1850 may be coupled to another four-bar linkage 1900 on the other side of the display module 700. As another example, one counterbalance mechanism 1850 may be coupled to an upper link 1902b of a four-bar linkage 1900, and another counterbalance mechanism 1850 may be coupled to a lower link 1902a of the same four-bar linkage. As yet another example, one or more first counterbalance mechanisms 1850 may be coupled to one or more first four-bar linkages 1900 coupled to a first display module 700, and one or more second counterbalance mechanisms 1850 may be coupled to one or more second four-bar linkages 1900 coupled to a second display module 700.

Figure 25C:
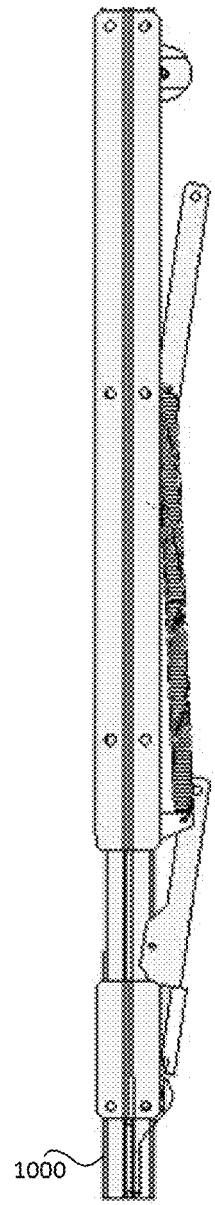
Figure 26A:
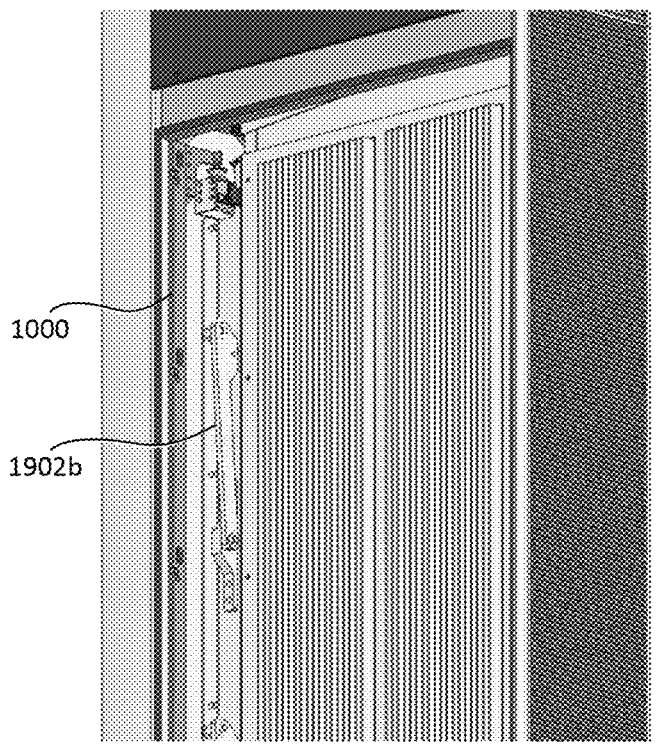
FIGS. 26A and 26B show perspective views of upper and lower portions, respectively, of a servicing system, in accordance with some embodiments.
Figure 26B:
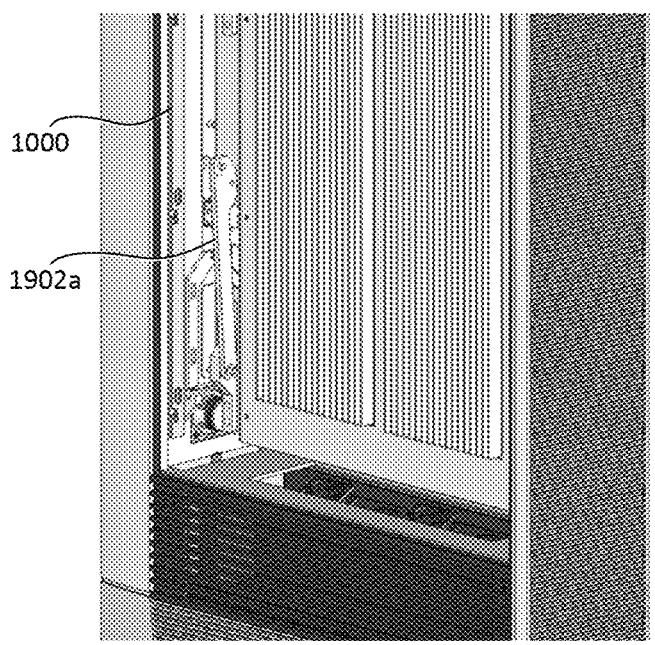

FIGS. 25C, 26A, and 26B show how components of servicing system 1800 may be arranged in compact relation to the frame 1000 of PCS 100, in accordance with some embodiments.

Further Description of Some Embodiments

Embodiments have been described in which a temperature control subsystem 160 performs temperature control processes for a PCS 100. The various temperature control processes described herein can be performed using software that is executable on one or more processors (e.g., processor(s) 400, 600, and/or 710) that employ one of a variety of operating systems or platforms. Additionally, such software can be written using any of a number of suitable programming languages and/or programming or scripting tools, and also can be compiled as executable machine language code or intermediate code that is executed on a framework or virtual machine. Also, the acts performed as part of the techniques described herein can be performed in any suitable order.

In this respect, the temperature control techniques can be embodied as a computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement the various techniques discussed above. The computer readable medium or media can be non-transitory. The computer readable medium or media can be transportable, such that the program or programs stored thereon can be loaded onto one or more different computers or other processors to implement various aspects of the present invention as discussed above. The terms "program" or "software" are used herein in a generic sense to refer to computer code or set of computer-executable instructions that can be employed to program a computer or other processor to implement various aspects described in the present disclosure. Additionally, it should be appreciated that according to one aspect of this disclosure, one or more computer programs that when executed perform techniques described herein need not reside on a single computer or processor, but can be distributed in a modular fashion amongst a number of different computers or processors to implement various aspects of the present invention.

Computer-executable instructions can be in many forms, such as program modules, executed by one or more computers or other devices. Generally, program modules include routines, programs, objects, components, data structures, etc. that perform particular tasks or implement particular abstract data types. Typically the functionality of the program modules can be combined or distributed as desired in various embodiments.

Also, data structures can be stored in computer-readable media in any suitable form. For simplicity of illustration, data structures can be shown to have fields that are related through location in the data structure. Such relationships can likewise be achieved by assigning storage for the fields with locations in a computer-readable medium that conveys relationship between the fields. However, any suitable mechanism can be used to establish a relationship between information in fields of a data structure, including through the use of pointers, tags or other mechanisms that establish a relationship between data elements.

In some embodiments the technique(s) can be implemented as computer instructions stored in portions of a computer's random access memory to provide control logic that affects the processes described above. In such an embodiment, the program can be written in any one of a number of high-level languages, such as FORTRAN, PASCAL, C, C++, C#, Java, JavaScript, Tcl, or BASIC. Further, the program can be written in a script, macro, or functionality embedded in commercially available software, such as EXCEL or VISUAL BASIC. Additionally, the software can be implemented in an assembly language directed to a microprocessor resident on a computer. For example, the software can be implemented in Intel 80x86 assembly language if it is configured to run on an IBM PC or PC clone. The software can be embedded on an article of manufacture including, but not limited to, "computer-readable program means" such as a floppy disk, a hard disk, an optical disk, a magnetic tape, a PROM, an EPROM, or CD-ROM.

Embodiments have been described in which various aspects of the techniques described herein are applied to a personal communication structure (PCS). In some embodiments, aspects of the techniques described herein may be applied to any suitable structure including, without limitation, a kiosk (e.g., an interactive kiosk), pay station (e.g., parking pay station), automated teller machine (ATM), article of street furniture (e.g., mailbox, bench, traffic barrier, bollard, telephone booth, streetlamp, traffic signal, traffic sign, public transit sign, public transit shelter, taxi stand, public lavatory, fountain, watering trough, memorial, sculpture, waste receptacle, fire hydrant, vending machine, utility pole, etc.), etc.

Various aspects of the present disclosure can be used alone, in combination, or in a variety of arrangements not specifically described in the foregoing, and the invention is therefore not limited in its application to the details and arrangement of components set forth in the foregoing description or illustrated in the drawings. For example, aspects described in one embodiment can be combined in a suitable manner with aspects described in other embodiments.

TERMINOLOGY

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

EQUIVALENTS

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A personal communication structure (PCS) comprising:
   a PCS frame;
   a housing coupled to the PCS frame, the housing enclosing a display panel in a cavity; and
   a temperature control system for controlling a temperature within the PCS, the temperature control system comprising:
      a ribbed heat sink coupled to the PCS frame, the heat sink being disposed adjacent to a back surface of the housing, a first portion of the heat sink comprising a first plurality of fins extending into the cavity, and a second portion of the heat sink comprising a second plurality of fins disposed outside the cavity,
      a first air circulation controller configured to recirculate air across the first plurality of fins in the cavity, and
      a second air circulation controller configured to move ambient air across the second plurality of fins of the heat sink.

2. The PCS of claim 1, wherein the PCS frame comprises aluminum.

3. The PCS of claim 1, wherein an average thermal conductivity of the PCS frame is greater than 90+/−20% Btu/(hr*° F.*ft).

4. The PCS of claim 1, wherein the heat sink is coupled to opposing sides of the PCS frame to form an I-shaped structure.

5. The PCS of claim 1, wherein the housing comprises a housing frame and a transparent covering secured to the housing frame and adjacent to a viewing surface of the display panel.

6. The PCS of claim 1, wherein the housing is airtight.

7. The PCS of claim 1, wherein the ribbed heat sink comprises a planar member and the first and second pluralities of fins.

8. The PCS of claim 7, wherein the first plurality of fins extend from the planar member toward the back surface of the housing and into the cavity.

9. The PCS of claim 7, wherein the planar member is disposed between the second plurality of fins and the back surface of the housing.

10. The PCS of claim 1, wherein the heat sink comprises aluminum.

11. The PCS of claim 1, wherein the heat sink and the frame comprise a same material.

12. The PCS of claim 1, wherein the first air circulation controller comprises at least one fan operable to recirculate air in a portion of the housing cavity between the back surface of the housing and a back surface of the display panel.

13. The PCS of claim 1, wherein the second air circulation controller comprises at least one fan operable to draw the ambient air into the PCS via at least one intake and discharge the ambient air out of the PCS via at least one exhaust.

14. The PCS of claim 13, wherein the at least one fan is further operable to draw air into a first PCS compartment from a second PCS compartment, wherein the first PCS compartment is defined at least in part by the housing, and wherein the second PCS compartment comprises at least one electronic device.

15. The PCS of claim 13, wherein the intake comprises a filter and a grill disposed below the housing.

16. The PCS of claim 13, wherein the exhaust comprises a grill disposed above the housing.

17. The PCS of claim 1, wherein recirculated air transfers heat from the display panel to the housing and wherein the housing transfers heat to the ambient air.

18. The PCS of claim 17, wherein the housing transfers heat to the heat sink, and wherein the heat sink transfers heat to the ambient air.

19. The PCS of claim 1, wherein the housing comprises a first housing, wherein the display panel comprises a first display panel, and wherein the PCS further comprises a second housing enclosing a second display panel, a portion of the heat sink being disposed between the back surface of the first housing and a back surface of the second housing.

20. The PCS of claim 19, wherein the heat sink comprises a first heat sink, and wherein the PCS further comprises a second heat sink, at least a portion of the second heat sink being disposed between the back surface of the second housing and the first heat sink.

21. The PCS of claim 19, wherein a minimum distance between the back surfaces of the first and second housings is at least 1.875+/−20% inches.

22. The PCS of claim 21, wherein the first and second display panels are arranged in a parallel configuration, wherein viewing surfaces of the first and second display panels face in opposite directions, and wherein a distance between the viewing surfaces of the first and second display panels is less than 11+/−20% inches.

23. The PCS of claim 1, wherein the temperature control system further comprises a temperature sensor and a display controller, wherein the display controller is operable to perform at least one operation selected from the group consisting of deactivating the display panel and dimming the display panel based on the temperature sensor sensing a temperature greater than a threshold temperature.

24. The PCS of claim 23, wherein the display controller is operable to continue performing the at least one operation until the sensed temperature is less than another threshold temperature.

25. The PCS of claim 1, wherein the temperature control system implements a closed loop control system controlling at least one fan.

26. The PCS of claim 25, wherein the temperature control system is operable to detect whether the fan has a fault.

27. The PCS of claim 25, wherein the temperature control system further comprises at least one vent, and wherein the temperature control system is operable to detect whether the vent is blocked.

28. The PCS of claim 25, wherein the temperature control system is operable to send a message to a remote service center, the message indicating a temperature of a PCS component or a fault condition of a PCS component.

29. The PCS of claim 25, wherein the temperature control system further comprises at least one vent flap and at least one fan operable to recirculate air within the PCS until a temperature of the PCS reaches a temperature threshold.

30. The PCS of claim 25, wherein the temperature control system is operable to determine target operating temperatures for portions of the PCS.

* * * * *